(12) United States Patent
Hidaka

(10) Patent No.: US 6,480,431 B2
(45) Date of Patent: Nov. 12, 2002

(54) SEMICONDUCTOR HAVING MECHANISM CAPABLE OF OPERATING AT HIGH SPEED

(75) Inventor: Hideto Hidaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/943,009

(22) Filed: Aug. 31, 2001

(65) Prior Publication Data

US 2002/0024858 A1 Feb. 28, 2002

Related U.S. Application Data

(63) Continuation of application No. 09/324,809, filed on Jun. 3, 1999, now Pat. No. 6,310,803.

(30) Foreign Application Priority Data

Dec. 24, 1998 (JP) ............................................. 10-366400

(51) Int. Cl.[7] ................................................. G11C 7/00
(52) U.S. Cl. ........................................ 365/200; 365/207
(58) Field of Search .............................. 365/200, 203, 365/207, 196, 210

(56) References Cited

U.S. PATENT DOCUMENTS

| | | | | |
|---|---|---|---|---|
| 5,757,716 A | * | 5/1998 | Lee | ............... 365/230.03 |
| 5,933,377 A | | 8/1999 | Hidaka | |
| 5,970,002 A | | 10/1999 | Yoo | |
| 6,058,053 A | | 5/2000 | Tsuji et al. | |
| 6,084,807 A | | 7/2000 | Choi | |

FOREIGN PATENT DOCUMENTS

JP 3-296989 12/1991

OTHER PUBLICATIONS

"Ultra LSI Memory", K. Ito, published by Baifukan, pp. 165–167 and 181–183.
"A Flexible Redundancy Technique for High–Density DRAM's", M. Horiguchi et al., IEEE Journal of Solid–State Circuits, vol. 26, No. 1, Jan. 1991, pp. 12–17.

* cited by examiner

Primary Examiner—David Nelms
Assistant Examiner—Thong Le
(74) Attorney, Agent, or Firm—McDermott, Will & Emery

(57) ABSTRACT

A semiconductor memory device allowing low power consumption and a high speed operation is provided. The semiconductor memory device includes a spare replacement determining circuit, a plurality of memory blocks, a plurality of sense amplifier blocks, and a plurality of selection gate controlling circuits. Normal blocks included in the memory block can be replaced and repaired by a spare block included in one of the memory blocks. The selection gate controlling circuit controls to selectively render a memory block and a sense amplifier block coupled or non-coupled. The selection gate controlling circuit simultaneously couples a normal block included in a selected memory block to a corresponding sense amplifier block as well as a spare block to a corresponding sense amplifier block prior to spare replacement determination.

7 Claims, 46 Drawing Sheets

SEMICONDUCTOR HAVING MECHANISM CAPABLE OF OPERATING AT HIGH SPEED

This application is a continuation of application Ser. No. 09/324,809 filed Jun. 3, 1999, U.S. Pat. No. 6,310,803.

BACKGROUND OF THE INVENTION

1. Field of the Invention

The present invention relates to semiconductor memory devices and more particularly to a semiconductor memory device including a plurality of memory blocks.

2. Description of the Background Art

In semiconductor memory devices, a defective memory cell is replaced by a spare memory cell to equivalently repair the defective memory cell and to improve the yield of products. The flexible redundancy method has been proposed as one of redundant circuit structures in which a spare memory cell for replacing and repairing such a defective memory cell is provided.

One example of conventional semiconductor memory devices having the flexible redundancy structure will be described briefly with reference to FIG. 49. The conventional semiconductor memory device shown in FIG. 49 includes sense amplifier blocks MX1, MX2, MX3, ... MXn. The sense amplifier blocks shown in FIG. 49 are formed of a plurality of memory cells corresponding to one sense amplifier column. Sense amplifier block MX1 includes a spare row SR1 (may include a plurality of spare rows). By using spare row SR1 in sense amplifier block MX1, it is possible to replace and repair a memory cell in another block (sense amplifier block MX3, for example).

In the conventional semiconductor memory devices, operation of row circuitry is carried out after determination as to whether replacing and repairing using a spare memory cell is to be performed. Accordingly, access time is delayed because of the time necessary to determine spare replacement.

In order to prevent this problem, a memory block including a normal memory cell and a memory block including a spare memory cell are simultaneously selected and activated and, thereafter, data is finally written to or read from either of the memory blocks. However, this method increases power consumption, contrarily to the demand for reducing power consumption.

SUMMARY OF THE INVENTION

Accordingly, an object of the present invention is to provide a semiconductor memory device capable of reducing power consumption and operating at high speed.

A semiconductor memory device according to one aspect of the present invention includes: a plurality of normal blocks including a plurality of normal memory cells; a spare block including a plurality of spare memory cells for replacing and repairing a defective normal memory cell in a normal block in a prescribed correspondence therewith; a selecting circuit responsive to an external address signal for selecting a corresponding normal block and a corresponding spare block; a spare determining circuit responsive to an external address signal for determining whether or not to carry out replacing and repairing using the spare block; a plurality of sense amplifier blocks, the plurality of sense amplifier blocks being arranged corresponding to the plurality of normal blocks and the spare block and each operating to read/write data from/to a corresponding normal block or a corresponding spare block; a plurality of selection gates, the plurality of selection gates being arranged corresponding to the plurality of normal blocks and the spare block and each coupling a corresponding normal block or a corresponding spare block to a corresponding sense amplifier block; a selection gate controlling circuit for controlling opening and closing of the plurality of selection gates to simultaneously couple the selected normal block to the corresponding sense amplifier block and the selected spare block to the corresponding sense amplifier block prior to the determination result of the spare determining circuit; and a controlling circuit for carrying out data reading/writing operations on the selected normal block or the selected spare block according to the determination result of the spare determining circuit Accordingly, a major advantage in the above described aspect of the present invention is that a high speed operation can be realized by coupling a normal block and a spare block to a corresponding sense amplifier block prior to determination of spare replacement.

Especially in a refresh mode, the level of gate control signals is controlled according to the determination result of spare replacement. As a result, power consumption can be reduced in the refresh mode.

Especially in the alternately arranged shared sense amplifier structure, a high speed operation is made possible.

Especially when the spare block and the normal block belong to different mats, a high speed operation is guaranteed.

A semiconductor memory device according to another aspect of the present invention includes: a plurality of normal blocks including a plurality of normal memory cells; a spare block including a plurality of spare memory cells for replacing and repairing a defective normal memory cell in a normal block in a prescribed correspondence therewith; a selecting circuit responsive to an external address signal for selecting a corresponding normal block and a corresponding spare block; a spare determining circuit responsive to an external address signal for determining whether or not to carry out replacing and repairing using the spare block; a plurality of sense amplifier blocks, the plurality of sense amplifier blocks being arranged corresponding to the plurality of normal blocks and the spare block and each operating to read/write data from/to a corresponding normal block or a corresponding spare block; a plurality of selection gates, the plurality of selection gates being arranged corresponding to the plurality of normal blocks and the spare block and each coupling a corresponding normal block or a corresponding spare block to a corresponding sense amplifier block by opening and closing themselves according to gate control signals; and a selection gate controlling circuit for setting a plurality of gate control signals at a coupling level, an intermediate level or a non-coupling level, the selection gate controlling circuit setting the plurality of gate control signals from the intermediate level to the coupling level or from the intermediate level to the non-coupling level according to the determination result of the spare determining circuit.

Accordingly, a major advantage in the above described aspect of the present invention is that a high speed operation is guaranteed and power consumption can be reduced by controlling the level of the gate control signals at three stages and setting the level according to the determination of spare replacement.

Especially in the alternately arranged shared sense amplifier structure, a high speed operation and power consumption reduction are made possible.

Especially in the refresh mode, spare replacement in the next refresh cycle is predetermined according to a count value. Thus, the refresh operation can be performed at timing similar to that of the normal mode without delaying the timing of an internal operation.

Especially in the refresh mode, spare replacement in the next refresh cycle is predetermined according to a count value. If the determination of spare replacement is the same between successive refresh cycles, the state of the gate control signals is maintained. Thus, the refresh operation can be performed at timing similar to that of the normal mode without delaying the timing of an internal operation. Further, power consumption associated with the selection gate controlling circuit can be reduced.

Especially when the spare block and the normal block belong to different mats, low power consumption in the refresh mode and a high speed operation in the normal mode are guaranteed.

Especially, the gate control signals are set at the intermediate level (Vcc) between the coupling level (Vpp) and the non-coupling level (GND) in the standby state. Thus, power consumption associated with the selection gate controlling circuit can be reduced.

Especially, the timing for coupling level setting and the timing for non-coupling level setting are adjusted. Even if a fall of the gate control signals is delayed, a large time margin and a higher access time speed are allowed.

A semiconductor memory device according to still another aspect of the present invention includes: a plurality of normal blocks including a plurality of normal memory cells and a plurality of word lines; a spare block including a plurality of spare word lines and a plurality of spare memory cells for replacing and repairing a defective normal memory cell in a normal block in a prescribed correspondence therewith; a selecting circuit responsive to an external address signal for selecting a corresponding normal block and a corresponding spare block; a spare determining circuit responsive to an external address signal for determining whether or not to carry out replacing and repairing using the spare block; and a word line drive controlling circuit for setting a first word line drive signal for driving a word line of the selected normal block to a selected state and a second word line drive signal for driving a spare word line of the selected spare block to a selected state at a selected level, an intermediate level or a non-selected level according to the determination result of the spare determining circuit, the word line drive controlling circuit setting the first word line drive signal and the second word line drive signal from the intermediate level to the selected level or from the intermediate level to the non-selected level according to the determination result of the spare determining circuit.

Accordingly, a major advantage in the above described aspect of the present invention is that a high speed operation is guaranteed and power consumption associated with the word line drive controlling circuit can be reduced by controlling the word line drive signals at three stages and setting the level according to the determination of spare replacement.

Especially, the word line drive signals are set at the intermediate level (Vcc) between the coupling level (Vpp) and the non-coupling level (GND) in the standby state. Thus, power consumption can be reduced.

Especially, a high speed operation can be realized by coupling a normal block and a spare block to a corresponding sense amplifier block prior to determination of spare replacement.

Especially in the refresh mode, the level of the gate control signals is controlled according to the determination result of spare replacement. As a result, power consumption in the refresh mode can be reduced.

Especially, the level of the gate control signals is controlled at three stages and the level is set according to the determination of spare replacement. Thus, a high speed operation is guaranteed and power consumption can be reduced.

Especially in the refresh mode, spare replacement in the next refresh cycle is predetermined according to a count value. Thus, the refresh operation can be performed at timing similar to that of the normal mode without delaying the timing of an internal operation.

Especially in the refresh mode, spare replacement in the next refresh cycle is predetermined according to a count value. If the determination of spare replacement is the same between successive refresh cycles, the state of the gate control signals is maintained Thus, the refresh operation can be performed at timing similar to that of the normal mode without delaying the timing of an internal operation. Further, power consumption associated with the selection gate controlling circuit can be reduced.

Especially when the spare block and the normal block belong to different mats, low power consumption in the refresh mode and a high speed operation in the normal mode are guaranteed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
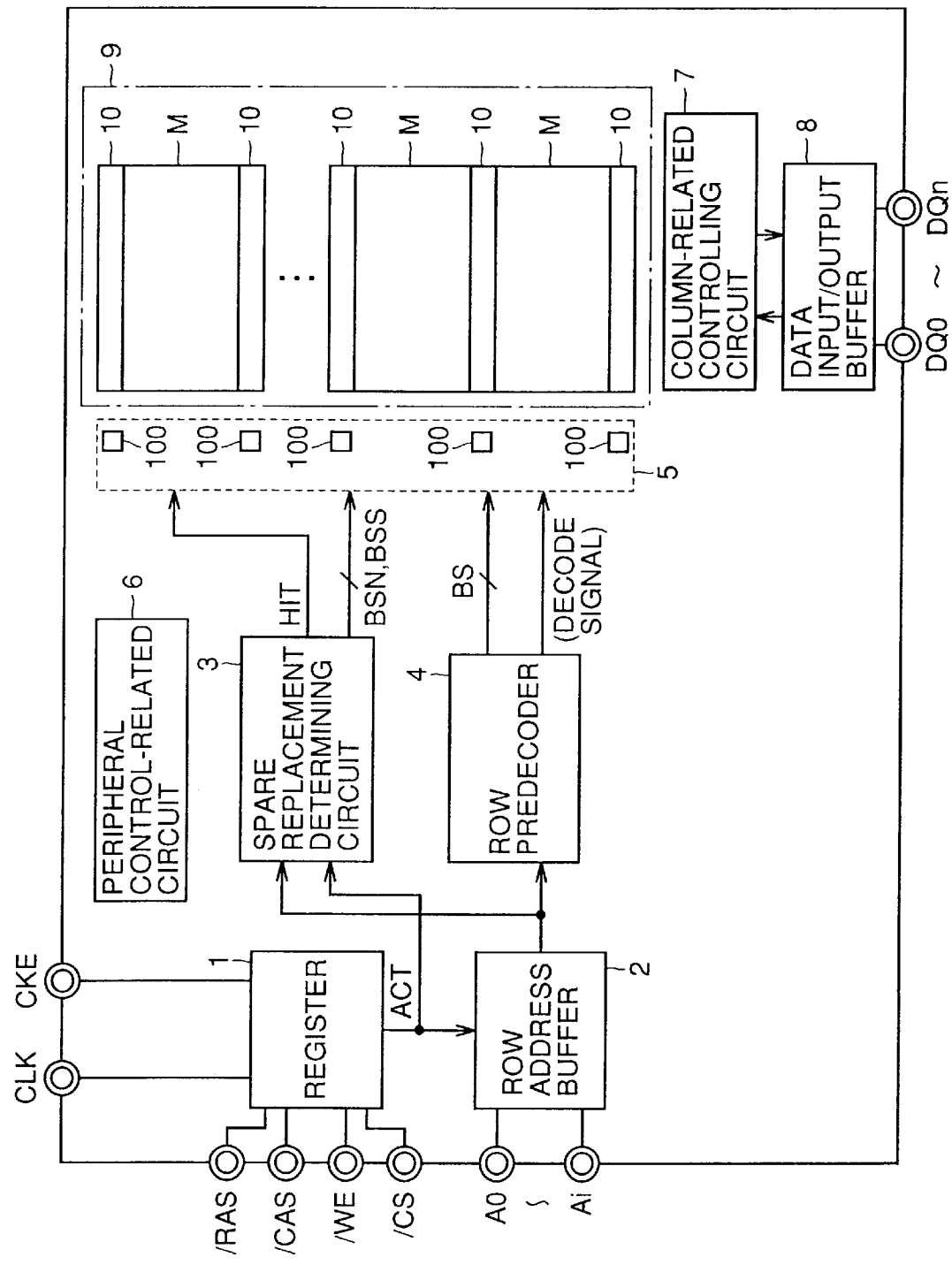
FIG. 1 is a block diagram showing a structure of a main part of a semiconductor memory device in a first embodiment of the present invention.

A semiconductor memory device in a first embodiment of the present invention will be described with reference to FIG. 1. The semiconductor memory device shown in FIG. 1 includes a register 1, a row address buffer 2, a spare replacement determining circuit 3, and a row predecoder 4.

Register 1 produces internal control signals according to externally received control signals (such as an external row address strobe signal /RAS). Row address buffer 2 receives external addresses A0 to Ai and outputs corresponding internal addresses.

Spare replacement determining circuit 3 determines whether spare replacement has been carried out according to the output of row address buffer 2, and outputs a spare replacement determination signal (HIT), a normal block selection signal BSN, and a spare block selection signal BSS. Row predecoder 5 decodes the output of row address buffer 2 and outputs a decode signal and a block selection signal BS.

The semiconductor memory device shown in FIG. 1 further includes a row-related controlling circuit 5, a peripheral control-related circuit 6, an array portion 9, a column-related controlling circuit 7, and a data input/output buffer 8.

Array portion 9 includes a plurality of memory blocks (reference character M) and sense amplifier blocks 10. Sense amplifier block 10 has the alternately arranged shared sense amplifier structure. When one memory block is selected, a sensing operation is carried out by sense amplifiers included in sense amplifier blocks 10 that are provided on the both sides of the memory block.

Row-related controlling circuit 5 controls a row-related operation in array portion 9. Row-related controlling circuit 5 includes a plurality of selection gate controlling circuits 100. Selection gate controlling circuits 100 are each arranged at an end of sense amplifier block 10. Column-related controlling circuit 7 controls a column-related operation in array portion 9. Peripheral control-related circuit 6 includes, for example, a circuit for detecting a mode according to the output of register 1. Data input/output buffer 8 is provided to exchange data between array portion 9 and data input/output pins DQ0 to DQn.

Figure 2:
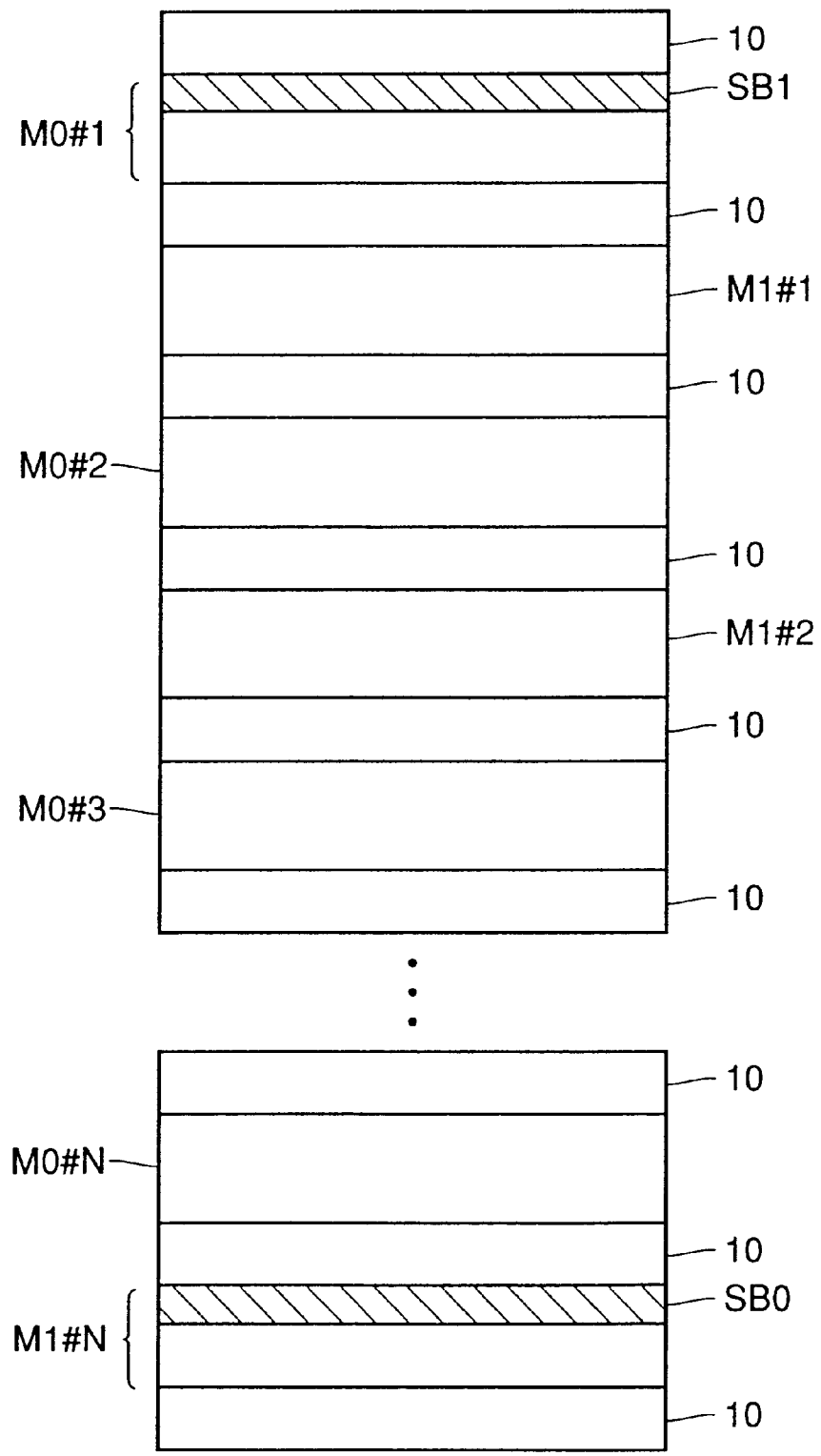
FIG. 2 is a diagram for describing one example of the structure of array portion 9 shown in FIG. 1.

The structure of array portion 9 in the first embodiment will be described with reference to FIG. 2. In FIG. 2, reference characters M0#1 to M0#N and M1#1 to M1#N denote memory blocks. Referring to FIG. 2, memory blocks M0#1 to M0#N and M1#1 to M1#N are formed of normal blocks including a plurality of normal memory cells.

Memory block M0#1 further includes a spare block SB1 including a plurality of spare memory cells. Memory block M1#N further includes a spare block SB0 including a plurality of spare memory cells. A spare word line included in spare block SB0 can replace each word line included in memory blocks M0#l to M0#N. A spare word line included in spare block SB1 can replace each word line included in memory blocks M1#1 to M1#N.

For example, memory blocks M0#1 to M0#N are selected and activated when a 1-bit signal RAj of the internal row addresses is "0," and memory blocks M1#1 to M1#N are selected and activated when signal RAj is "1."

Figure 3:
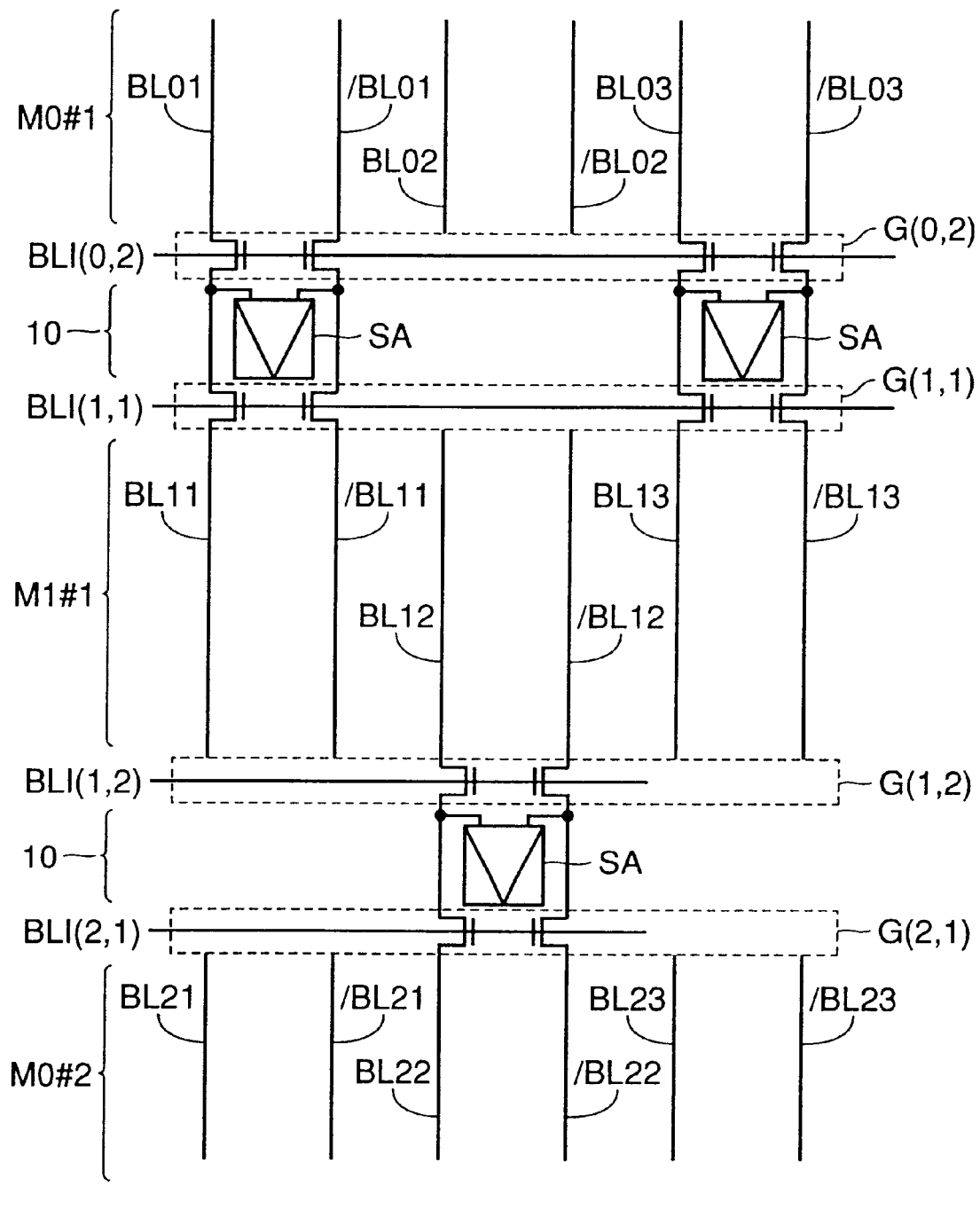
FIG. 3 is a diagram for describing relations between sense amplifier block 10 and an memory block in the first embodiment.

Relations between a memory block and a sense amplifier block will be described in the following with reference to FIG. 3. In FIG. 3, reference characters BL01, BL/01, BL02, BL/02, BL03, BL/03 denote bit lines of memory block M0#1. Reference characters BL11, BL/11, BL12, BL/12, BL13, BL/13 denote bit lines of memory block M1#1. Reference characters BL21, BL/21, BL22, BL/22, BL23, BL/23 denote bit lines of memory block M0#2.

Referring to FIG. 3, sense amplifier block 10 includes a plurality of sense amplifiers SA. Sense amplifier blocks 10 and the bit lines are connected via selection gates (reference characters G (0, 2), G (1, 1), G (1, 2), G (2, 1)). For example, one sense amplifier block 10 is connected to memory block M0#1 via selection gate G (0, 2) and to memory block M1#1 via selection gate G (1, 1).

Each selection gate is formed of a plurality of NMOS transistors. In FIG. 3, selection gate G (0, 2) is opened and closed in response to a gate control signal BLI (0, 2). Selection gates G (1, 1) and G (1, 2) are opened and closed in response to gate control signals BLI (1, 1) and BLI (1, 2), respectively. Selection gate G (2, 1) is opened and closed in response to a gate control signal BLI (2, 1). The gate control signals are produced in selection gate controlling circuits 100.

In the first embodiment of the present invention, when memory block M1#1 is selected, for example, gate control signals BLI (1, 1) and BLI (1, 2) are kept at a selected state, gate control signals BLI (0, 2) and BLI (2, 1) are kept at a non-selected state, and other gate control signals are kept at a standby state (boosted power supply voltage Vpp), for example.

The operation of selection gate controlling circuit 100 in the first embodiment will be described with reference to FIG. 4.

Figure 4:
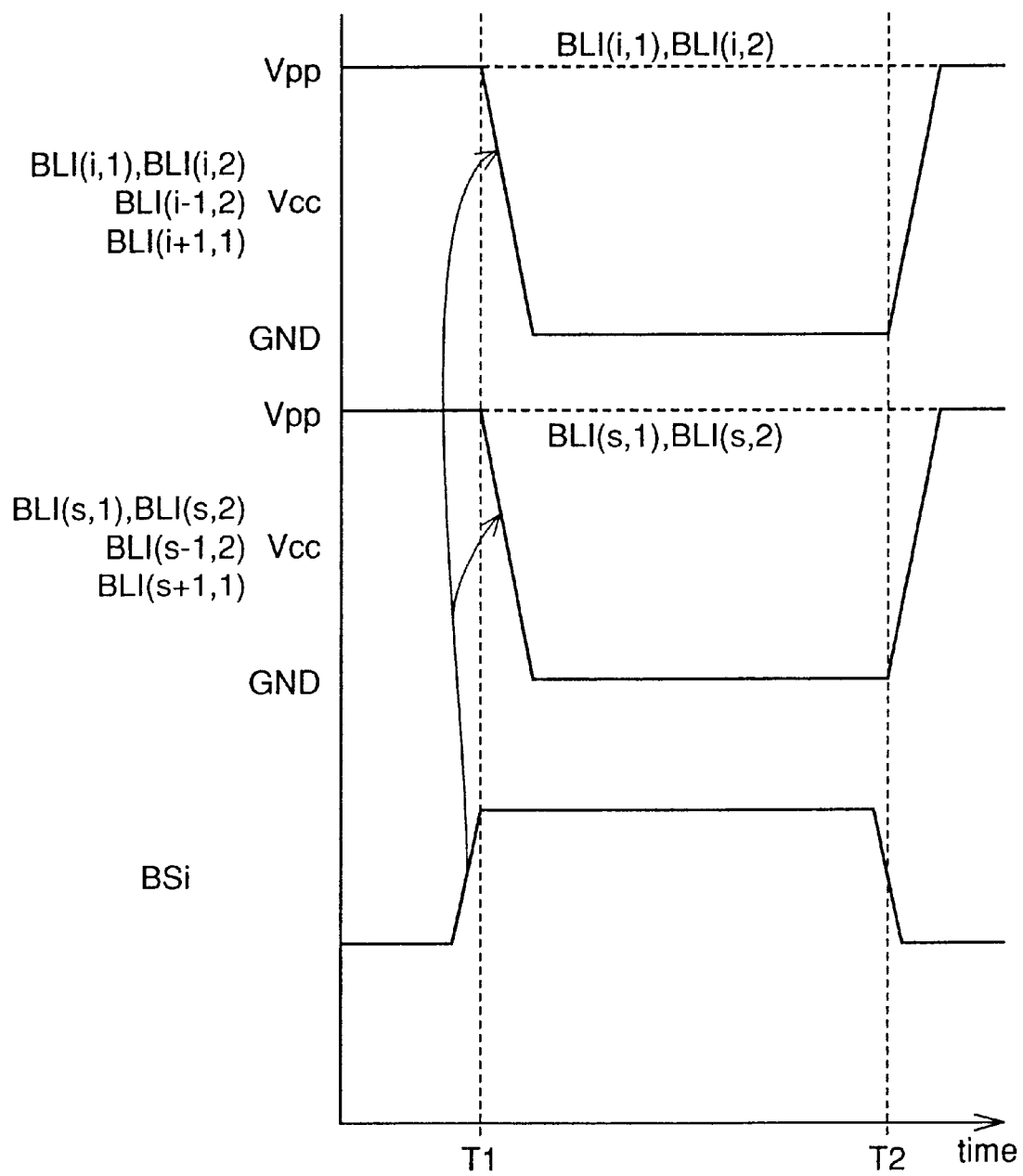
FIG. 4 is a timing chart for describing the operation of selection gate controlling circuit 100 in the first embodiment.

In FIG. 4, reference characters BLI (i, 1) and BLI (i, 2) denote gate control signals for a memory block (hereinafter, referred to as a memory block NE) to be selected, and BLI (s, 1) and BLI (s, 2) denote gate control signals for a memory block (hereinafter, referred to as a memory block Ms) including a spare block for replacing and repairing memory block Mi. It is noted that memory block Mi represents the i th memory block in a series of memory blocks M0#1, M1#1, ... in FIG. 2 and memory block Ms corresponds to memory block M0#1 or M1#N in FIG. 2.

Reference characters BLI (i, 2), BLI (i, 1) represent gate control signals for sense amplifier blocks located on the both sides of selected memory block Mi. Reference characters BLI (s, 2), BLI (s, 1) represent gate control signals for sense amplifier blocks located on the both sides of selected memory block Ms for replacing and repairing.

In the standby state, all gate control signals are set at a boosted power supply voltage level Vpp. At time T1, block selection signal BSi attains an H level in response to an external address. Accordingly, memory block Mi becomes an object of selection. Similarly, memory block Ms also becomes an object of selection. Here, the determination result of spare replacement has not been output.

In response to block selection signal BSi, gate control signals BLI (i–i, 2), BLI (i+1, 1), BLI (s–1, 2) and BLI (s+1, 1) are lowered to a ground voltage level GND. Accordingly, the sense amplifier blocks corresponding to selected memory blocks Mi and Ms are in a non-coupled state to other adjacent memory blocks. In other words, selected memory blocks Mi and Ms are selectively coupled to corresponding sense amplifier blocks. According to the determination result of spare replacement produced thereafter, an actual operation (such as word line selection and sense amplifier activation) for either of memory blocks Mi and Ms is carried out.

Since a memory block to be selected and corresponding sense amplifier blocks can be selectively coupled prior to determination of spare replacement, problems such as delayed access time can be prevented. When the active cycle ends at time T3, each signal is driven to the boosted power supply voltage level Vpp.

One example of the structure of selection gate controlling circuit 100 for realizing the operation shown in FIG. 4 will be described with reference to FIG. 5. The selection gate controlling circuit shown in FIG. 5 includes a level converting circuit 15, a PMOS transistor P4, and an NMOS transistor N4.

Level converting circuit 15 includes an inverter 22, PMOS transistors P2 and P3, and NMOS transistors N2 and N3. Level converting circuit 15 converts an input signal at the power supply voltage level Vcc to a signal at the boosted power supply voltage level Vpp and outputs the converted signal (Vcc<Vpp). PMOS transistor P4 and NMOS transistor N4 are connected in series between boosted power supply voltage Vpp and ground voltage GND. The gate electrodes of PMOS transistor P4 and NMOS transistor N4 receive the output of level converting circuit 15. The connection node OUT1 of PMOS transistor P4 and NMOS transistor N4 outputs the gate control signals.

Figure 5:
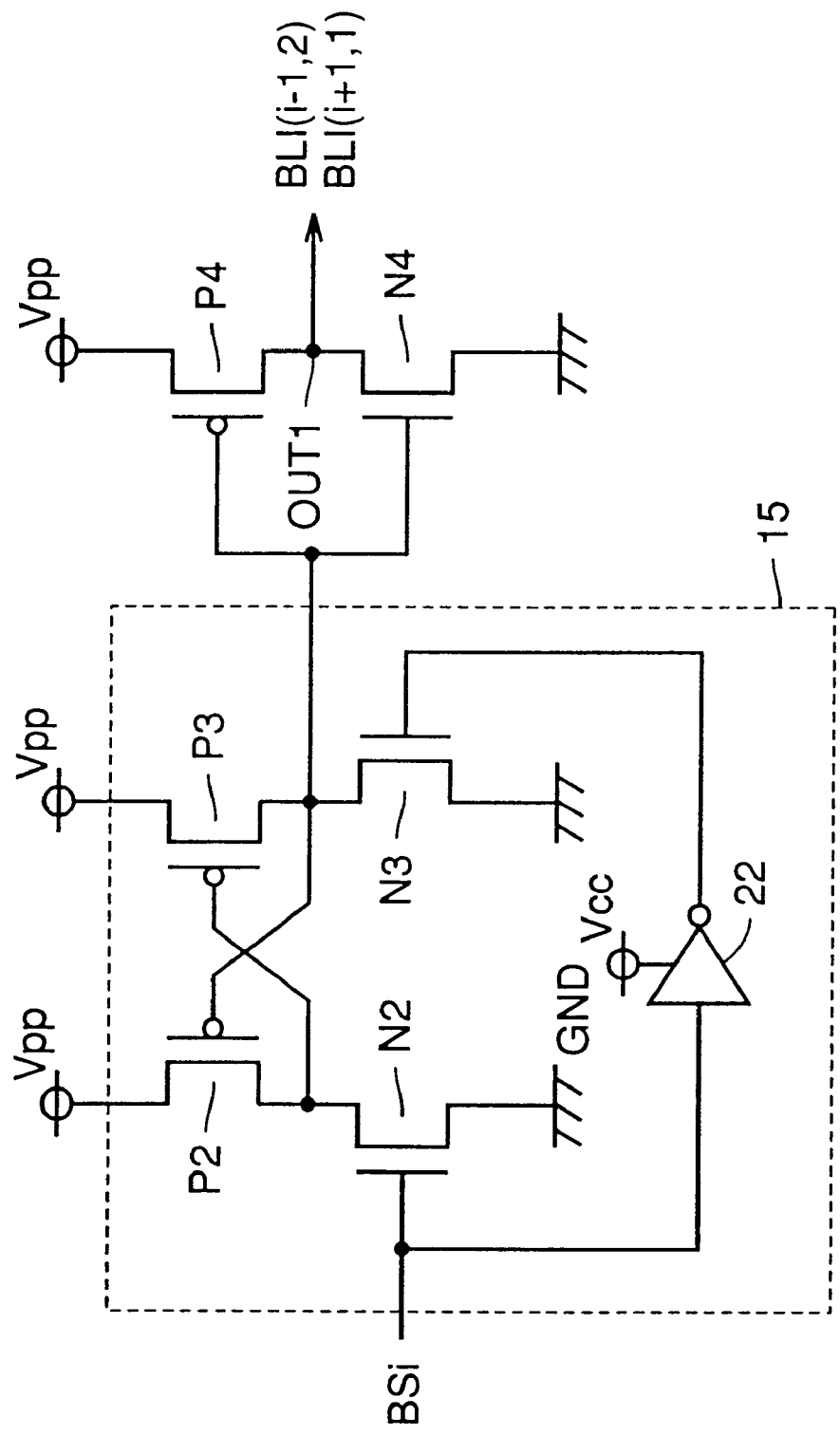
FIG. 5 shows one example of a specific structure of the selection gate controlling circuit for producing the gate control signals shown in FIG. 4.

The circuit in FIG. 5 controls the level of gate control signals BLI (i–1, 2) and BLI (i+1, 1) according to block selection signal BSi. When block selection signal BSi is at the H level, gate control signals BLI (i–1, 2) and BLI (i+1, 1) for memory blocks adjacent to selected memory block Mi are set at the L level (non-coupled state).

Figure 6:
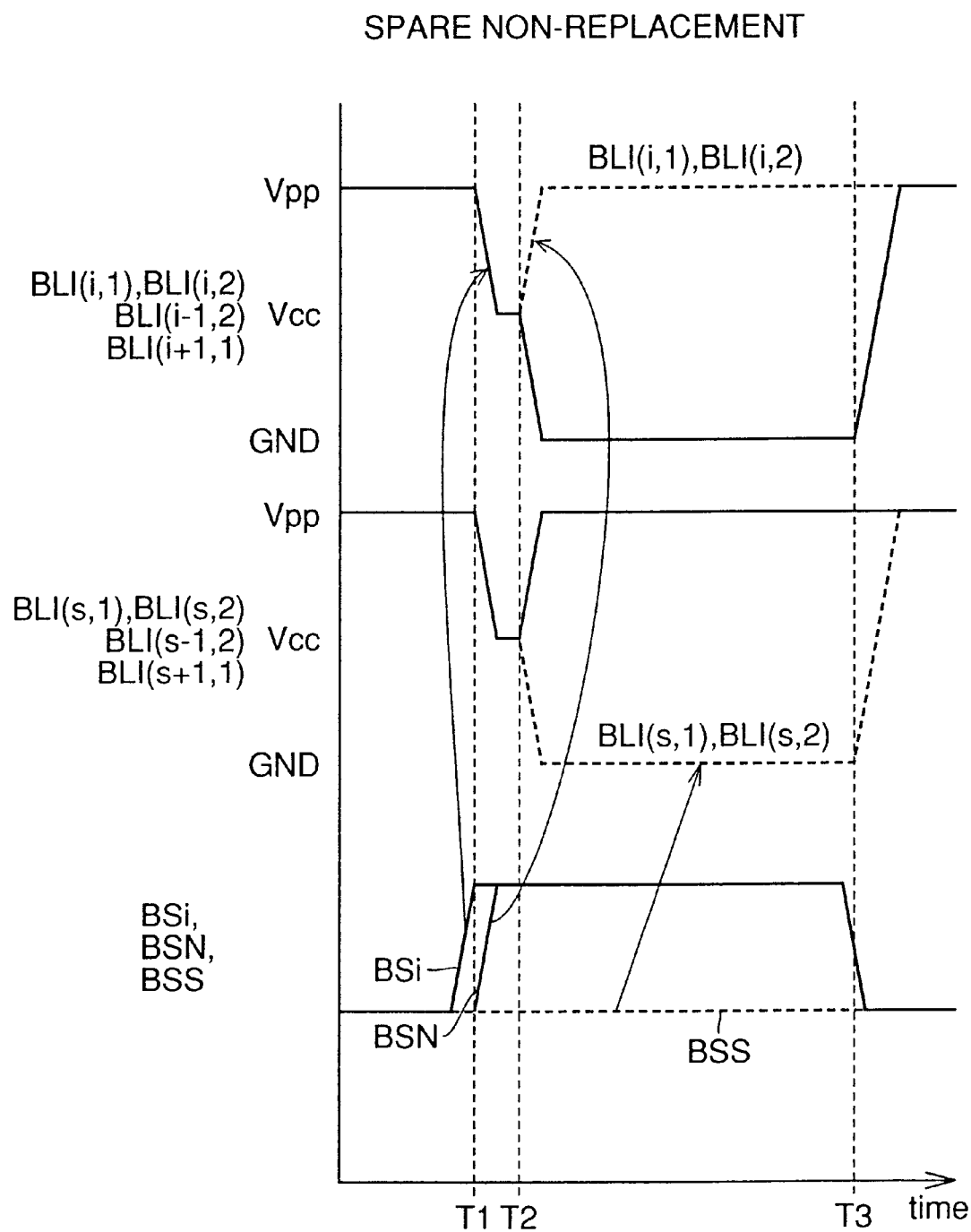
FIGS. 6 and 7 are timing charts for describing another example of selection gate controlling circuit 100 in the first embodiment.

Another example of selection gate controlling circuit 100 in the first embodiment will be described with reference to the timing charts in FIGS. 6 and 7. FIG. 6 corresponds to the case of spare non-replacement while FIG. 7 corresponds to the case of spare replacement. The same reference characters denote the same signal as in FIG. 4. Reference character BSN denotes a normal block selection signal that is output as a determination result of spare replacement, and BSS denotes a spare block selection signal that is output as a determination result of spare replacement. When normal block selection signal BSN is at the H level, a normal block is selected. When spare block selection signal BSS is at the H level, a spare block is selected.

Referring to FIG. 6, the gate control signals are set at the boosted power supply voltage level Vpp in the standby state. At time T1, block selection signal BSi rises to the H level. In response, gate control signals BLI (i, 1), BLI (i, 2), BLI (i–1, 2) and BLI (i+1, 1) as well as BLI (s, 1), BLI (s, 2), BLI (s–1, 2) and BLI (s+1, 1) are set at the power supply voltage level Vcc.

From time T1 to T2, a determination result of spare replacement is output. Normal block selection signal BSN rises to the H level. Spare block selection signal BSS remains to be at the L level.

In response, gate control signals BLI (s, 1) and BLI (s, 2) are lowered the ground voltage level GND. Gate control signals BLI (s−1, 2) and BLI (s+1, 1) are returned to the boosted power supply voltage level Vpp. Gate control signals BLI (i, 1) and BLI (i, 2) are raised to the boosted power supply voltage level Vpp. Gate control signals BLI (i−1, 2) and BLI (i+1, 1) are lowered to the ground voltage level GND. Accordingly, the sense amplifier blocks corresponding to the selected normal block attain a non-coupled state to other adjacent memory blocks. In other words, the selected memory block is selectively coupled to corresponding sense amplifier blocks.

Figure 7:
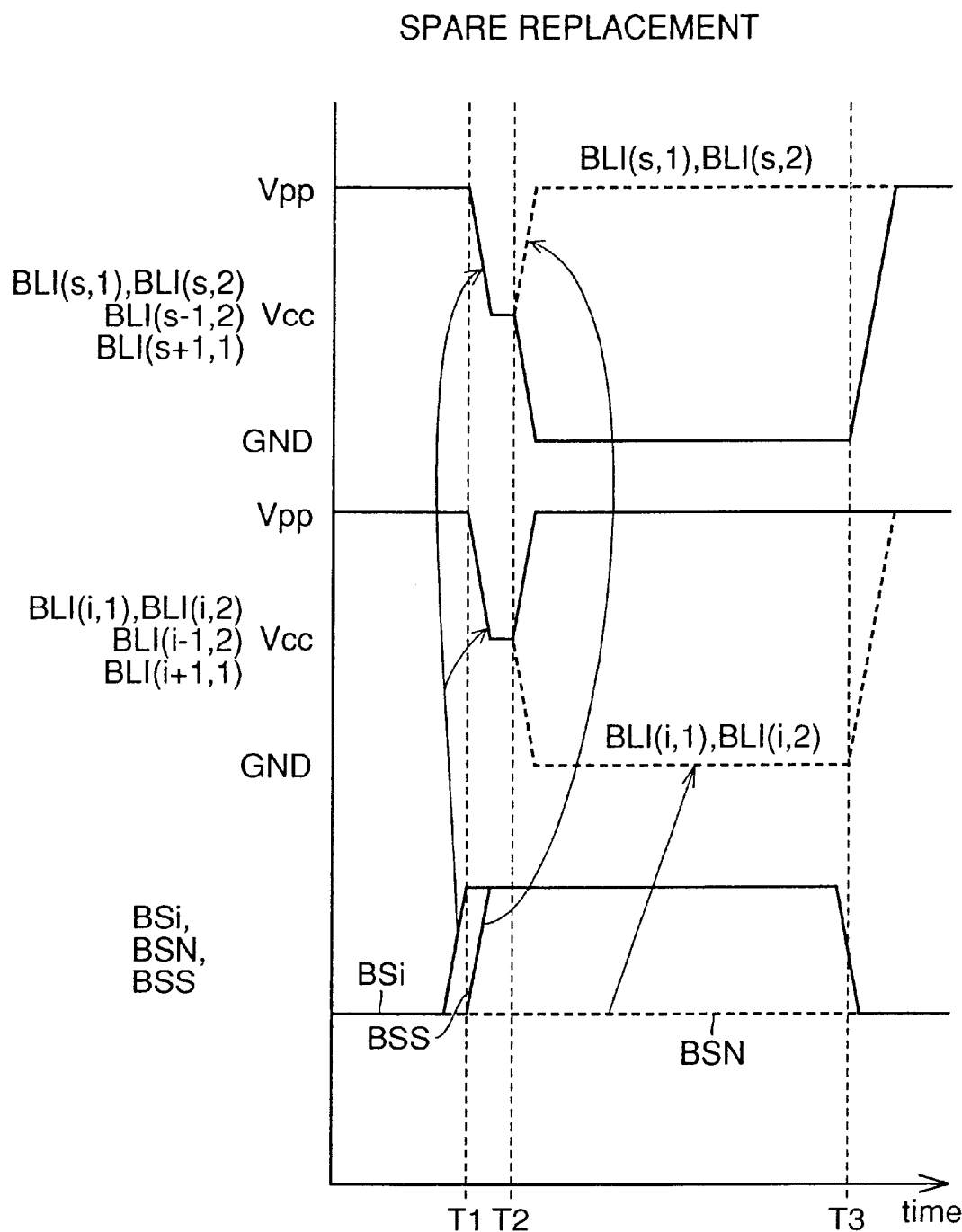

Referring to FIG. 7, the gate control signals are temporarily lowered to the power supply voltage level Vcc similarly to FIG. 6. From time T1 to T2, spare block selection signal BSS rises to the H level. Normal block selection signal BSN remains to be at the L level.

In response, gate control signals BLI (i, 1) and BLI (i, 2) are lowered to the ground voltage level GND. Gate control signals BLI (i−1, 2) and BLI (i+1, 1) are returned to the boosted power supply voltage level Vpp. Gate control signals BLI (s, 1) and BLI (s, 2) are raised to the boosted power supply voltage level Vpp. Gate control signals BLI (s−1, 2) and BLI (s+1, 1) are lowered to the ground voltage level GND. Accordingly, sense amplifier blocks corresponding to a spare block for replacing and repairing attain a non-coupled state to other adjacent memory blocks. In other words, the selected memory block is selectively coupled to corresponding sense amplifier blocks.

By the operation using the intermediate level voltage (Vcc), current consumption associated with the selection gate control can be almost halved and power consumption can be reduced. Since the determination of spare replacement is made till gate control signals attain the power supply voltage level Vcc, the access time in this operation method is not delayed.

Figure 8:
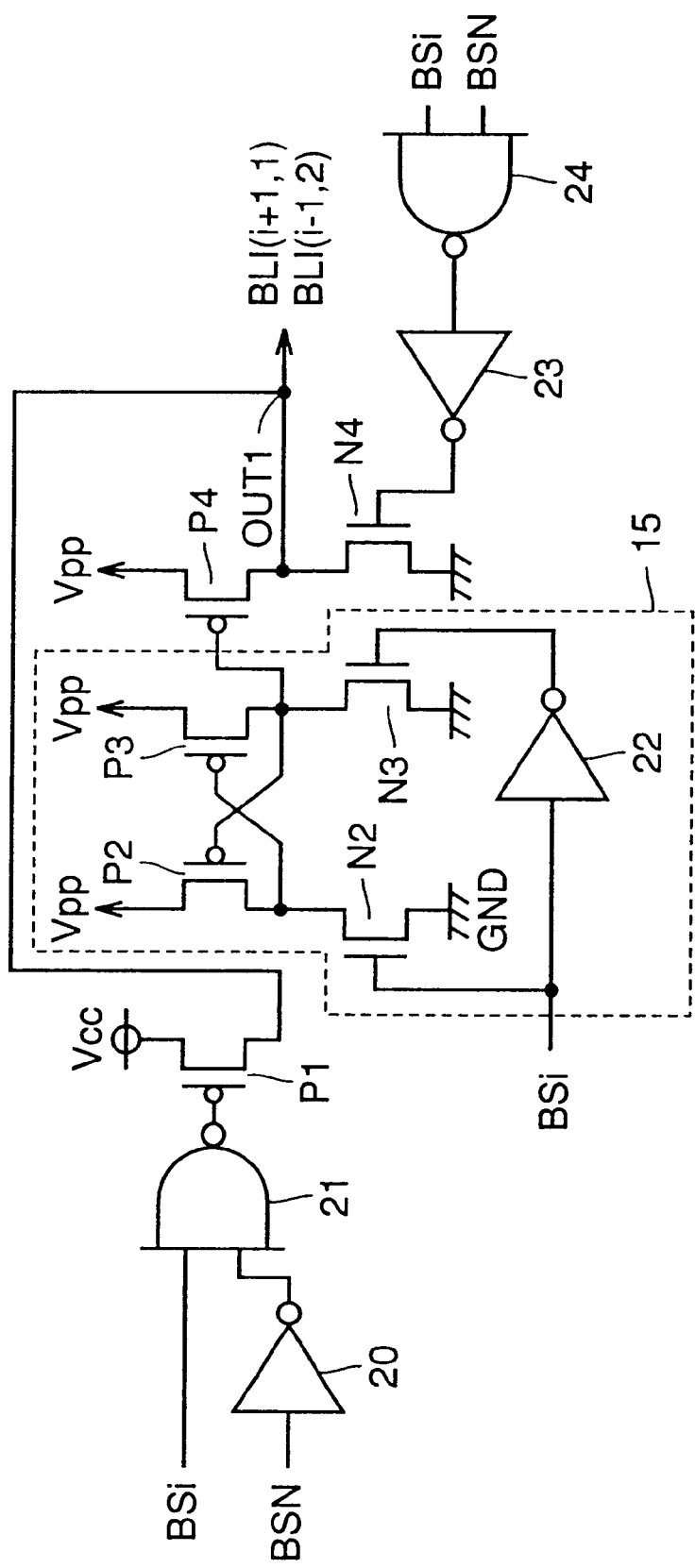
FIGS. 8 and 9 show one example of a specific structure of the selection gate controlling circuit for producing the gate control signals shown in FIGS. 6 and 7.
Figure 9:
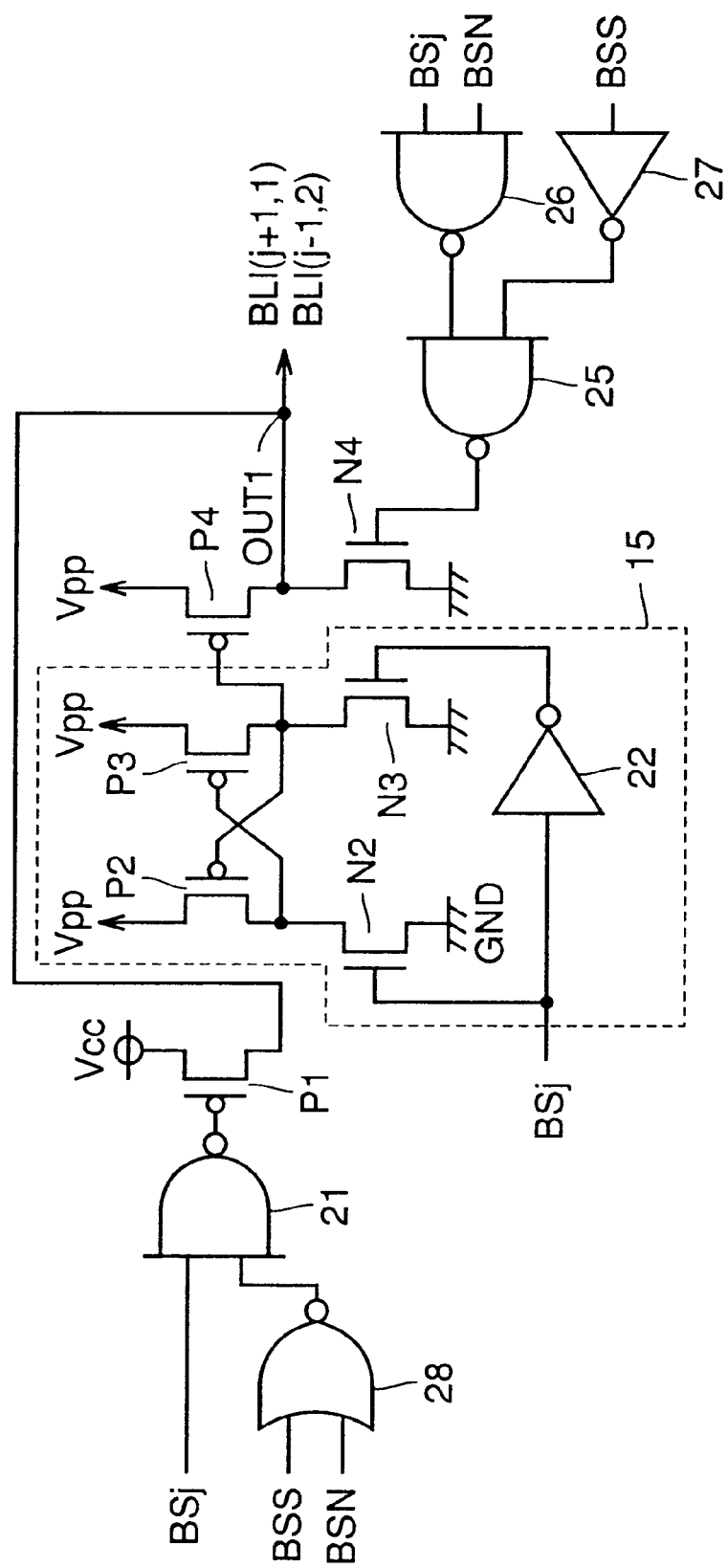

One example of the structure of selection gate controlling circuit 100 for implementing the operation shown in FIGS. 6 and 7 will be described with reference to FIGS. 8 and 9. FIG. 8 is provided for a memory block formed only of normal blocks, and FIG. 9 is provided for a memory block including a spare block. The same elements as the selection gate controlling circuit shown in FIG. 5 are denoted by the same reference characters, and the description thereof will not be repeated.

The selection gate controlling circuit shown in FIG. 8 includes inverters 20, 23, NAND circuits 21, 24, a level converting circuit 15, a PMOS transistor P4, and an NMOS transistor N4. Inverter 20 inverts normal block selection signal BSN. NAND circuit 21 receives block selection signal BSi and the output of inverter 20. PMOS transistor P1 is connected between power supply voltage Vcc and output node OUT1, and it receives the output of NAND circuit 21.

Level converting circuit 15 receives block selection signal BSi. NAND circuit 24 receives block selection signal BSi and the normal block selection signal BSN. Inverter 23 inverts the output of NAND circuit 24. The gate electrode of PMOS transistor P4 receives the output of level converting circuit 15, and the gate electrode of NMOS transistor N4 receives the output of inverter 23.

When PMOS transistor P1 turns on, output node OUT1 (gate control signals BLI (i−1, 2) and BLI (i+1, 1)) is set at the power supply voltage level Vcc. When PMOS transistor P4 turns on, output node OUT1 is set at the boosted power supply voltage level Vpp. When NMOS transistor N4 turns on, output node OUT is set at the ground voltage level GND The selection gate controlling circuit shown in FIG. 9 includes an inverter 27, NAND circuits 21, 25, 26, an NOR circuit 28, a level converting circuit 15, a PMOS transistor P4, and an NMOS transistor N4. NOR circuit 28 receives normal block selection signal BSN and spare block selection signal BSS. NAND circuit 21 receives block selection signal BSj and the output of NOR circuit 28. The gate electrode of PMOS transistor P1 receives the output of NAND circuit 21.

Inverter 27 inverts spare block selection signal BSS. NAND circuit 26 receives block selection signal BSj and normal block selection signal BSN. NAND circuit 25 receives the outputs of NAND circuit 26 and inverter 27.

Level converting circuit 15 receives block selection signal BSj. The gate electrode of PMOS transistor P4 receives the output of level converting circuit 15, and the gate electrode of NMOS transistor N4 receives the output of NAND circuit 25. When PMOS transistor P1 turns on, output node OUT1 (gate control signals BLI (j−1, 2) and BLI (j+1, 1)) is set at the power supply voltage level Vcc. When PMOS transistor P4 turns on, output node OUT1 is set at the boosted power supply voltage level Vpp. When NMOS transistor N4 turns on, output node OUT is set at the ground voltage level GND.

By setting the gate control signals at the intermediate level (Vcc) prior to the determination of spare replacement in this manner, a high speed operation in the normal mode and low power consumption are made possible. Although the structure above has been described based on the case in which a spare block is arranged for part of a memory block, other structures can also be applied.

Second Embodiment

An improved semiconductor memory device in a second embodiment of the present invention will be described. The semiconductor memory device in the second embodiment renders the timing of opening and closing selection gates different between the normal mode and the self refresh mode.

Figure 10:
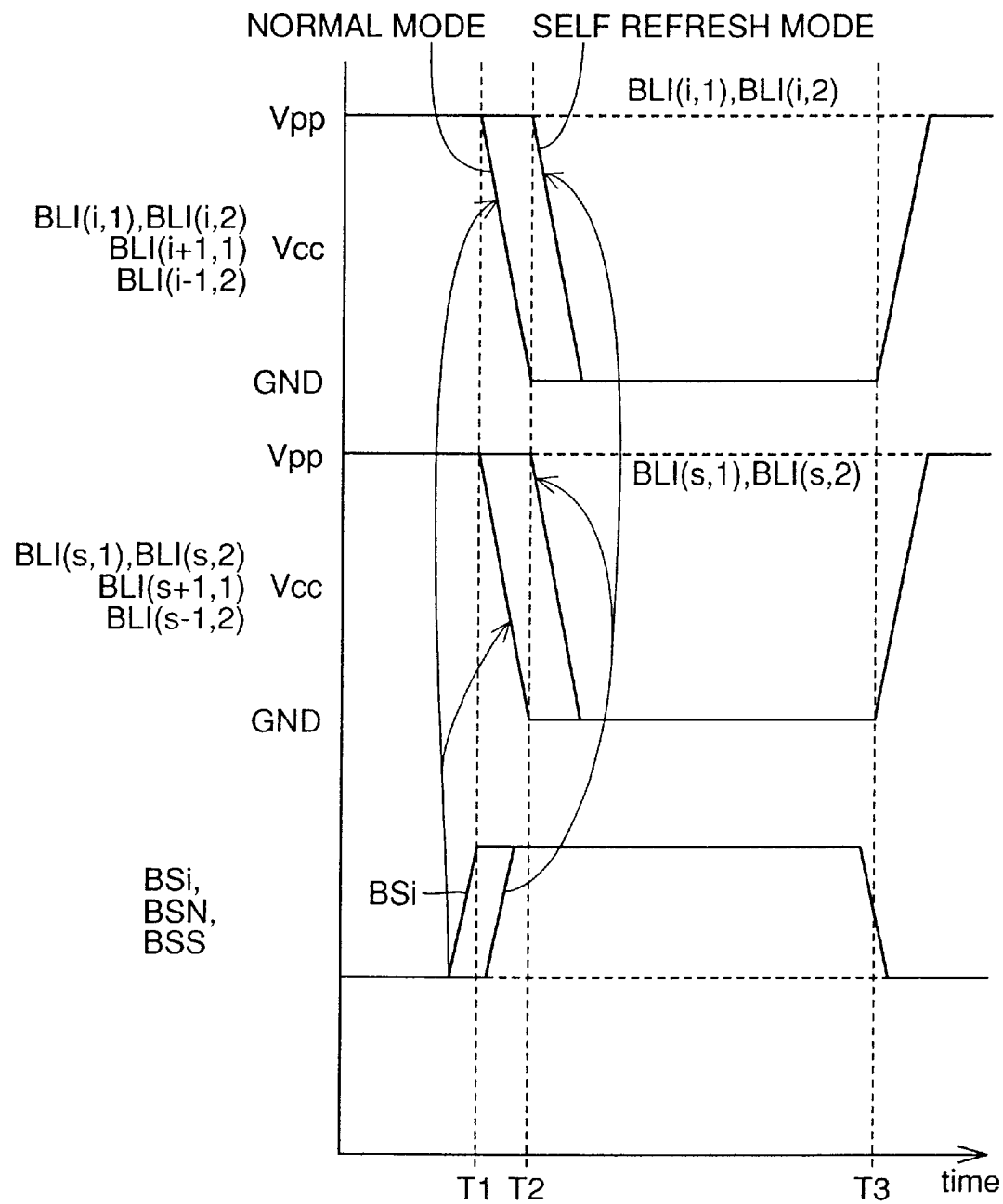
FIG. 10 is a timing chart for describing the operation of a selection gate controlling circuit in a second embodiment of the present invention.

One example of a selection gate controlling circuit in the second embodiment will be described with reference to the timing chart in FIG. 10. The same reference characters denote the same signals as in FIGS. 4, 6 and 7. In the standby state, all gate control signals are at the boosted power supply voltage level Vpp.

In the normal mode, the operation is the same as the first embodiment. When block selection signal BSi attains the H level at time T1, gate control signals BLI (i+1, 1), BLI (i−1, 2), BLI (s+1, 1) and BLI (s−1, 2) are lowered to the ground voltage level GND. Accordingly, selected memory block Mi and sense amplifier blocks corresponding to a memory block Ms for replacing and repairing are in a non-coupled state to other adjacent memory blocks.

In the self refresh mode, the following operation is carried out. From time T1 to T2, a refresh row address produced in a refresh counter and a spare address are compared and, as a result of spare replacement determination, normal block selection signal BSN or spare block selection signal BSS rises to the H level. In response, gate control signal BLI (i+1, 1), BLI (i−1, 2), or gate control signals BLI (s+1, 1) and BLI (s−1, 2) are lowered from the boosted power supply voltage level Vpp to the ground voltage level GND. When spare replacement is not carried out, for example, only gate control signals BLI (i+1, 1) and BLI (i−1, 2) attain the ground voltage level GND. At time T3, the active cycle is completed and each signal is reset.

In the normal mode, a normal block and a spare block are simultaneously activated to prevent the access time delay as described in the first embodiment. In the self refresh mode, the access time and the cycle time are not delayed since the operation is carried out according to an internal timer. However, it is necessary to reduce power consumption in the self refresh mode. Accordingly, either a normal block or a spare block is activated (a plurality of blocks are not activated at the same time) according to the determination result of spare replacement so as to reduce power consumption.

Figure 11:
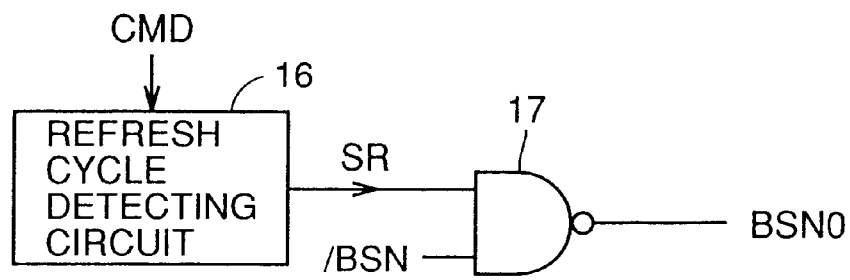
FIGS. 11 and 12 show structures of a controlling circuit for producing the gate control signals shown in FIG. 10 in a self refresh mode.
Figure 12:
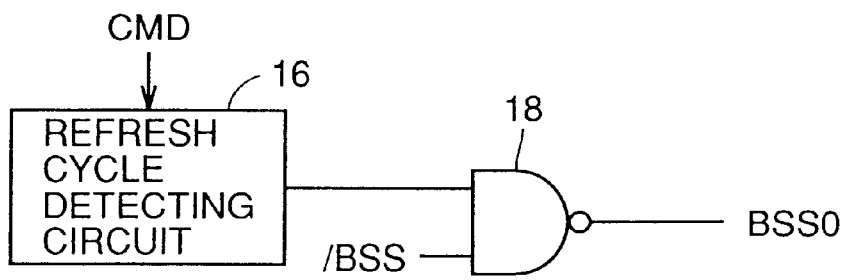
Figure 13:
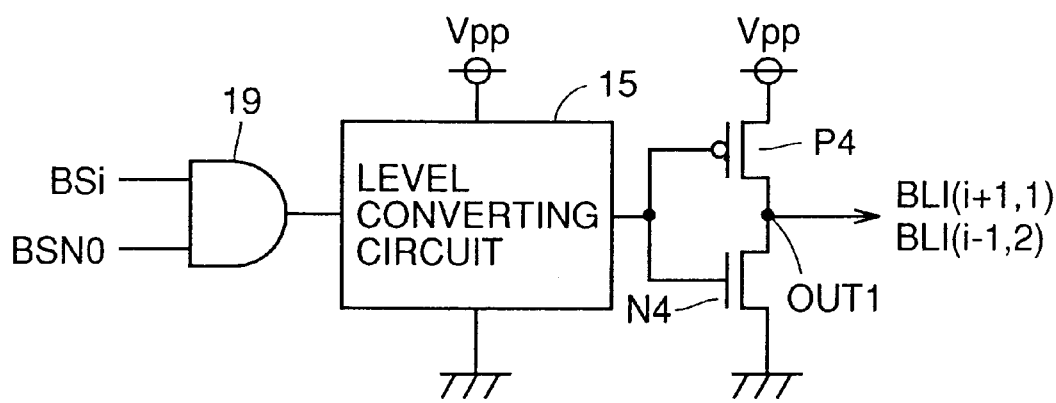
FIG. 13 shows one example of a specific structure of the selection gate controlling circuit for producing the gate control signals shown in FIG. 10.

The structures for implementing the operation shown in FIG. 10 will be described with reference to FIGS. 11, 12 and 13. FIGS. 11 and 12 show the structures of a peripheral circuit for producing the gate control signals shown in FIG. 10 in the self refresh mode, and FIG. 13 shows one example of a specific structure of the selection gate controlling circuit for producing the gate control signals shown in FIG. 10. The circuit in FIG. 13 is arranged instead of selection gate controlling circuit 100 in FIG. 1.

The circuit shown in FIG. 11 includes a refresh cycle detecting circuit 16 and an NAND circuit 17. The circuit shown in FIG. 12 includes a refresh cycle detecting circuit 16 and an NAND circuit 18. Refresh cycle detecting circuit 16 is included in peripheral control-related circuit 6.

Refresh cycle detecting circuit 16 detects designation of the self refresh mode according to a command CMD received from register 1, and outputs a self refresh mode designation signal SR as the detection result.

NAND circuit 17 receives an inversion normal block selection signal /BSN, which is an inversion of normal block selection signal BSN, and self refresh mode designation signal SR. NAND circuit 18 receives an inversion spare block selection signal /BSS, which is an inversion of spare block selection signal BSS, and self refresh mode designation signal SR. When self refresh mode designation signal SR is at the L level (normal mode), the output BSNO of NAND circuit 17 and the output BSSO of NAND circuit 18 are both at the H level.

The selection gate controlling circuit shown in FIG. 13 includes an AND circuit 19, a level converting circuit 15, a PMOS transistor P4, and a NMOS transistor N4. AND circuit 19 receives block selection signal BSi and signal BSN0. Level converting circuit 15 raises the H level output of AND circuit 19 to the boosted power supply voltage level Vpp. The gate electrodes of PMOS transistor P4 and NMOS transistor N4 receive the output of level converting circuit 15. Connection node OUT1 of PMOS transistor P4 and NMOS transistor N4 outputs gate control signals. The circuit in FIG. 13 controls gate control signals BLI (i−1, 2) and BLI (i+1, 1) according to block selection signal BSi.

According to the structure, the gate control signals do not depend on spare replacement determination in the normal mode and are controlled according to the determination result of spare replacement in the self refresh mode.

Figure 14:
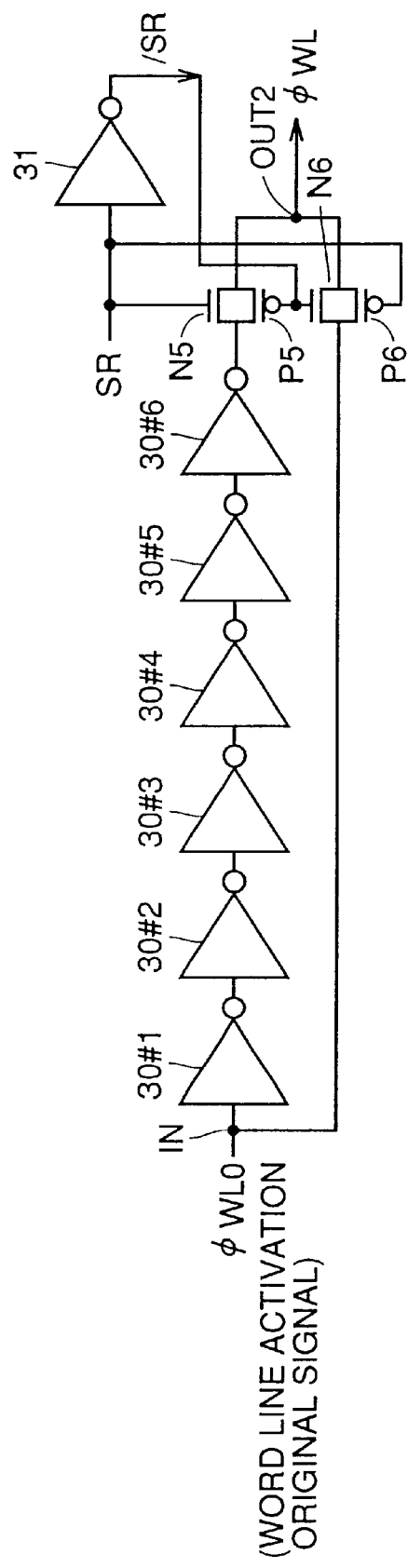
FIG. 14 shows a circuit structure of a word line activation controlling circuit for controlling the timing of word line activation.

In the self refresh mode, it is necessary to delay the rising timing of a word line by the time necessary to determine spare replacement. Accordingly, the circuit shown in FIG. 14 is provided. FIG. 14 shows the circuit structure of a word line activation controlling circuit for controlling the activation timing of a word line. The word line activation controlling circuit shown in FIG. 14 includes inverters 30#1, 30#2, 30#3, 30#4, 30#5, 30#6, 31, NMOS transistors N5, N6, and PMOS transistors P5 and P6.

Inverters 30#1 to 30#6 are connected in series. Inverter 30#1 is connected to an input node IN. Input node IN receives a word line activation original signal φWL0. Inverter 31 inverts self refresh mode designation signal SR and outputs a signal /SR. NMOS transistor N5 and PMOS transistor P5 are connected between the output node of inverter 30#6 and an output node OUT2. NMOS transistor N6 and PMOS transistor P6 are connected between input node IN and output node OUT2. The gate electrodes of NMOS transistor N5 and PMOS transistor P6 receive self refresh mode designation signal SR. The gate electrodes of PMOS transistor P5 and NMOS transistor N6 receive signal /SR. Output node OUT2 outputs a word line activation signal φWL.

Figure 15:
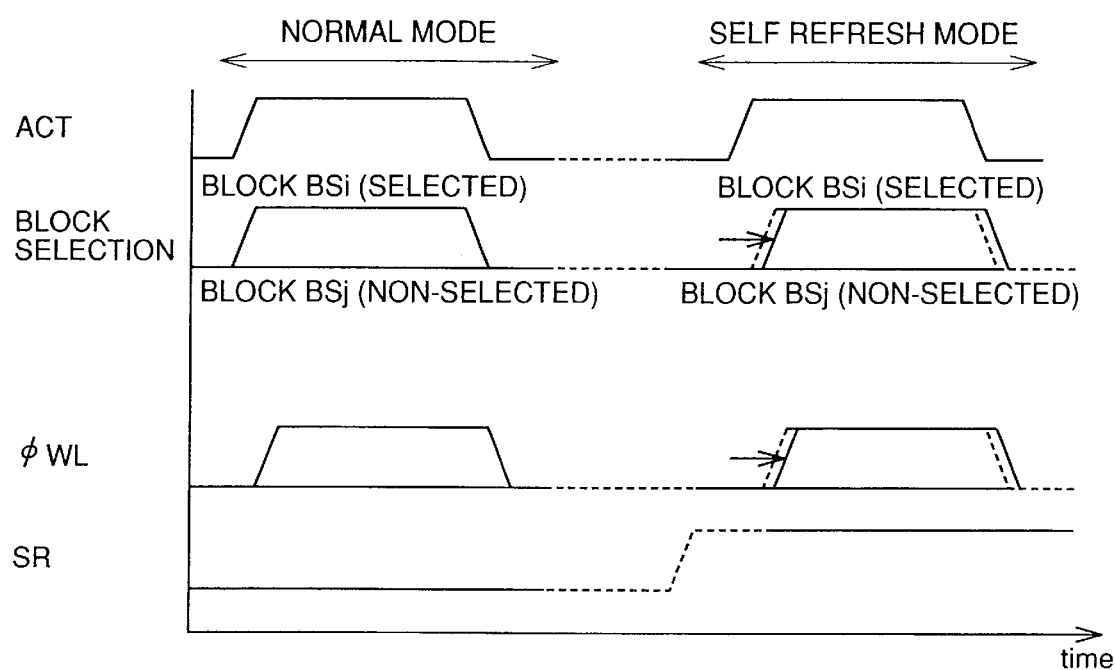
FIG. 15 is a timing chart for describing the operation of the word line activation controlling circuit shown in FIG. 14.

FIG. 15 is a timing chart for describing the operation of the word line activation controlling circuit shown in FIG. 14. Referring to FIGS. 14 and 15, when a block activation signal ACT rises to the H level in the normal mode, block BSi is selected and block BSj is non-selected. In this case, self refresh mode designation signal SR is at the L level and therefore word line activation original signal φWL0 is output as it is as word line activation signal φWL.

In the self refresh mode, block selection is carried out after waiting for the determination result of spare replacement and therefore the selection operation is delayed as compared with the normal mode. In this case, self refresh mode designation signal SR is at the H level and therefore the activation timing of word line activation signal φWL is delayed as compared with the normal mode.

According to the structure, a high speed operation is guaranteed by simultaneously selecting and activating a normal block and a spare block in the normal mode. In the refresh mode, a normal block or a spare block is selected and activated after determining which of the normal block and the spare block should be selected. Thus, power consumption can be reduced. Further, the activation timing of a word line is delayed as compared with the activation timing in the normal mode. Thus, the selection operation of a word line is implemented after one of a normal block and a spare block is selected. Therefore, the word line can be driven to a selected state more reliably.

Third Embodiment

An improved semiconductor memory device in a third embodiment of the present invention will be described. In the case of the operations described in the first and second embodiments, the block selection operation in the self refresh mode is improved as described below.

In the self refresh mode, refresh row addresses are sequentially and internally produced according to an internal timer and an address counter. A corresponding word line is selected according to the row address. Thus, the refresh operation for selected memory cell data is performed.

Accordingly, by producing a refresh row address for the (n+1)th cycle within the nth self refresh cycle, production of the block selection signals can be completed before initiation of the (n+1)th cycle.

Figure 42:
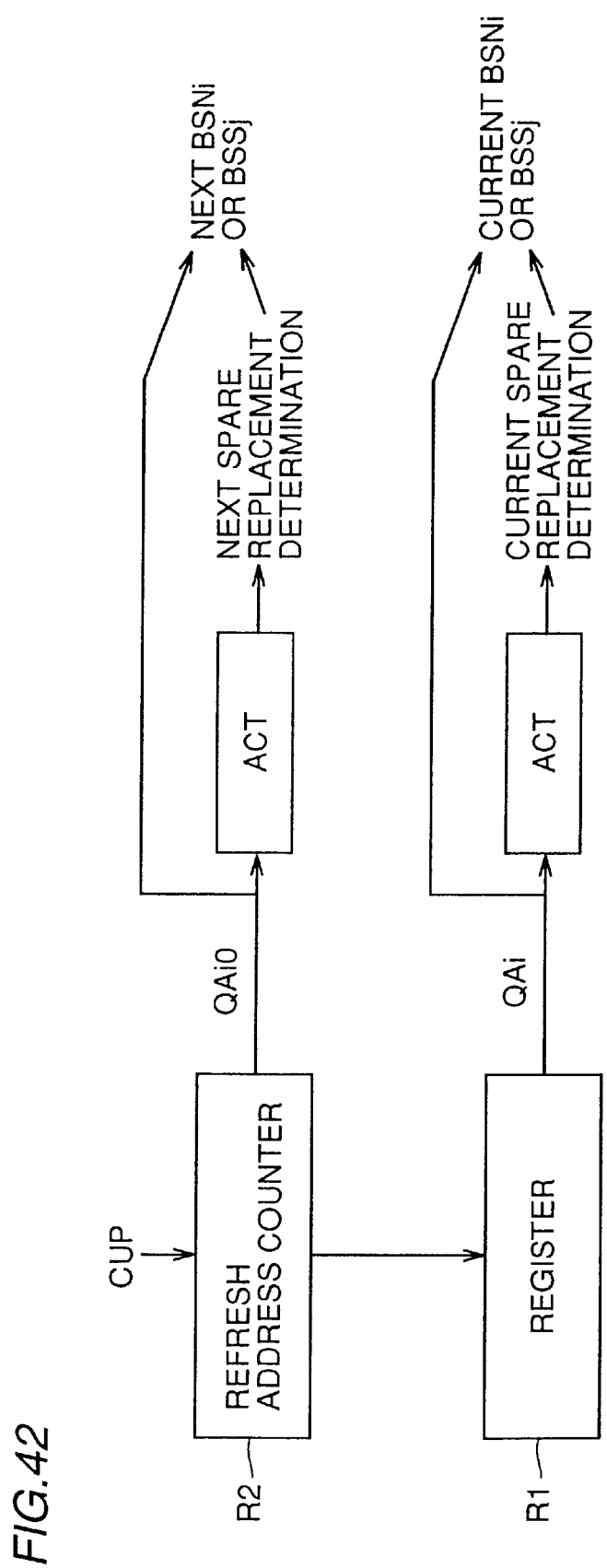
FIG. 42 is a diagram for describing a peripheral control-related circuit in the third embodiment.
Figure 43:
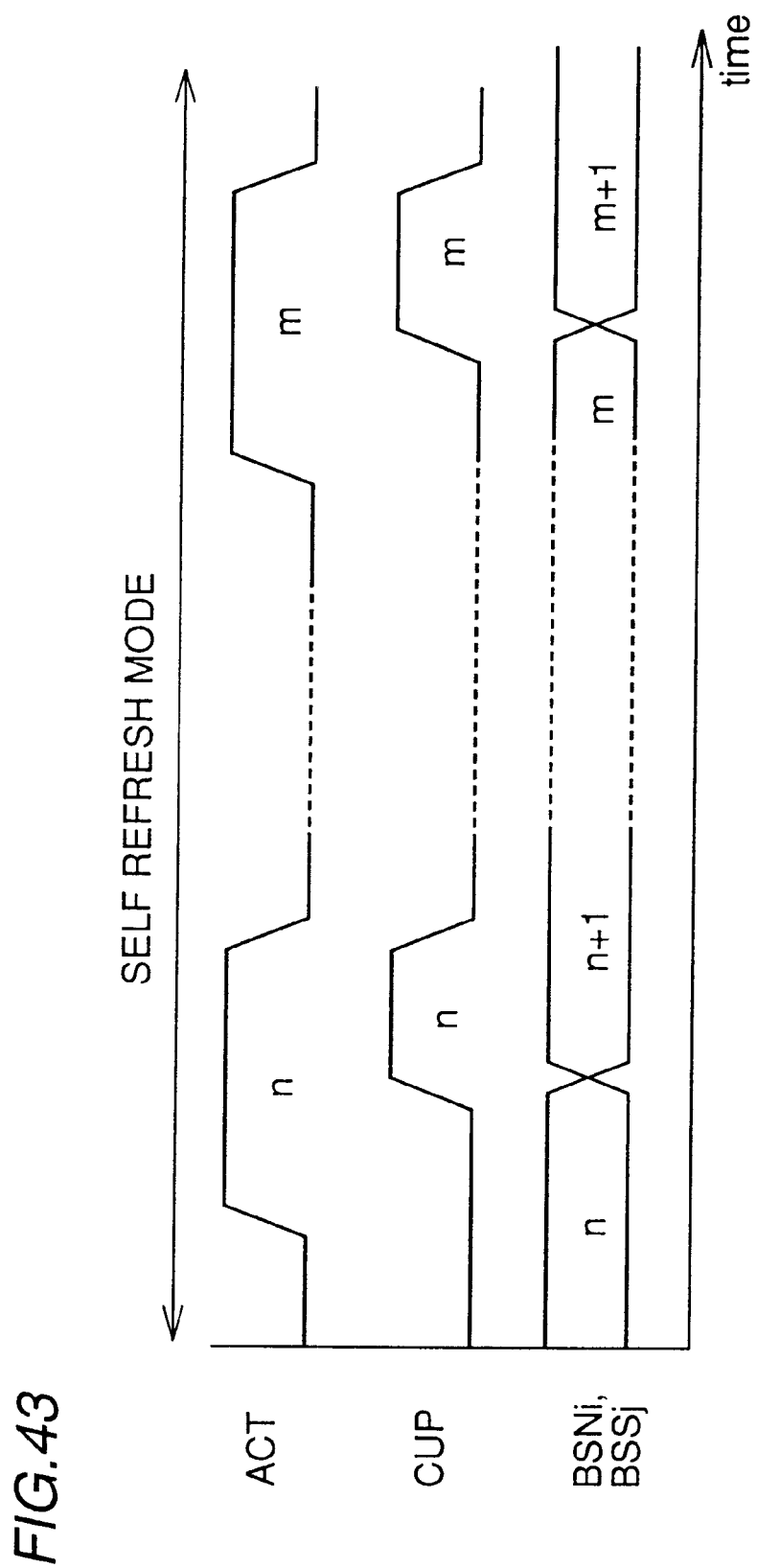
FIG. 43 is a timing chart for describing the self refresh mode operation of the circuit shown in FIG. 42.

A peripheral control-related circuit for implementing such an operation will be described with reference to FIGS. 42 and 43. FIG. 42 is a diagram for describing the peripheral control-related circuit in the third embodiment. FIG. 43 is a timing chart for describing the self refresh mode operation of the circuit shown in FIG. 42. The circuit shown in FIG. 42 is arranged instead of peripheral control-related circuit 6 in FIG. 1.

The circuit shown in FIG. 42 includes a register R1, a refresh address counter R2, and an address comparing circuit (ACT in FIG. 42) for spare replacement. Refresh address counter R2 performs a counting operation according to a count-up instruction signal CUP. Count-up instruction signal CUP changes in response to block activation signal ACT as shown in FIG. 43. The value of refresh address counter R2 indicates a refresh address QAi0 in the next cycle. Register R1 receives the output of refresh address counter R2 and outputs a refresh address QAi in the current cycle.

Address comparing circuit ACT determines spare replacement in the current cycle for current refresh address QAi and determines spare replacement in the next cycle for next refresh address QAi0.

Refresh address QAi output from register R1 determines normal block selection signal BSNi or spare block selection signal BSSj in the current cycle. Normal block selection signal BSNi or spare block selection signal BSSj that is block-decoded according to refresh address counter R2 is used as a normal block selection signal or a spare block selection signal in the next cycle.

As shown in FIG. 43, at the initiation time of the nth self refresh cycle, corresponding normal block selection signal BSNi or spare block selection signal BSSj has already been produced. In response to count-up instruction signal CUP produced in the nth self refresh cycle, normal block selection signal BSNi or spare block selection signal BSSj in the (n+1)th cycle can be produced.

As a result, the timing of an internal operation in the refresh cycle does not have to be delayed, and the internal refresh cycle operation is made possible similarly to the operation in the normal mode.

Figure 16:
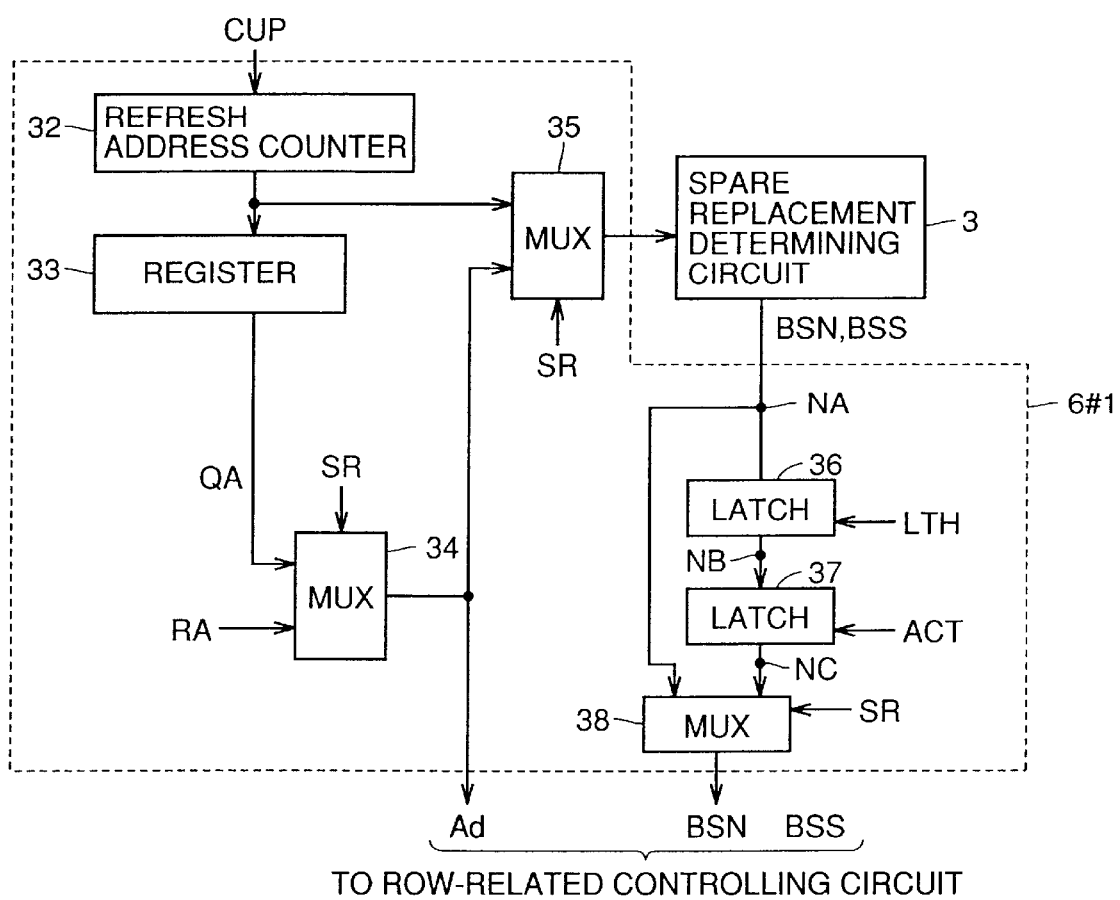
FIG. 16 shows a structure of a main part of a peripheral control-related circuit 6#1 in a third embodiment of the present invention.

One example of a specific structure of the peripheral control-related circuit according to the third embodiment will be described with reference to FIG. 16. The circuit shown in FIG. 16 is arranged instead of peripheral control-related circuit 6 in FIG. 1. A peripheral control-related circuit 6#1 shown in FIG. 16 includes a refresh address counter 32, a register 33, and multiplexers (MUX in FIG. 16) 34, 35.

Refresh address counter 32 performs a counting operation according to count-up instruction signal CUP. Register 33 receives and outputs a count value output from refresh address counter 32. The output of register 33 is output as refresh address signal QA to multiplexer 34.

Multiplexer 34 selects and outputs refresh address signal QA received from register 33 in the self refresh mode and internal row address signal RA corresponding to an externally received row address in the normal mode.

Multiplexer 35 selectively outputs one of the output of refresh address counter 32 and the output of multiplexer 34 in response to self refresh mode designation signal SR. Spare replacement determining circuit 3 decodes a signal applied from multiplexer 35 and carries out replacement determination.

It is noted that a prescribed bit of the count value produced by refresh address counter 32 in the nth cycle corresponds to the (n+1)th refresh address.

Peripheral control-related circuit 6#1 shown in FIG. 16 further includes latch circuits 36, 37, and a multiplexer 38. Latch circuit 36 latches and outputs normal block selection signal BSN and the spare block selection signal received from spare replacement determining circuit 3 in response to a signal LTH for controlling the latch timing. Latch circuit 37 latches and outputs the output of latch circuit 36 in response to block activation signal ACT. Multiplexer 38 selectively outputs one of the output of latch circuit 37 and the output of spare replacement determining circuit 3 in response to self refresh mode designation signal SR. The block selection operation is carried out according to normal block selection signal BSN and spare block selection signal BSS output from multiplexer 38.

Figure 17:
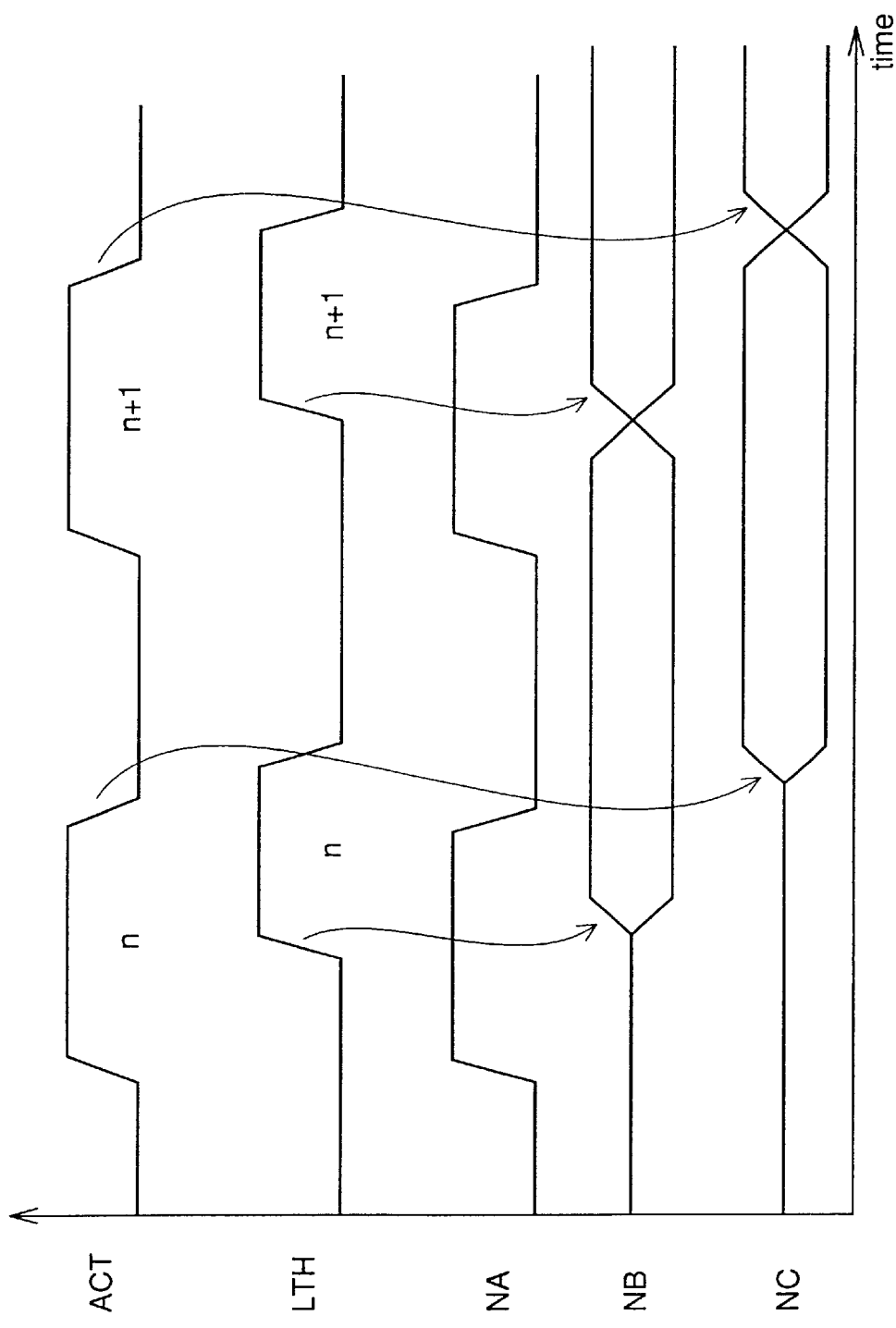
FIG. 17 is a timing chart for describing the operation of peripheral control-related circuit 6#1 shown in FIG. 16.

The self refresh mode operation of peripheral control-related circuit 6#1 shown in FIG. 16 will be described with reference to the timing chart in FIG. 17. FIG. 17 is a timing chart for describing the operation of peripheral control-related circuit 6#1 shown in FIG. 16. Referring to FIGS. 16 and 17, spare replacement is determined in response to the nth (or the (n+1)th) activation of block activation signal ACT. An input node NA of latch circuit 36 receives normal block selection signal BSN and spare block selection signal BSS. In response to the nth (or the (n+1)th) activation of signal LTH, normal block selection signal BSN and spare block selection signal BSS are output at the output node NB of latch circuit 36. Then, in response to the nth (or the (n+1)th) inactivation of block activation signal ACT, normal block selection signal BSN and spare block selection signal BSS are output at the output node NC of latch circuit 37.

In other words, spare replacement determination according to the (n+1)th refresh address indicated by a prescribed bit of a count value produced in refresh address counter 32 can be completed in the nth cycle. As a result, the refresh operation can be performed at timing similar to that of the normal mode without delaying the timing of an internal operation in the self refresh cycle.

Fourth Embodiment

An improved semiconductor memory device in a fourth embodiment of the present invention will be described. The self refresh mode operations described in the second and third embodiments are further improved as described below. In the self refresh mode, refresh row addresses are sequentially and internally produced according to an internal timer and an address counter as described above. A corresponding word line is selected according to the row address, and the refresh operation for selected memory cell data is carried out.

Accordingly, by producing a refresh row address in the (n+1)th cycle within the nth self refresh cycle, production of the block selection signals can be completed before initiation of the (n+1)th cycle. By simultaneously determining spare replacement in the previous cycle, production of the block selection signals by spare replacement can also be completed in advance in the previous cycle.

In the fourth embodiment, the gate control signals are reset/set only when a transition is made to a different memory block in the self refresh mode. When the position of word line selection makes a transition in the same memory block, the gate control signals remain to select the memory block.

Figure 18:
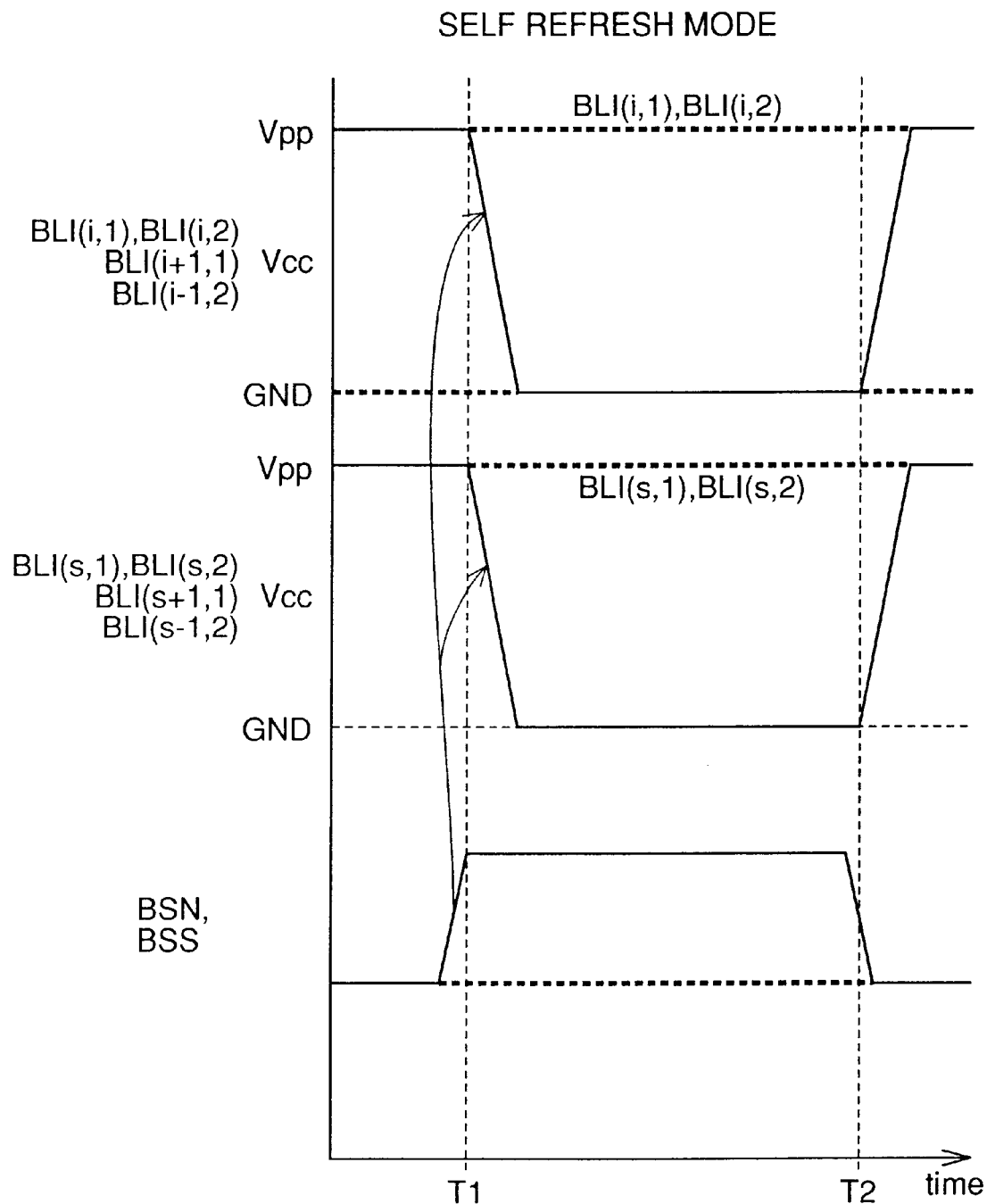
FIG. 18 is a timing chart for describing the self refresh mode operation of a semiconductor memory device in a fourth embodiment of the present invention.

One example of the self refresh mode operation of the semiconductor memory device in the fourth embodiment will be described with reference to the timing chart in FIG. 18. The same reference characters denote the same signals as in FIGS. 4, 6, and 7. In FIG. 18, memory block Mi corresponding to block selection signal BSi is to be selected in self refresh mode.

(1) Between time T1 and T2 (1 cycle), a refresh row address produced in the refresh address counter is compared with a spare address. At time T2, normal block selection signal BSNi or spare block selection signal BSSj is produced as the determination result of spare replacement.

If selected normal block selection signal BSNi or spare block selection signal BSSj is the same as that of the previous cycle, corresponding gate control signals BLI (i+1, 1), BLI (i−1, 2), or corresponding gate control signals BLI (s+1, 1), BLI (s−1, 2) are kept at the ground voltage level GND. If selected normal block selection signal BSNi or spare block selection signal BSSj does not correspond to that of the previous cycle, corresponding gate control signals BLI (i+1, 1), BLI (i−1, 2), or corresponding gate control signals BLI (s+1, 1), BLI (s−1, 2) are raised to the boosted power supply voltage level Vpp.

At time T1 when the next cycle starts, corresponding gate control signals BLI (i+1, 1), BLI (i−1, 2), or corresponding gate control signals BLI (s+1, 1), BLI (s−1, 2) are lowered to the ground voltage level GND.

According to the operation described in (1), the timing of an internal operation does not have to be delayed during the refresh cycle, and the internal refresh cycle operation is made possible similarly to the conventional operation mode. Further, power consumption associated with production of the gate control signals can be reduced.

In the operation described in (1), however, the gate control signals corresponding to a normal block change once before and after spare block selection, increasing power consumption. An improvement on the operation described in (1) will be described in (2). (2) Between time T1 and T2, a refresh row address produced in the refresh address counter is compared with a spare address. At time T2, normal block selection signal BSNi or spare block selection signal BSSj is produced as the determination result of spare replacement.

If selected normal block selection signal BSNi is the same as that of the previous cycle, corresponding gate control signals BLI (i+1, 1) and BLI (i−1, 2) are kept at the ground voltage level GND. If selected normal block selection signal BSNi does not correspond to that of the previous cycle, corresponding gate control signals BLI (i+1, 1) and BLI (i−1, 2) are raised to the boosted power supply voltage level Vpp.

At time T1 when the next cycle starts, corresponding gate control signals BLI (i+1, 1) and BLI (i−1, 2) are lowered to the ground voltage level GND.

Each time spare replacement is determined during this period, corresponding gate control signals BLI (s+1, 1) and BLI (s−1, 2) are lowered to the ground voltage level at time T1 when the next cycle starts, and the signals are reset at the boosted power supply voltage level Vpp when the cycle ends.

According to the operation as described in (2), the gate control signals corresponding to a normal block can be prevented from changing before and after spare replacement., and an increase in power consumption can be avoided.

Figure 44:
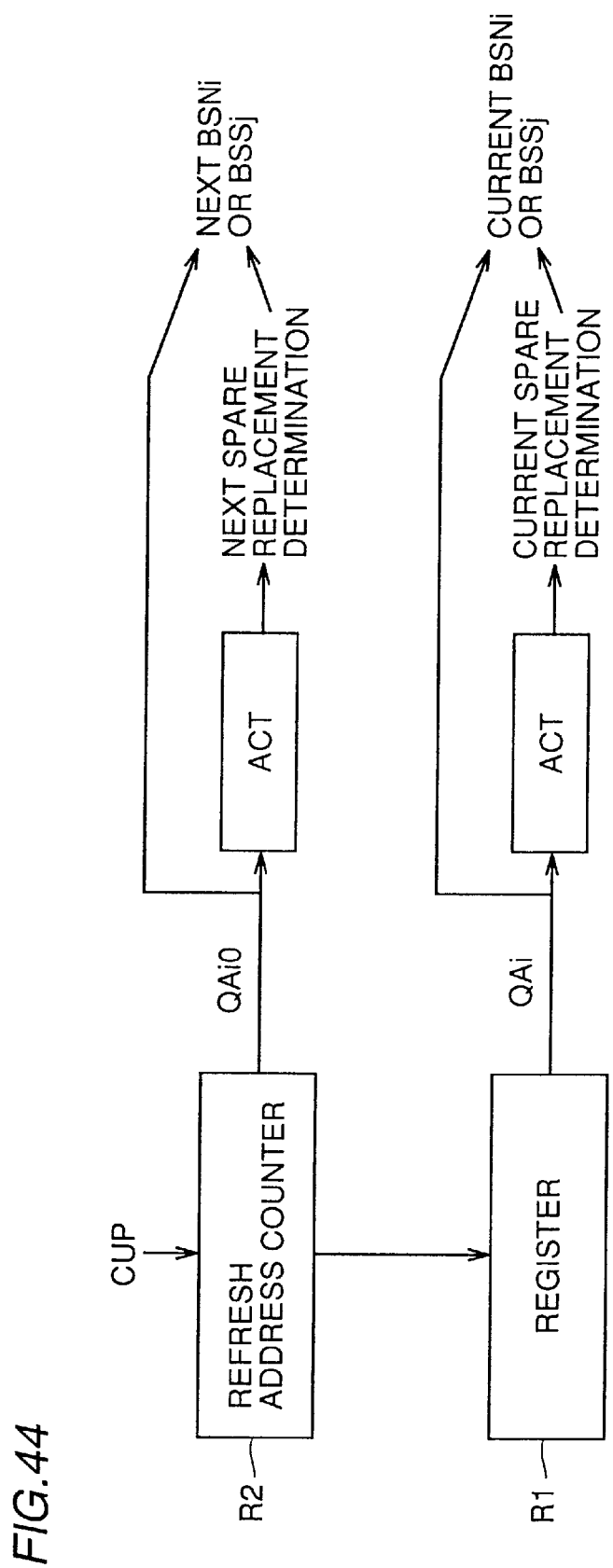
FIG. 44 is a diagram for describing a peripheral control-related circuit in the fourth embodiment.
Figure 45:
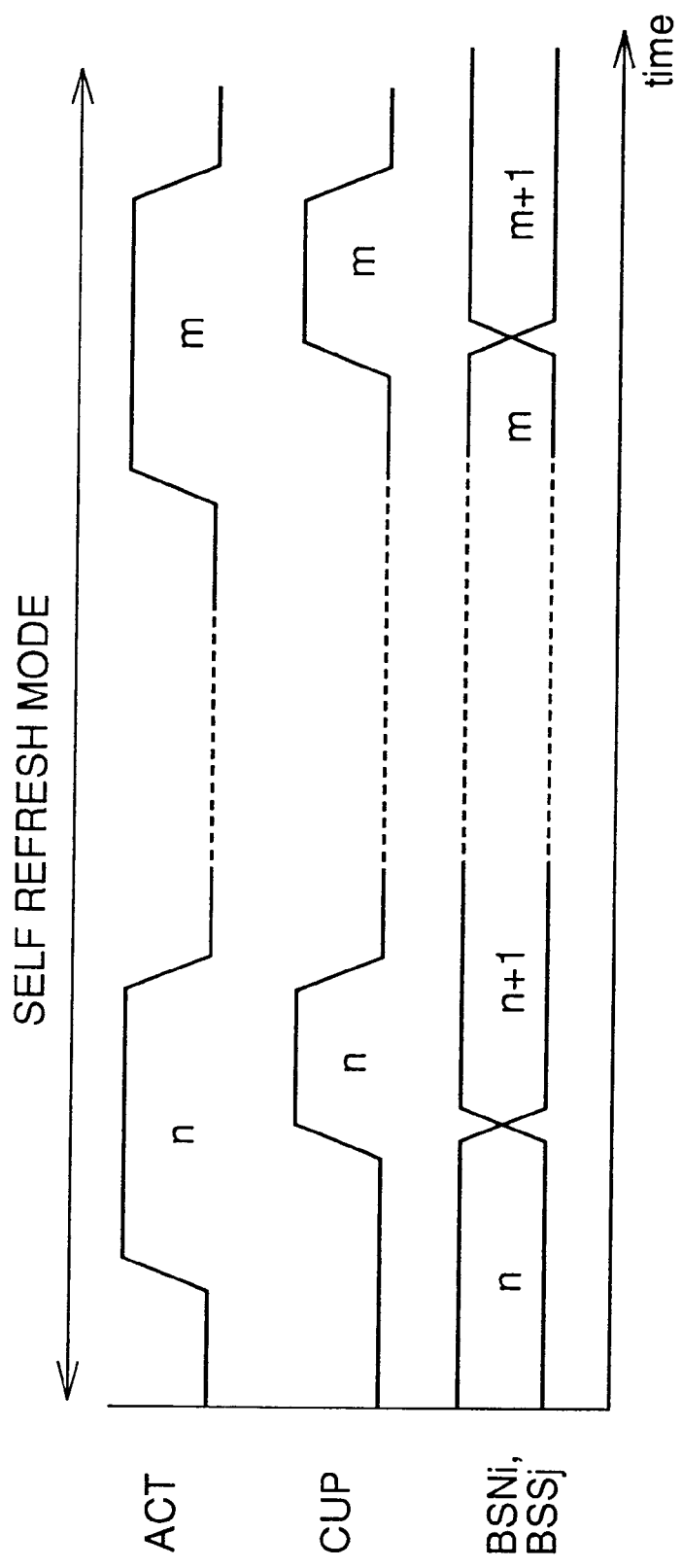
FIG. 45 is a timing chart for describing the self refresh mode operation of the circuit shown in FIG. 44.

The peripheral control-related circuit for realizing such an operation will be described with reference to FIGS. 44 and 45. FIG. 44 is a diagram for describing the peripheral control-related circuit in the fourth embodiment of the present invention. FIG. 45 is a timing chart for describing the self refresh mode operation of the circuit shown in FIG. 44. The circuit shown in FIG. 44 is arranged instead of peripheral control-related circuit 6 in FIG. 1.

The circuit shown in FIG. 44 includes a register RI, a refresh address counter R2, and an address comparing circuit (ACT in the figure) for spare replacement. Refresh address counter R2 performs a counting operation according to count-up instruction signal CUP, and outputs refresh address QAi0 in the next cycle. Register R1 receives the output of refresh address counter R2, and outputs refresh address QAi in the current cycle.

Address comparing circuit ACT determines spare replacement in the current cycle for current refresh address QAi, and determines next spare replacement for next refresh address QAi0.

Refresh address QAi output from register R1 determines normal block selection signal BSNi or spare block selection signal BSSj in the current cycle. Normal block selection signal BSNi or spare block selection signal BSSj that is block-decoded according to refresh address counter R2 is used as a normal block selection signal or a spare block selection signal in the next cycle.

As shown in FIG. 45, corresponding normal block selection signal BSNi or spare block selection signal BSSj has already been produced at time when the nth self refresh cycle starts. In response to count-up instruction signal CUP produced in the nth self refresh cycle, normal block selection signal BSNi or spare block selection signal BSSj in the (n+1)th cycle is produced. As a result, the operation described in (1) or (2) can be performed.

One example of a specific structure of the peripheral control-related circuit according to the fourth embodiment will be described with reference to FIG. 19. The circuit in FIG. 19 is arranged instead of peripheral control-related circuit 6 in FIG. 1.

Figure 19:
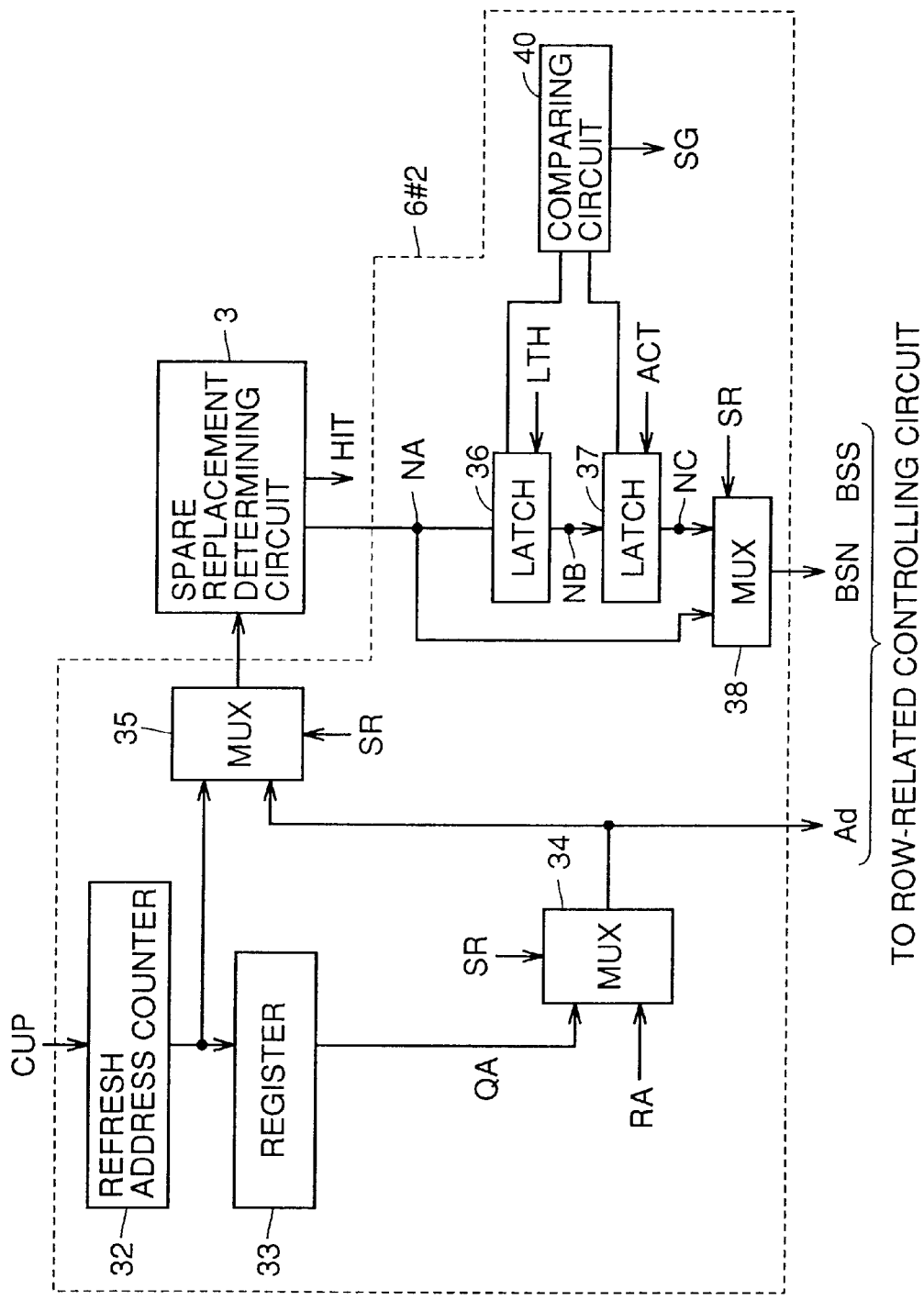
FIG. 19 shows a structure of a main part of a peripheral control-related circuit 6#2 of the semiconductor memory device in the fourth embodiment.

The peripheral control-related circuit 6#2 shown in FIG. 19 includes a comparing circuit 40 in addition to the structure of peripheral control-related circuit 6#1 in FIG. 16. Comparing circuit 40 compares normal block selection signal BSN and spare block selection signal BSS latched by latch circuit 37 with normal block selection signal BSN and spare block selection signal BSS latched by latch circuit 36, and outputs a correspondence determination signal SG indicating whether the block selection state does not change (does correspond/does not correspond) between two successive cycles.

A structure example of a selection gate controlling circuit of the semiconductor memory device in the fourth embodiment will be described with reference to FIG. 20. The circuit in FIG. 20 is arranged in selection gate controlling circuit 100 in FIG. 1.

Figure 20:
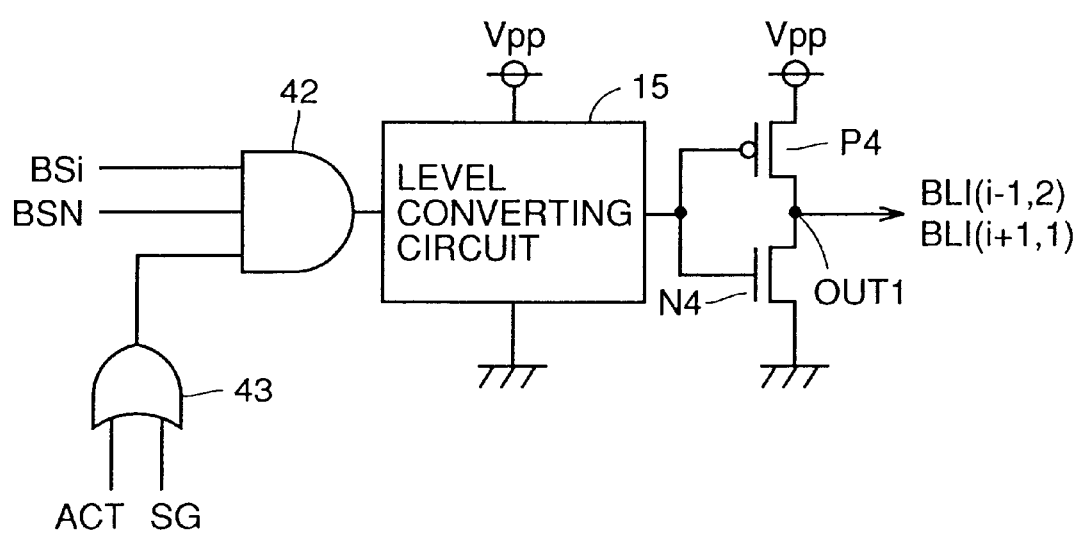
FIG. 20 shows one example of a specific structure of a selection gate controlling circuit of the semiconductor memory device in the fourth embodiment.

The selection gate controlling circuit shown in FIG. 20 includes an NOR circuit 43, an AND circuit 42, a level converting circuit 15, a PMOS transistor P4, and an NMOS transistor N4. NOR circuit 43 receives block activation signal ACT and correspondence determination signal SG. AND circuit 42 receives block selection signal BSi, signal BSN, and the output of NOR circuit 43. Level converting circuit 15 raises an H level output signal from AND circuit 42 to the boosted power supply voltage level Vpp. The gate electrodes of PMOS transistor P4 and NMOS transistor N4 receive the output of level converting circuit 15. Connection node OUT1 of PMOS transistor P4 and NMOS transistor N4 outputs gate control signals.

The circuit shown in FIG. 20 controls gate control signals BLI (i−1, 2) and BLI (i+1, 1) according to block selection signal BSi and correspondence determination signal SG. If an object of selection is different between two successive cycles (correspondence determination signal SG is at the L level), gate control signals BLI (i−1, 2) and BLI (i+1, 1) are reset at the boosted power supply voltage level Vpp. If there is no change in the block selection state, the state is maintained.

According to the structure, the timing of an internal operation does not have to be delayed in the refresh cycle, and the operation similar to the normal mode is made possible. Further, power consumption associated with setting of the gate control signals can be reduced.

Fifth Embodiment

An array portion structure of the semiconductor memory device in a fifth embodiment of the present invention will be described with reference to FIG. 21. The array portion in FIG. 21 is arranged instead of array portion 9 in FIG. 1.

Figure 21:
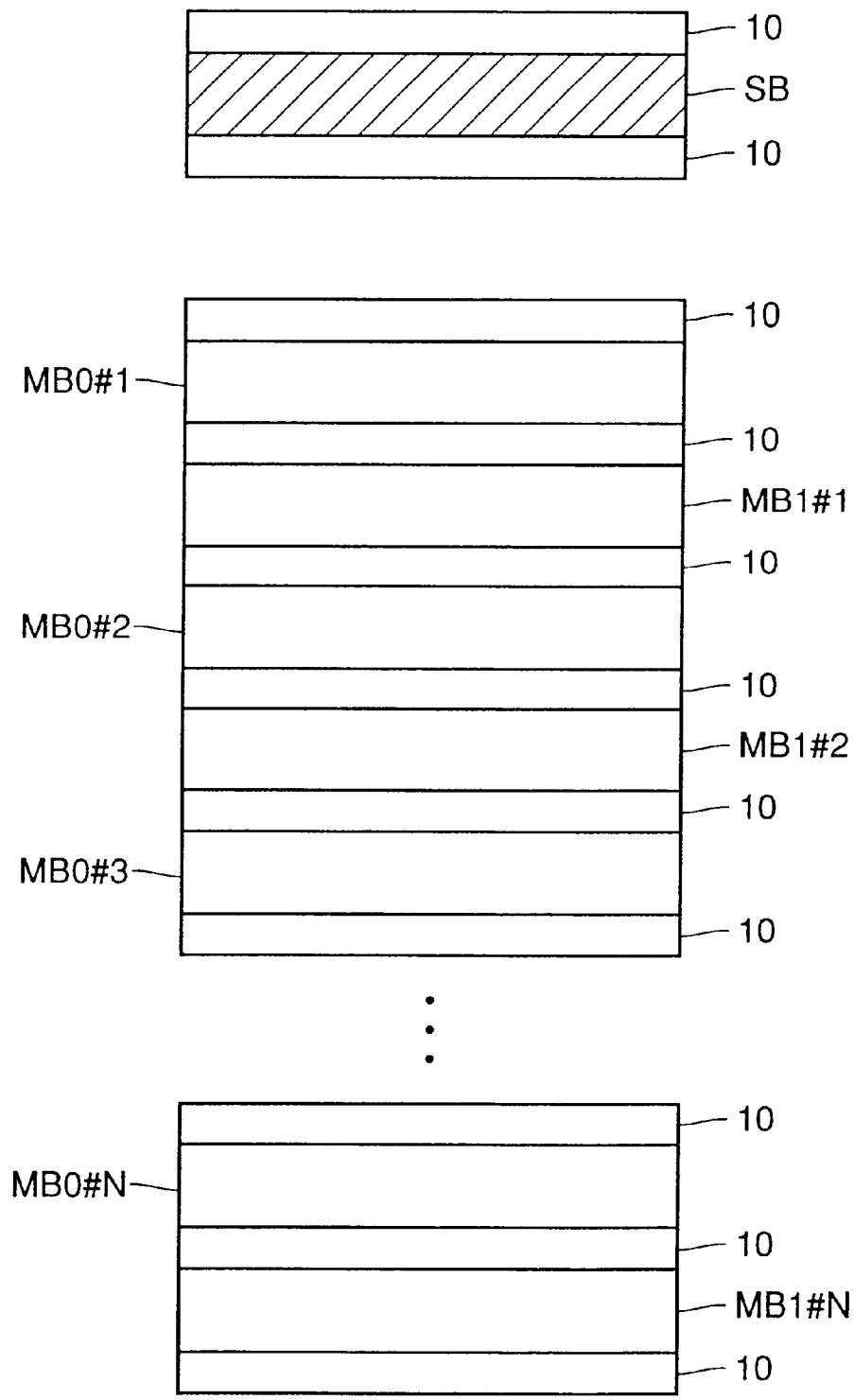
FIG. 21 shows a structure of an array portion of a semiconductor memory device in a fifth embodiment of the present invention.

The array portion shown in FIG. 21 includes normal blocks MB0#1 to MB0#N, MB1#1 to MB1#N, and a spare block SB. Sense amplifier block 10 has the alternately arranged shared sense amplifier structure.

Spare block SB replaces and repairs normal blocks MB0#1 to MB0#N and MB1#1 to MB1#N. Spare block SB and the normal blocks are provided in different mats from each other (separately).

Figure 46:
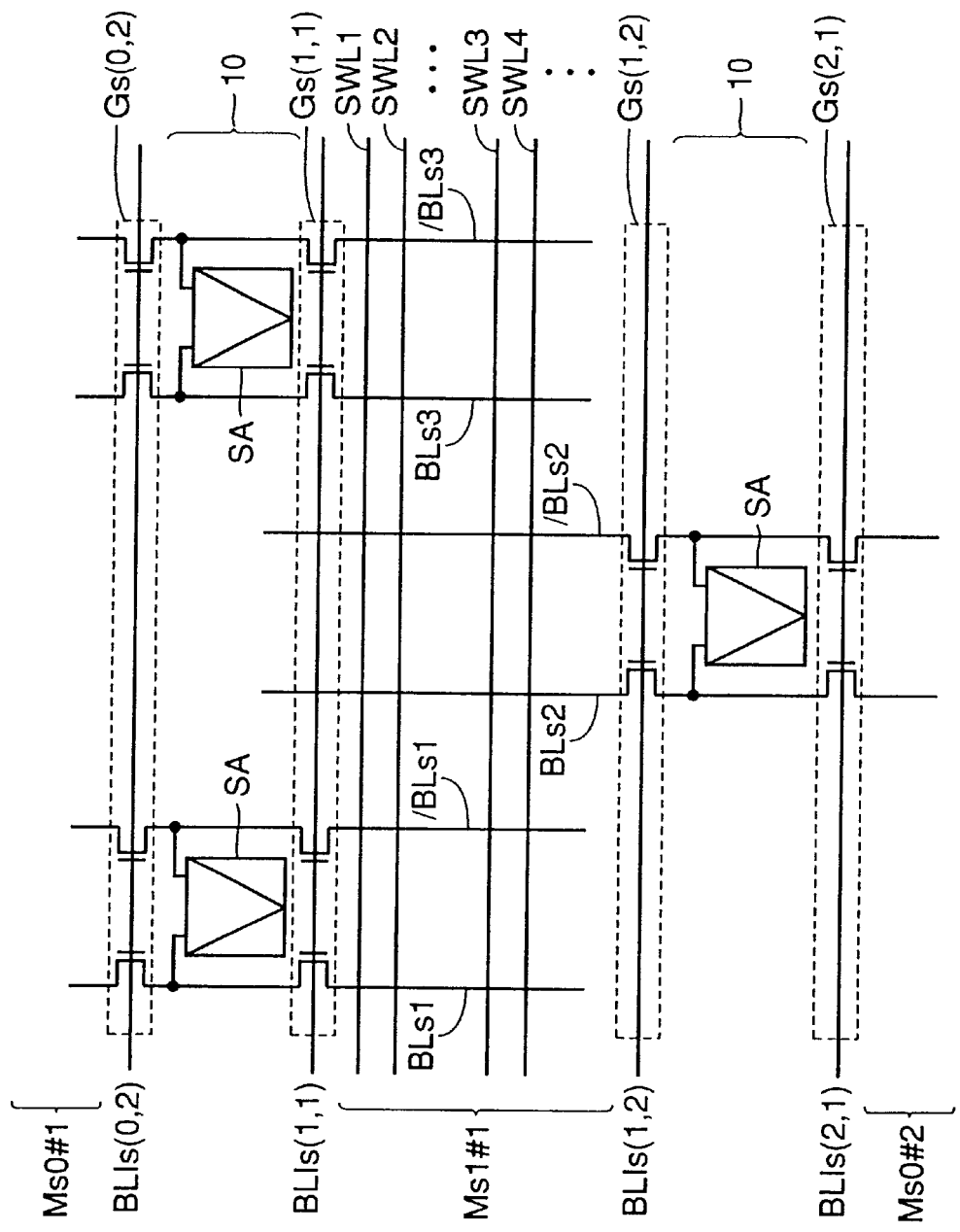
FIG. 46 is a diagram for describing relations between a sense amplifier block 10 and a spare block in the fifth embodiment.

Relations between the spare block and the sense amplifier blocks in the fifth embodiment will be described with reference to FIG. 46. In FIG. 46, Ms0#l, Ms1#1 and Ms0#2 denote spare blocks, BLs1, /BLs1, BLs2, /BLs2, BLs3, /BLs3 denote bit lines in spare block SB, and SWL1, SWL2, SWL3, SWL4 denote spare word lines.

Sense amplifier blocks 10 and the bit lines are connected via selection gates (Gs (0, 2), Gs (1, 1), Gs (1, 2), Gs (2, 2)). For example, one of sense amplifier blocks 10 is connected to spare block Ms0#1 via selection gate Gs (0, 2), and to memory block Ms l#l via selection gate Gs (1, 1).

Each selection gate is formed of a plurality of NMOS transistors. In FIG. 46, selection gate Gs (0, 2) is opened and closed in response to gate control signal BLIs (0, 2). Selection gates Gs (1, 1) and Gs (1, 2) are opened and closed in response to gate control signals BLIs (1, 1) and BLIs (1, 2), respectively. Selection gate Gs (2, 1) is opened and closed in response to gate control signal BLIs (2, 1).

When only one or more spare block is provided in one mat, a single spare block is selected or one spare block is selected from a small number of spare blocks. In this case, block decoding of internal row addresses becomes unnecessary or simple. When the array portion shown in FIG. 21 is used, the following operation becomes possible.

Firstly, the structure described in the first embodiment causes the gate control signals to be controlled according to external row addresses regardless of the determination result of spare replacement. Further, the gate control signals are set at the intermediate level regardless of determination result of spare replacement, and the gate control signals are set at the boosted power supply voltage level Vpp or the ground voltage level GND according to the determination result of spare replacement.

Secondly, the structure in the second embodiment causes the gate control signals for either of a normal block or a spare block to be controlled according to the determination result of spare replacement especially in the refresh mode.

Thirdly, the structure in the third embodiment causes the next normal block selection signal or spare block selection signal to be produced in a previous self refresh cycle and, according to this, the internal refresh operation is carried out.

Fourthly, the structure in the fourth embodiment causes the gate control signals to be maintained when there is no change in a selected block especially in successive self refresh cycles, and the gate control signals to be reset only when there is a transition in the selected memory block.

According to the structures, a high speed operation in the normal mode and power consumption reduction in the refresh operation can be allowed.

Sixth Embodiment

An improved semiconductor memory device in a sixth embodiment of the present invention will be described. In the sixth embodiment, the operations associated with the selection gates described in the first to fifth embodiments are applied to the operation associated with driving of word lines. The operation of the semiconductor memory device in the sixth embodiment will be described with reference to the timing charts in FIGS. 22 and 23.

Figure 22:
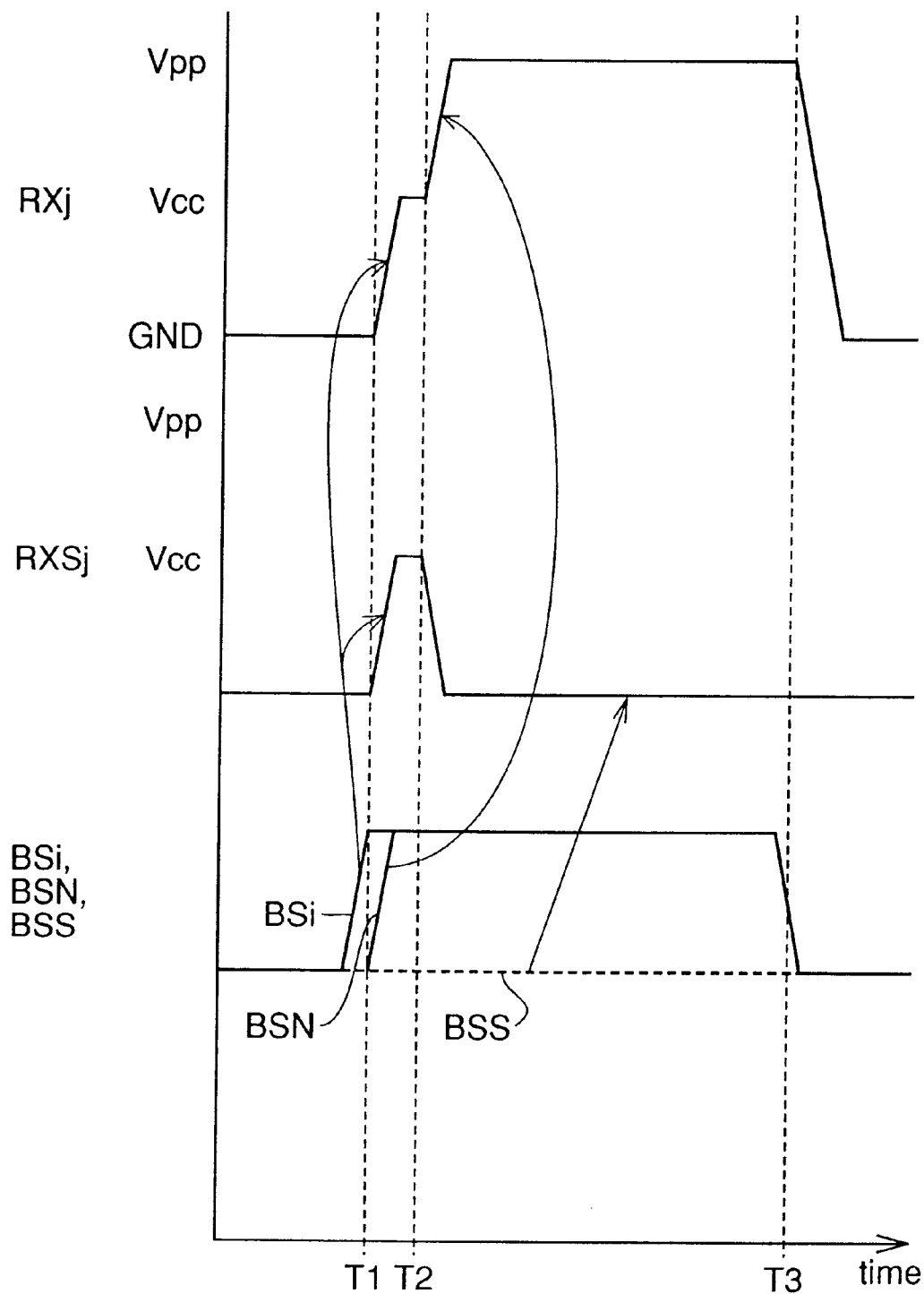
FIGS. 22 and 23 are timing charts for describing controlling of word line drive signals of a semiconductor memory device in a sixth embodiment.
Figure 23:
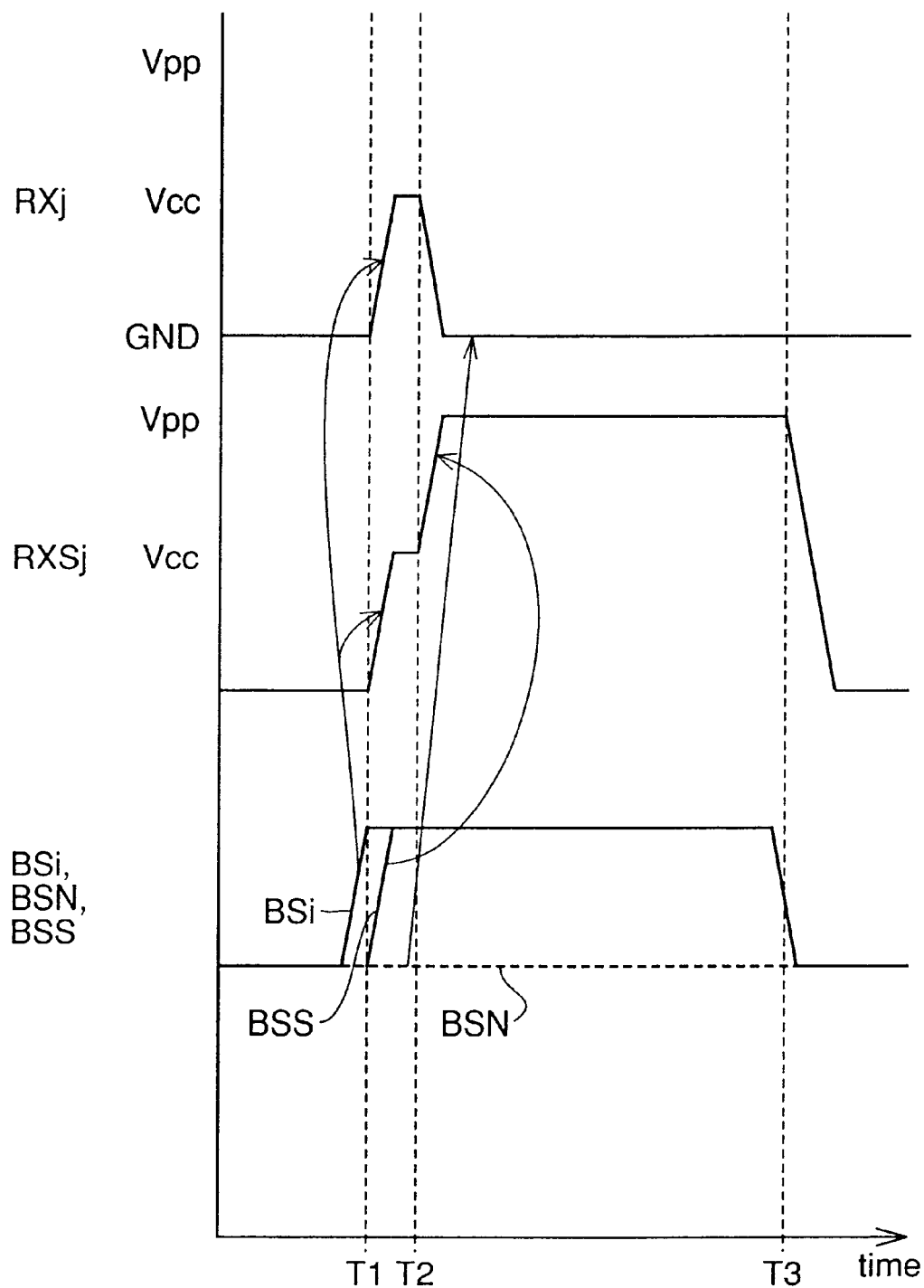

FIG. 22 corresponds to the case of spare non-replacement, and FIG. 23 corresponds to the case of spare replacement. In FIGS. 22 and 23, RXj denotes a word line drive signal corresponding to a word line to be selected, and RXSj denotes a word line drive signal corresponding to a spare word line for replacing and repairing the selected word line.

Referring to FIG. 22, the word line drive signals are set at the ground voltage level GND in the standby state. At time T1, block selection signal BSi attains the H level. In response, word line drive signals RXj and RXSj are raised to the power supply voltage level Vcc.

From time T1 to T2, spare replacement is determined and normal block selection signal BSN rises to the H level. Spare blocks selection signal BSS maintains the L level. In response, word line drive signal RXj is raised to the boosted power supply voltage level Vpp, and word line drive signal RXSj is lowered to the ground voltage level GND.

Referring to FIG. 23, the word line drive signals are temporarily set at the power supply voltage level Vcc similarly to FIG. 22. When spare replacement is to be carried out, spare block selection signal BSS rises to the H level from time T1 to T2. Normal block selection signal BSN maintains the L level. In response, word line drive signal RXSj is raised to the boosted power supply voltage level Vpp. Word line drive signal RXj is lowered to the ground voltage level GND.

A high speed operation is made possible by controlling the levels of the word line drive signals in this manner. When the voltage of the intermediate level (Vcc) is used, power consumption can be reduced.

Figure 24:
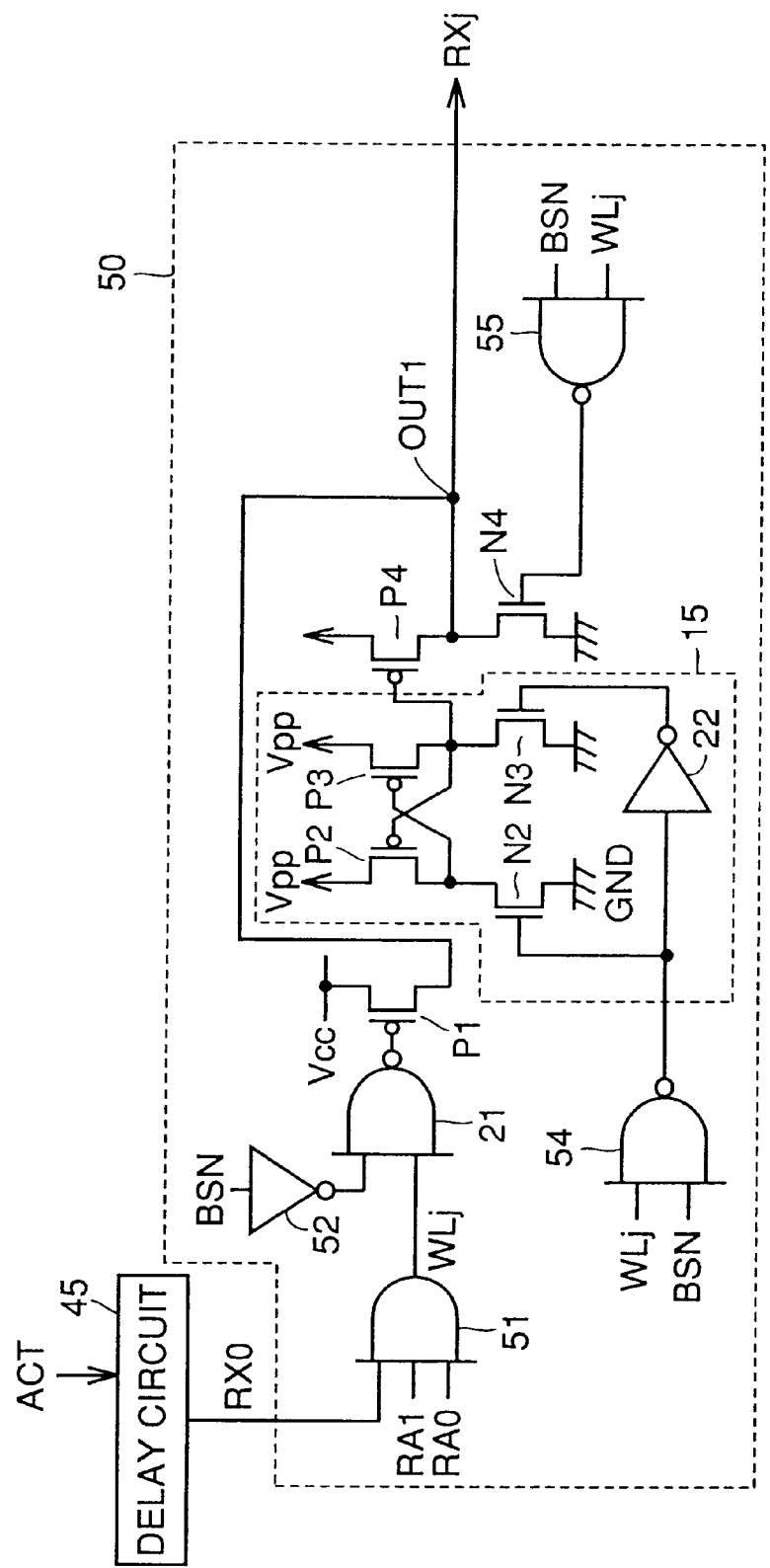
FIG. 24 shows one example of a specific structure of a word line drive controlling circuit for producing the word line drive signals shown in FIGS. 22 and 23.

One example of the structure of the word line drive controlling circuit for implementing the operation shown in FIGS. 22 and 23 will be described with reference to FIG. 24. Referring to FIG. 24, word line drive controlling circuit 50 includes an AND circuit 51, NAND circuits 21, 54, 55, an inverter 52, a level converting circuit 15, a PMOS transistor P4, and an NMOS transistor N4.

AND circuit 51 receives internal address signals RA0, RA1, and signal RX0 from delay circuit 45 included in the peripheral control-related circuit, and outputs a word line drive original signal WLj. Signal RX0 is delayed block activation signal ACT. Inverter 52 inverts normal block selection signal BSN. NAND circuit 21 receives the output of inverter 52 and signal WLj.

NAND circuits 54 and 55 receive signal WLj and normal block selection signal BSN. The gate electrode of PMOS transistor P4 receives the output of level converting circuit 15, and the gate electrode of NMOS transistor N4 receives the output of NAND circuit 55. The gate electrode of PMOS transistor P1 receives the output of NAND circuit 21.

When PMOS transistor P1 turns on, output node OUT1 (word line drive signal RXj) is set at power supply voltage level Vcc. When PMOS transistor P4 turns on (signals BSN and WLj are both at the H level), output node OUT1 is set at the boosted power supply voltage level Vpp. When NMOS transistor N4 turns on (signal BSN or WLj is at the L level), output node OUT1 is set at the ground voltage level GND.

Figure 25:
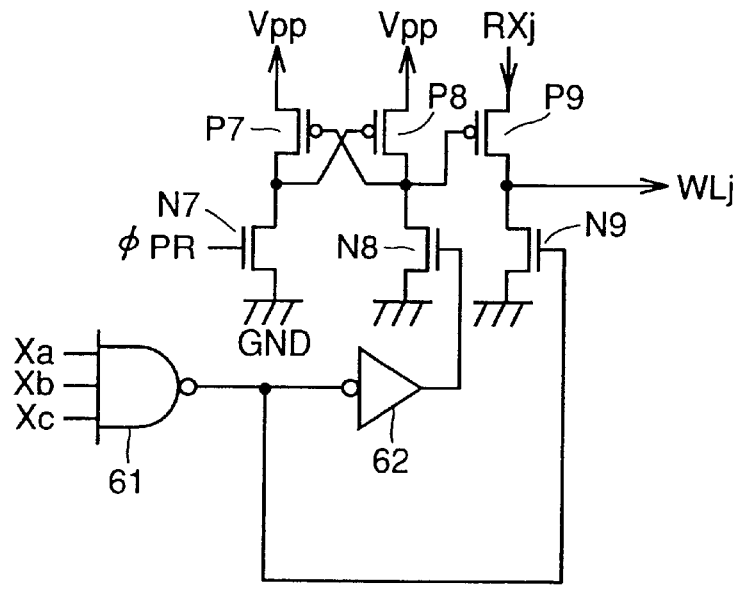
FIGS. 25 and 26 are circuit diagrams showing one example of a specific structure of a word driver in the sixth embodiment.
Figure 26:
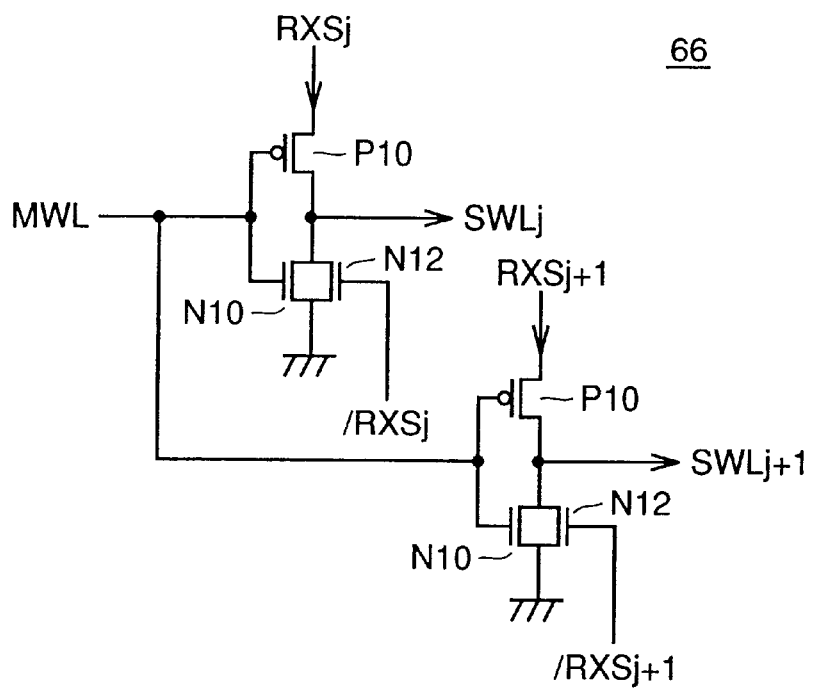

One example of the structure of a word driver applied to word line drive signal RXj shown in FIGS. 22 and 23 will be described with reference to FIGS. 25 and 26 FIGS. 25 and 26 correspond to the normal word line structure and the hierarchical word line method, respectively. FIGS. 25 and 26 are arranged in row-related controlling circuit 5 shown in FIG. 1.

In FIG. 25, a decoder (an NAND circuit 61 and an inverter 62) is also shown. NAND circuit 61 receives internal row addresses Xa, Xb, Xc Inverter 62 inverts a signal from NAND circuit 61.

The word driver shown in FIG. 25 includes PMOS transistors P7 to P9 and NMOS transistors N7 to N9. PMOS transistor P7 and NMOS transistor N7 are connected in series between boosted power supply voltage Vpp and ground voltage GND. PMOS transistor P8 and NMOS transistor N8 are connected in series between boosted power supply voltage Vpp and ground voltage GND. The gate electrode of NMOS transistor N7 receives a precharge signal φPR, and the gate electrode of NMOS transistor N8 receives the output of inverter 62.

One conductive terminal of PMOS transistor P9 receives above described word line drive signal RXj. One conductive terminal of NMOS transistor N9 is connected to ground voltage level GND. The connection node of PMOS transistor P9 and NMOS transistor N9 is connected to word line WLj.

When H level precharge signal φPR is received, PMOS transistors P8 and P9 are turned on and off, respectively. When inverter 62 outputs an H level signal, NMOS transistors N8 and PMOS transistor P9 are turned on. Word line drive signal RXj is supplied to word line WLj. When NAND circuit 61 outputs an H level signal, NMOS transistor N9 is turned on and word line WLj falls to the ground voltage level GND.

The word driver shown in FIG. 26 includes a PMOS transistor P10 and NMOS transistors N10, N12. PMOS transistor P10 and NMOS transistors N10, N12 are provided for each sub word line.

The gate electrodes of PMOS transistor P10 and NMOS transistor N10 are connected to a main word line MWL. PMOS transistor P10 has one conductive terminal receiving word line drive signal RXSj (or RXSj+1) and the other conductive terminal connected to a sub word line SWLj (or SWLj+1). NMOS transistors N10 and N12 each have one conductive terminal connected to ground voltage GND and the other conductive terminal connected to sub word line SWLj (or SWLj+1). The gate electrode of NMOS transistor N12 receives a signal /RXSj (/RXSj+1) which is an inversion of inverting word line drive signal RXSj (or RXSj+1). A sub word line is selected by a combination of main word line MWL and the word line drive signal.

According to the structure, a corresponding word line or sub word line can be raised to the power supply voltage level Vcc prior to determination of spare replacement. Accordingly, a high speed operation is made possible. Further, power consumption can be reduced by using the intermediate level voltage (Vcc).

When spare row decoding (spare replacement determination) meets the production timing of the word line drive signals but does not meet the production timing of the gate control signals, the gate control signals have to be selected for both of a normal block and a spare block.

As described in the first to sixth embodiments, which is effective to associate spare row decoding with production of the gate control signals or to associate spare row decoding with the word drive signals is determined by at which timing the spare row decode signal is actually produced. This is determined by the memory cell structure, the number of spare rows, and so on.

Seventh Embodiment

An improvement on the semiconductor memory devices described in the first to fifth embodiments of the present invention will be described. A selection gate controlling circuit in a seventh embodiment of the present invention sets the gate control signals at the power supply voltage level Vcc in the standby state.

Figure 27:
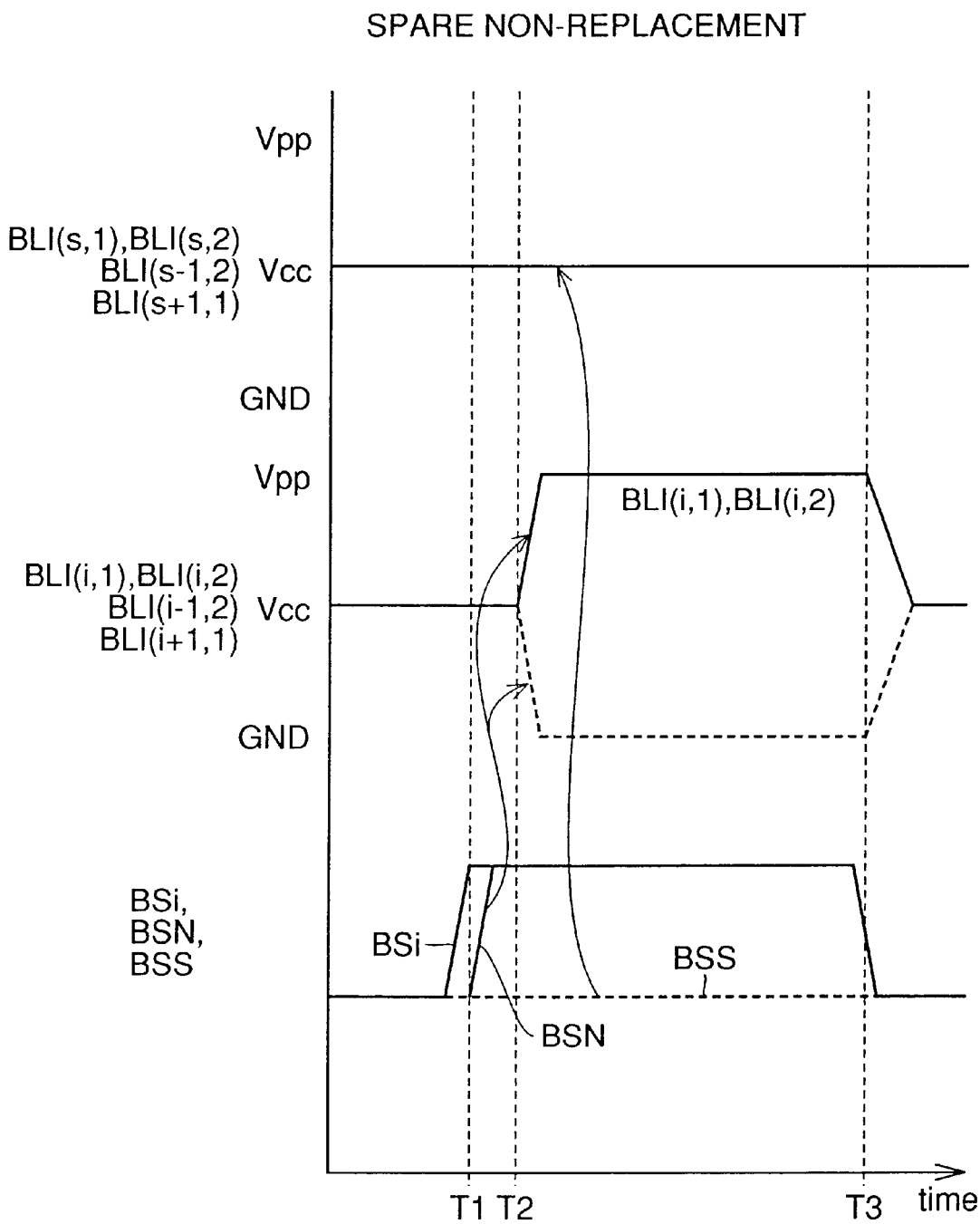
FIGS. 27 and 28 are timing charts for describing the operation of a selection gate controlling circuit in a seventh embodiment of the present invention.

One example of the selection gate controlling circuit in the seventh embodiment will be described with reference to the timing charts in FIGS. 27 and 28. FIG. 27 corresponds to the case of spare non-replacement while FIG. 28 corresponds to the case of spare replacement. The same signals as in FIGS. 4, 6 and 7 are denoted by the same reference characters.

Referring to FIG. 27, the gate control signals are set at the power supply voltage level Vcc in the standby state. At time T1, block selection signal BSi rises to the H level. From time T1 to T2, spare replacement is determined and normal block selection signal BSN rises to the H level.

Spare block selection signal BSS maintains the L level. In response, gate control signals BLI (i, 1) and BLI (i, 2) are raised to the boosted power supply voltage level Vpp. Gate control signals BLI (i+1, 1) and BLI (i−1, 2) are lowered to the ground voltage level GND. Gate control signals BLI (s, 1), BLI (s, 2), BLI (s+1, 1), BLI (s−1, 2) maintain the power supply voltage level Vcc. At time T3 when the active cycle ends, the gate control signals are set at the power supply voltage level Vcc.

Figure 28:
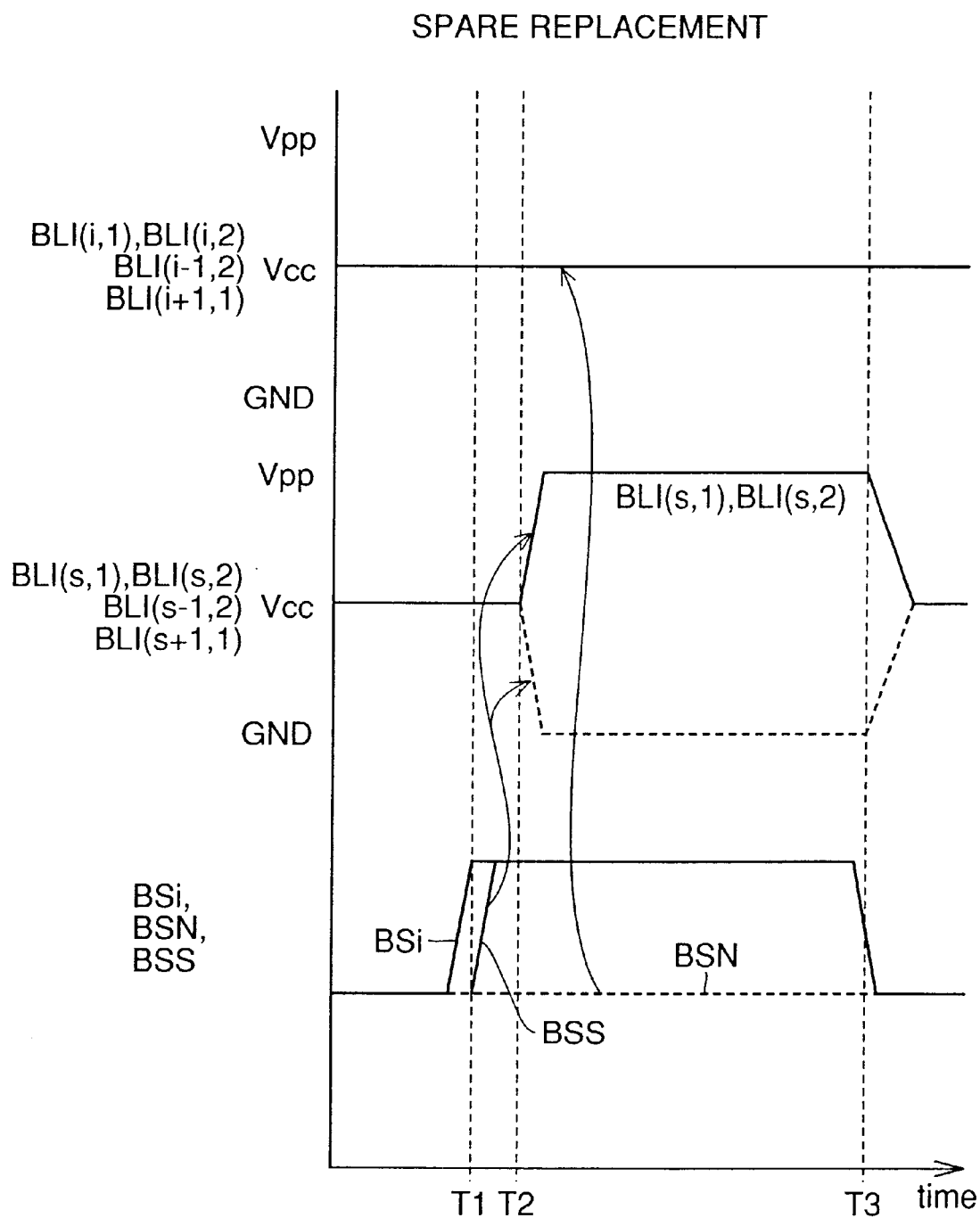

Referring to FIG. 28, the gate control signals are set at the power supply voltage level Vcc in the standby state. At time T1, block selection signal BSi rises to the H level. From time T1 to T2, spare replacement is determined and spare block selection signal BSS rises to the H level. Normal block selection signal BSN maintains the L level. In response, gate control signals BLI (s, 1) and BLI (s, 2) are raised to the boosted power supply voltage level Vpp. Gate control signals BLI (s+1, 1), BLI (s−1, 2) are lowered to the ground voltage GND. Gate control signals BLI (i, 1), BLI (i, 2), BLI (i+1, 1), BLI (i−1, 2) maintain the power supply voltage level Vcc. At time T3 when the active cycle ends, the gate control signals are set at the power supply voltage level Vcc.

By controlling the selection gates using such a selection gate controlling circuit, power consumption can be reduced. Further, an access loss is not caused even if the operation reflects spare replacement determination.

Figure 47:
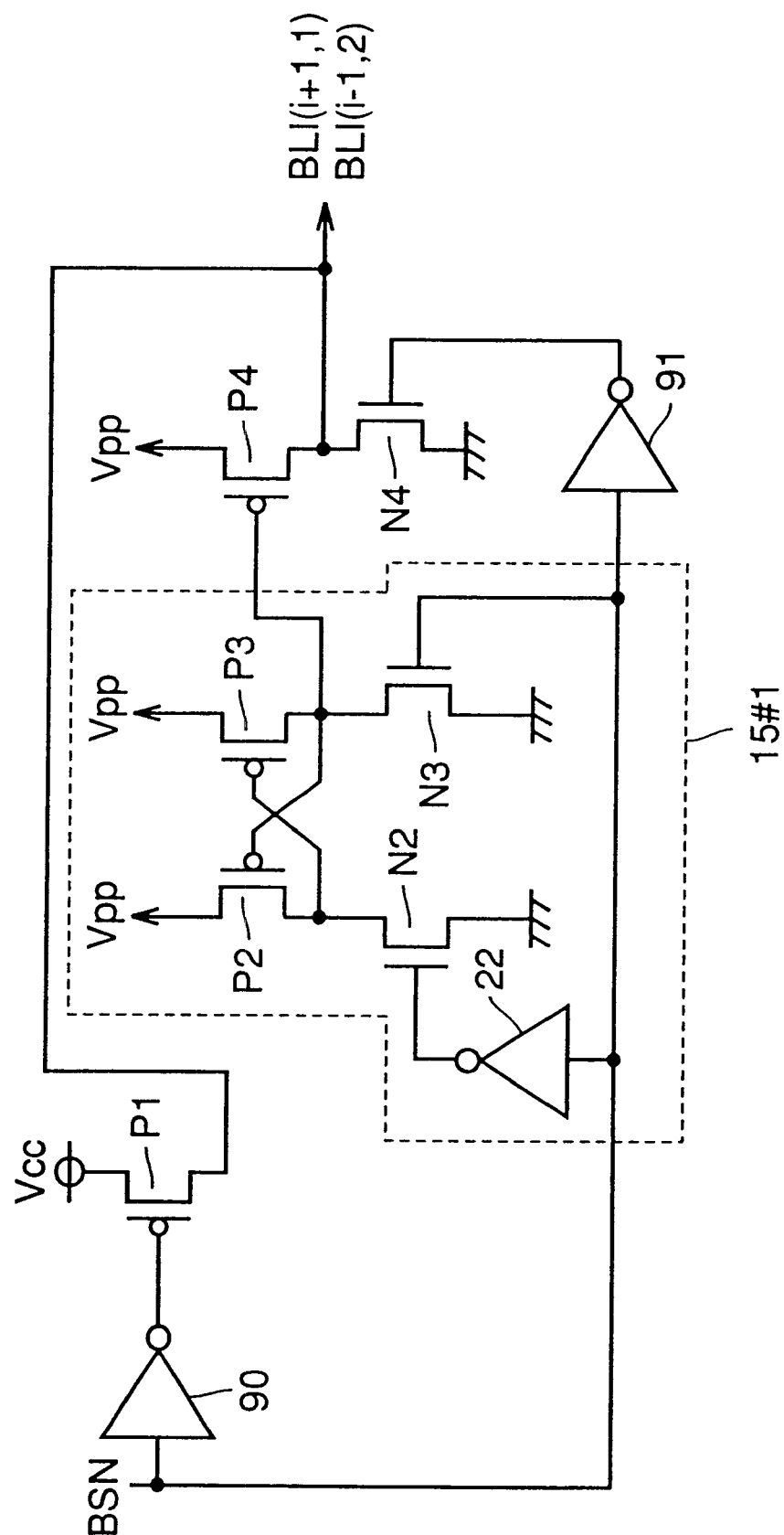
FIGS. 47 and 48 show one example of a specific structure of the selection gate controlling circuit for producing the gate control signals shown in FIGS. 27 and 28.
Figure 48:
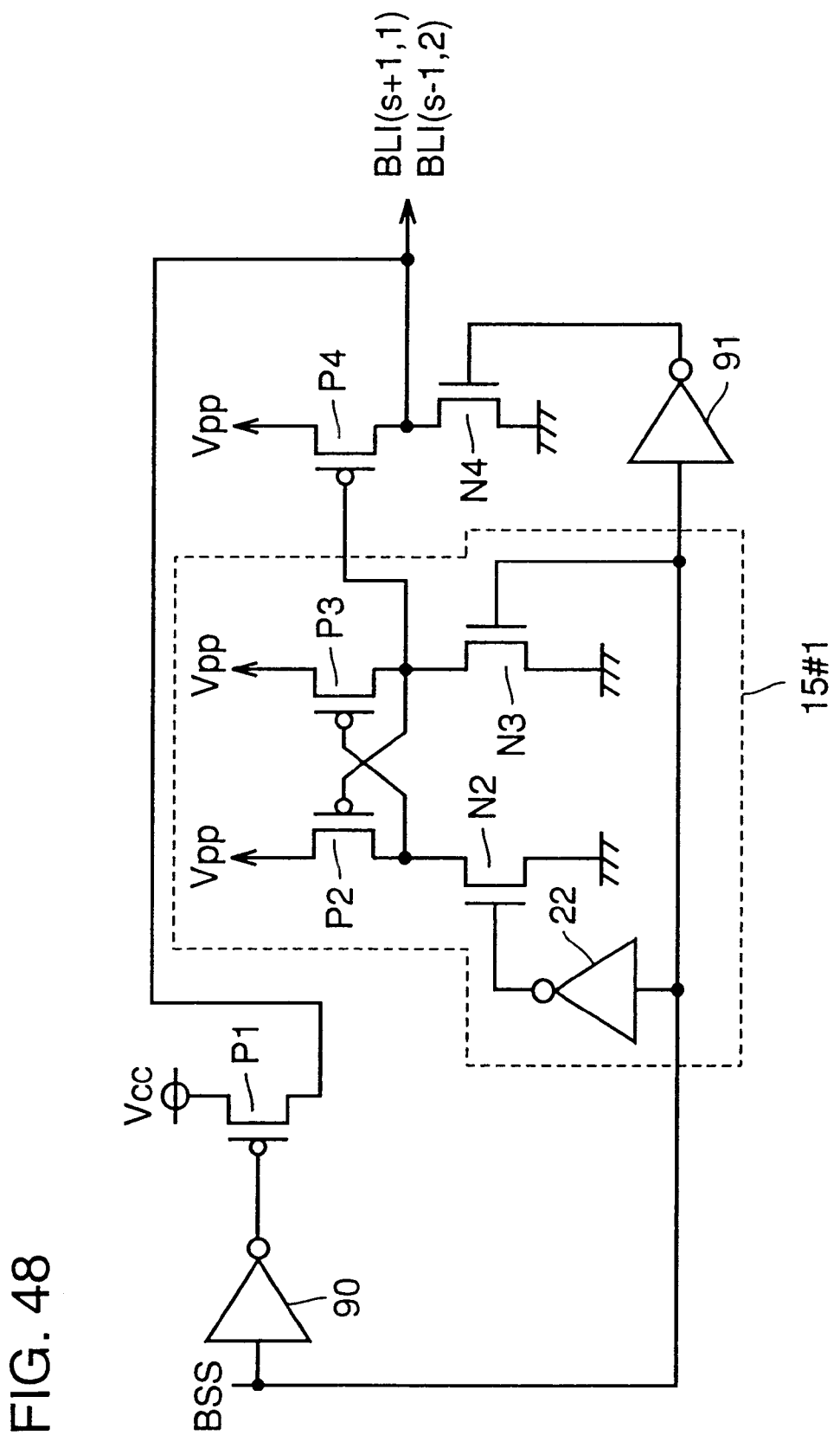
Figure 49:
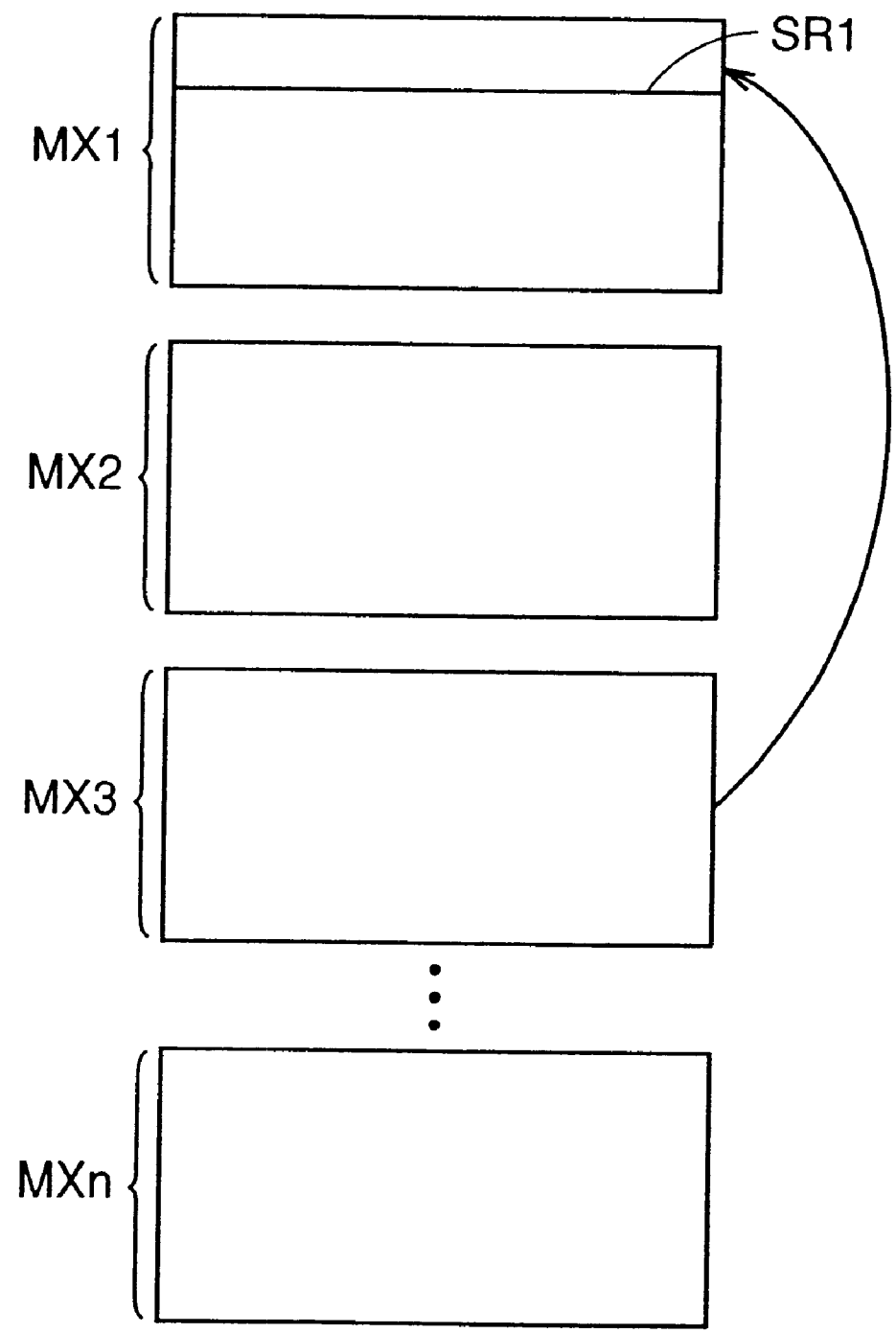
FIG. 49 is a block diagram showing a structure of a main part of a conventional semiconductor memory device having a flexible redundancy mechanism.

One example of the structure of the selection gate controlling circuit for implementing the operation shown in FIGS. 27 and 28 will be described with reference to FIGS. 47 and 48. FIGS. 47 and 48 correspond to a normal block and a spare block, respectively.

The selection gate controlling circuit shown in FIG. 47 includes a level converting circuit 15#1, a PMOS transistor P4, an NMOS transistor N4, and inverters 90 and 91. Inverters 90 and 91 invert normal block selection signal BSN. The gate electrode of PMOS transistor P1 receives the output of inverter 90. The basic structure of level converting circuit 15#1 is the same as level converting circuit 15. Inverter 22 inverts normal block selection signal BSN. In level converting circuit 15#1, the gate electrode of NMOS transistor N2 receives the output of inverter 22 while the gate electrode of NMOS transistor N3 receive normal block selection signal BSN.

The gate electrode of PMOS transistor P4 receives the output of level converting circuit 15#1, and the gate electrode of NMOS transistor N4 receives the output of inverter 91. A voltage at the connection node of PMOS transistor P4 and NMOS transistor N4 determines gate control signals BLI (i−1, 2) and BLI (i+1, 1).

The basic structure of the selection gate controlling circuit shown in FIG. 48 is the same as the selection gate controlling circuit shown in FIG. 47. In the selection gate controlling circuit shown in FIG. 48, inverters 22, 90 and 91 receive spare block selection signal BSS. A voltage at the connection node of PMOS transistor P4 and NMOS transistor N4 determines gate control signals BLI (s−1, 2) and BLI (s+1, 1).

Figure 29:
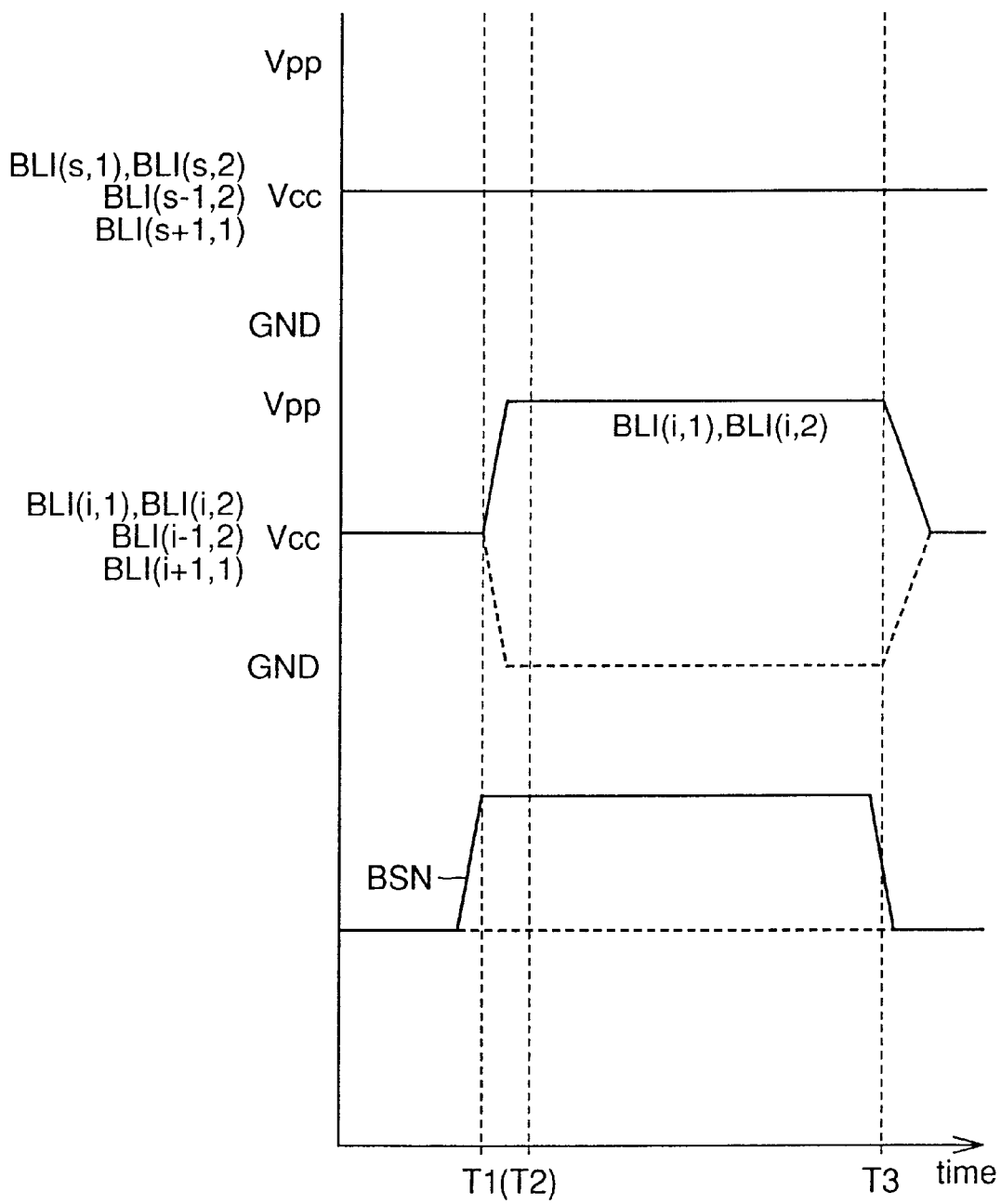
FIGS. 29 and 30 are timing charts for describing another example of the operation of the selection gate controlling circuit in the seventh embodiment.
Figure 30:
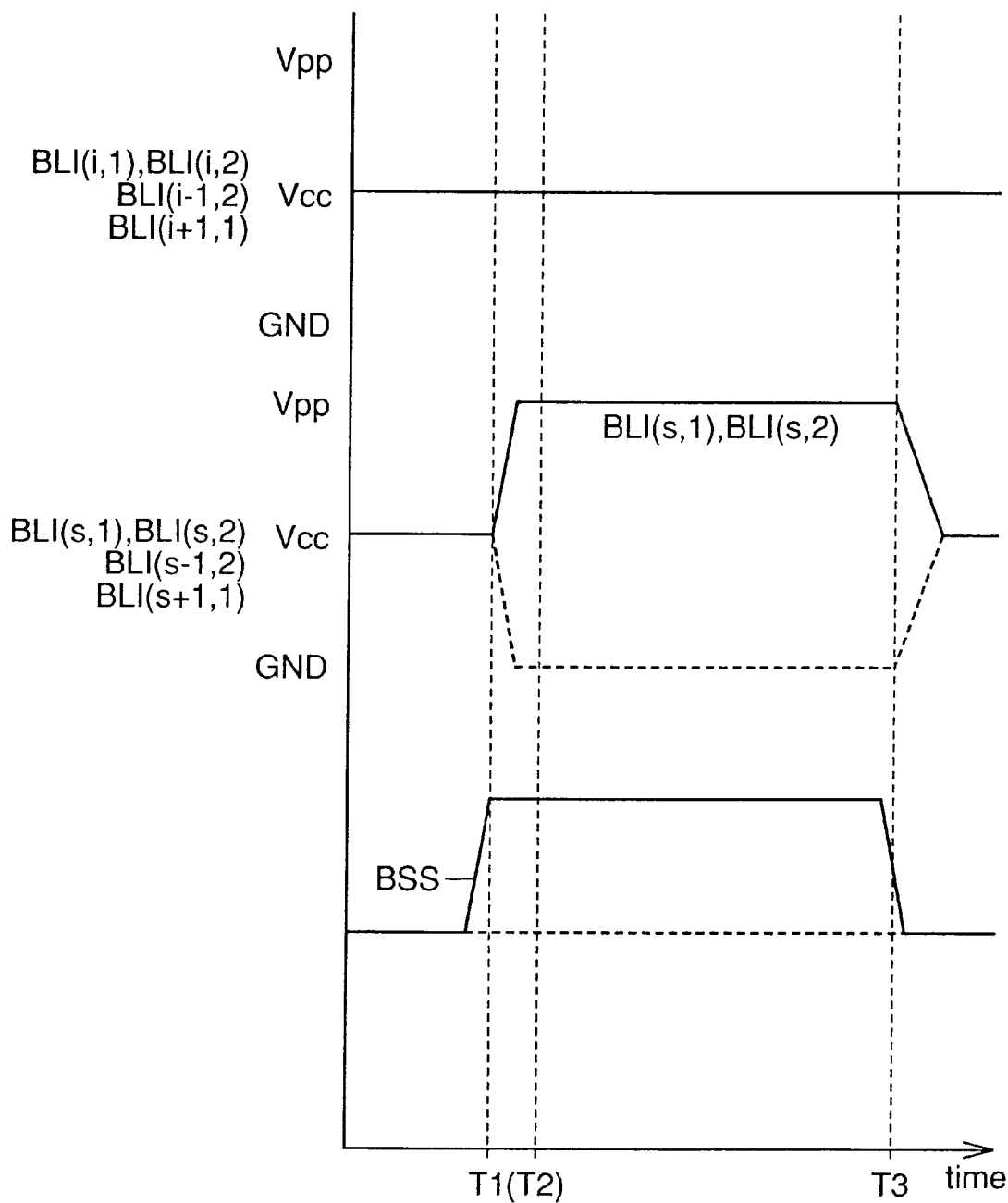

Another example of the selection gate controlling circuit in the seventh embodiment will be described with reference to the timing charts in FIGS. 29 and 30. FIGS. 29 and 30 show controlling especially in the self refresh mode. FIG. 29 corresponds to the case of spare non-replacement, and FIG. 30 corresponds to the case of spare replacement. The same signals as in FIGS. 4, 6 and 7 are denoted by the same reference characters. In FIGS. 29 and 30, determination of spare replacement for the next cycle is completed in a previous cycle in the self refresh mode as described in the third embodiment.

Referring to FIG. 29, the gate control signals are set at the power supply voltage level Vcc in the standby state. At time T1 when a cycle starts, normal block selection signal BSN is at the H level. Accordingly, gate control signals BLI (i, 1) and BLI (i, 2) are raised to the boosted power supply voltage level Vpp. Gate control signals BLI (i+1, 1), BLI (i−1, 2) are lowered to ground voltage GND. Gate control signals BLI (s, 1), BLI (s, 2), BLI (s+1, 1), BLI (s−1, 2) maintain the power supply voltage level Vcc. At time T3 when the cycle ends, the gate control signals are set at the power supply voltage level Vcc.

Referring to FIG. 30, the gate control signals are set at the power supply voltage level Vcc in the standby state. At time T1, spare block selection signal BSS is at the H level. Accordingly, gate control signals BLI (s, 1), BLI (s, 2) are raised to the boosted power supply voltage level Vpp. Gate control signals BLI (s+1, 1), BLI (s−1, 2) are lowered to ground voltage GND. Gate control signals BLI (i, 1), BLI (i, 2), BLI (i+1, 1), BLI (i−1, 2) maintain the power supply voltage level Vcc. At time T3 when the cycle ends, the gate control signals are set at the power supply voltage level Vcc.

By controlling the selection gates using such a selection gate controlling circuit, power consumption can be reduced. Since determination of spare replacement in the next cycle is completed in a previous cycle as described in the third embodiment, a delay associated with the determination operation for the next cycle is not caused It is noted that not only the gate control signals but the word line drive signals can be controlled in a similar manner. A word line drive controlling circuit in the seventh embodiment will be described with reference to the timing chart in FIG. 31. The same signals as in FIG. 23 are denoted by the same reference characters.

Figure 31:
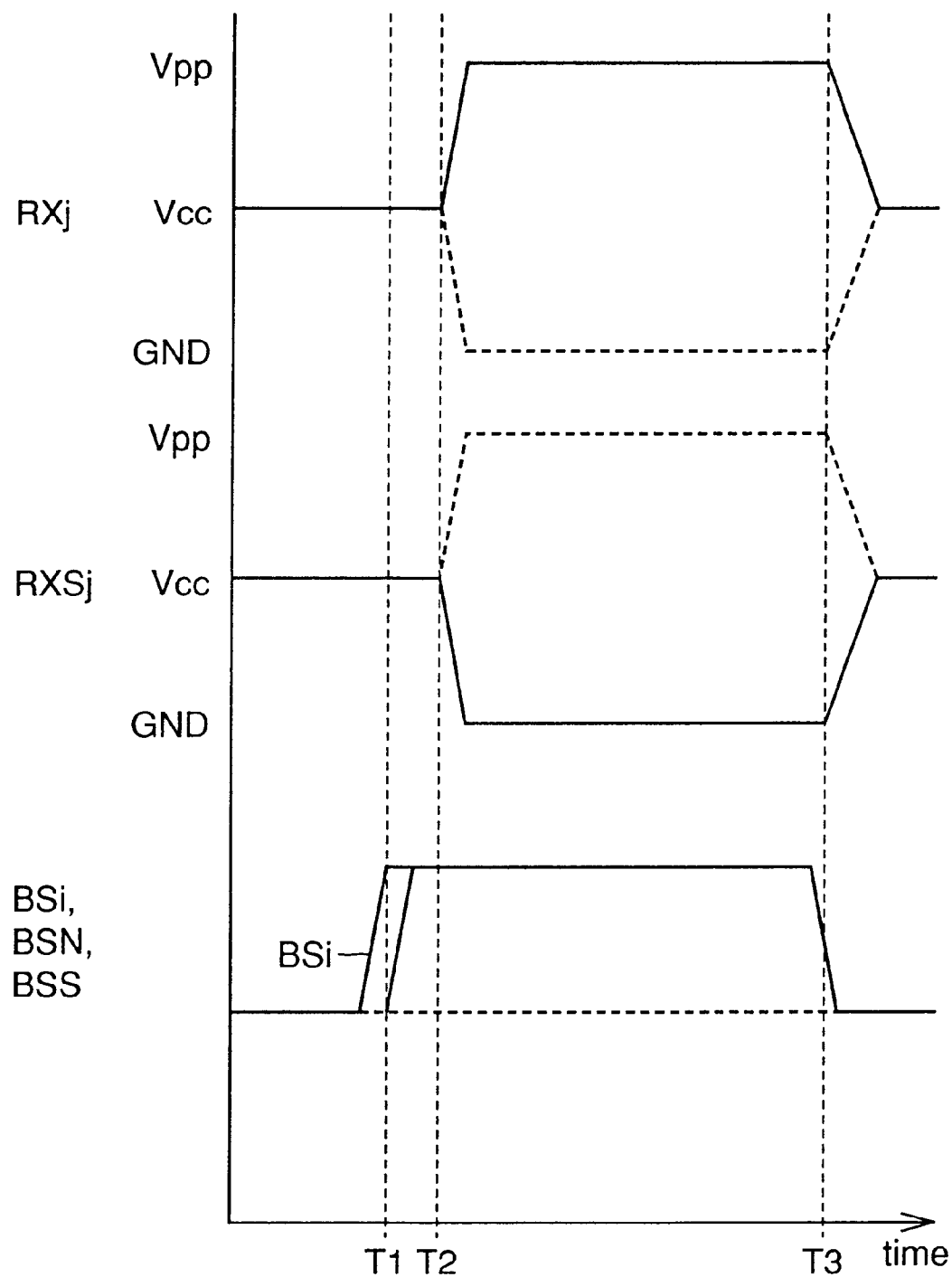
FIG. 31 is a timing chart for describing the operation of a word line drive controlling circuit in the seventh embodiment.

Referring to FIG. 31, the word line drive signals are set at the power supply voltage level in the standby state. At time T1, block selection signal BSi rises to the H level. From time T1 to T2, spare replacement is determined. In this case of spare non-replacement, normal block selection signal BSN rises to the H level, (as shown by a solid line), and spare block selection signal BSS maintains the L level (as shown by a dashed line). In response, word line drive signal RXi is raised to the boosted power supply voltage level Vpp (as shown by a solid line). Word line drive signal RXSj is lowered to ground voltage GND (as shown by a solid line). At time T3 when the active cycle ends, the word line drive signals are set at the power supply voltage level Vcc.

In this case of spare replacement, from time T1 to T2, spare block selection signal BSS rises to the H level (as shown by a solid line), and normal block selection signal BSN maintains the L level (as shown by a dashed line). In response, word line drive signal RXSi is raised to the boosted power supply voltage level Vpp (as shown by a dashed line). Word line drive signal RXj is lowered to ground voltage GND (as shown by a dashed line). At time T3 when the active cycle ends, the word line drive signals are set at the power supply voltage level Vcc.

In this case, the word driver described in the sixth embodiment is used. One example of the structure of a word line drive controlling circuit for implementing the operation shown in FIG. 31 will be described with reference to FIG. 32. The same elements as word line drive controlling circuit 50 shown in FIG. 24 are denoted by the same reference characters.

Figure 32:
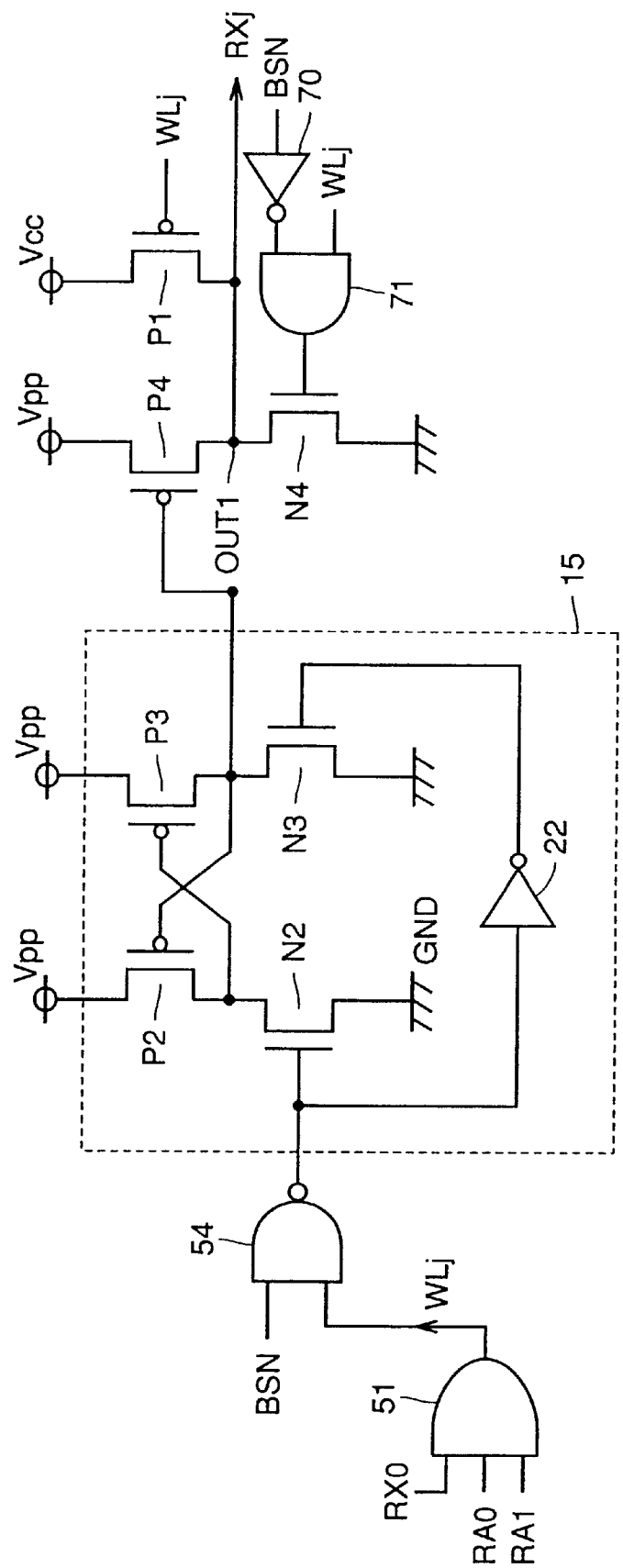
FIG. 32 shows one example of a specific structure of the word line drive controlling circuit for producing the word line drive signals shown in FIG. 31.

The word line drive controlling circuit shown in FIG. 32 includes AND circuits 51, 71, an NAND circuit 54, an inverter 70, a level converting circuit 15, and a PMOS transistor P1. NAND circuit 54 receives normal block selection signal BSN and word line drive original signal WLj output from AND circuit 51. Inverter 70 inverts normal block selection signal BSN and outputs a signal /BSN. AND circuit 71 receives word line drive original signal WLj and the output of inverter 70. The gate electrode of PMOS transistor P1 receives word line drive original signal WLj.

When PMOS transistor P1 turns on, output node OUT1 (word line drive signal RXj) is set at the power supply voltage level Vcc. When PMOS transistor P4 turns on (signals BSN and WLj are both at the H level), output node OUT1 is set at the boosted power supply voltage level Vpp. When NMOS transistor N4 turns on (signals /BSN and WLj are both at the H level), output node OUT1 is set at the ground voltage level GND.

By using such a word line drive controlling circuit, a higher rising speed of word lines and power consumption reduction are made possible.

Eighth Embodiment

Figure 33:
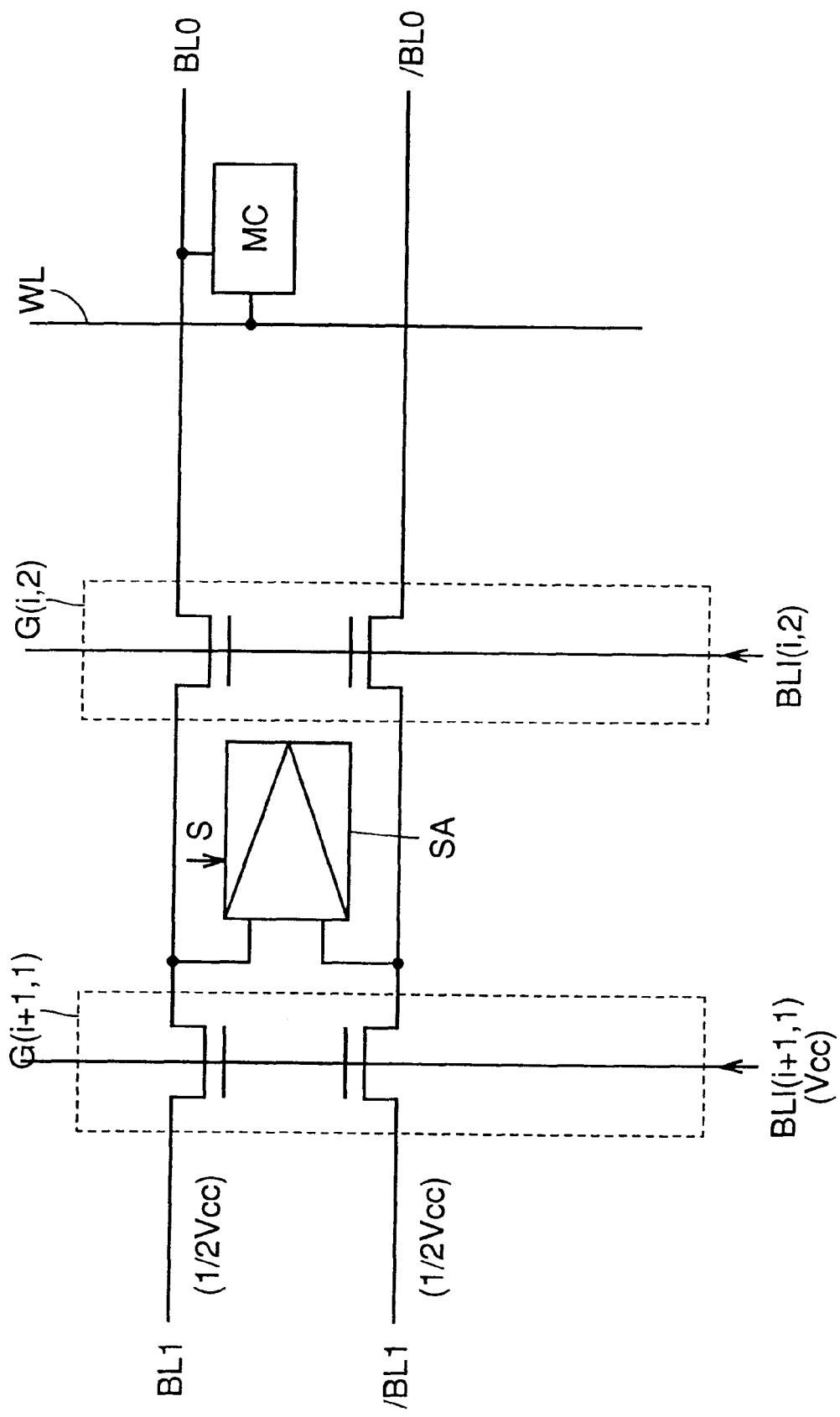
FIG. 33 is a conceptual diagram for describing controlling of a selection gate in an eighth embodiment of the present invention.

An improved selection gate controlling circuit suitable for a low power supply voltage operation will be described. FIG. 33 is a conceptual diagram for describing controlling of the selection gates in an eighth embodiment of the present invention. Referring to FIG. 33, MC denotes a memory cell, BL0, /BL0, BL1, /BL1 denote bit lines, BLI (i, 2), BLI (i+1, 1) denote gate control signals, G (i, 2), G (i+1, 1) denote selection gates, and S denotes a sense amplifier activation signal for activating a sense amplifier. The precharge voltage of a bit line is ½Vcc. A small signal of memory cell MC is read.

The threshold of an NMOS transistor forming the selection gate is denoted by Vth. When the power supply voltage is relatively lowered with respect to threshold Vth of a transistor and attains Vcc<½Vcc+Vth, selection gate G (i+1, 1) is not turned on even if gate control signal BLI (i+1, 1) is at the power supply voltage level Vcc. Accordingly, the selection gate controlling circuit for performing the following operation is used as circuit 100 shown in FIG. 1.

Figure 34:
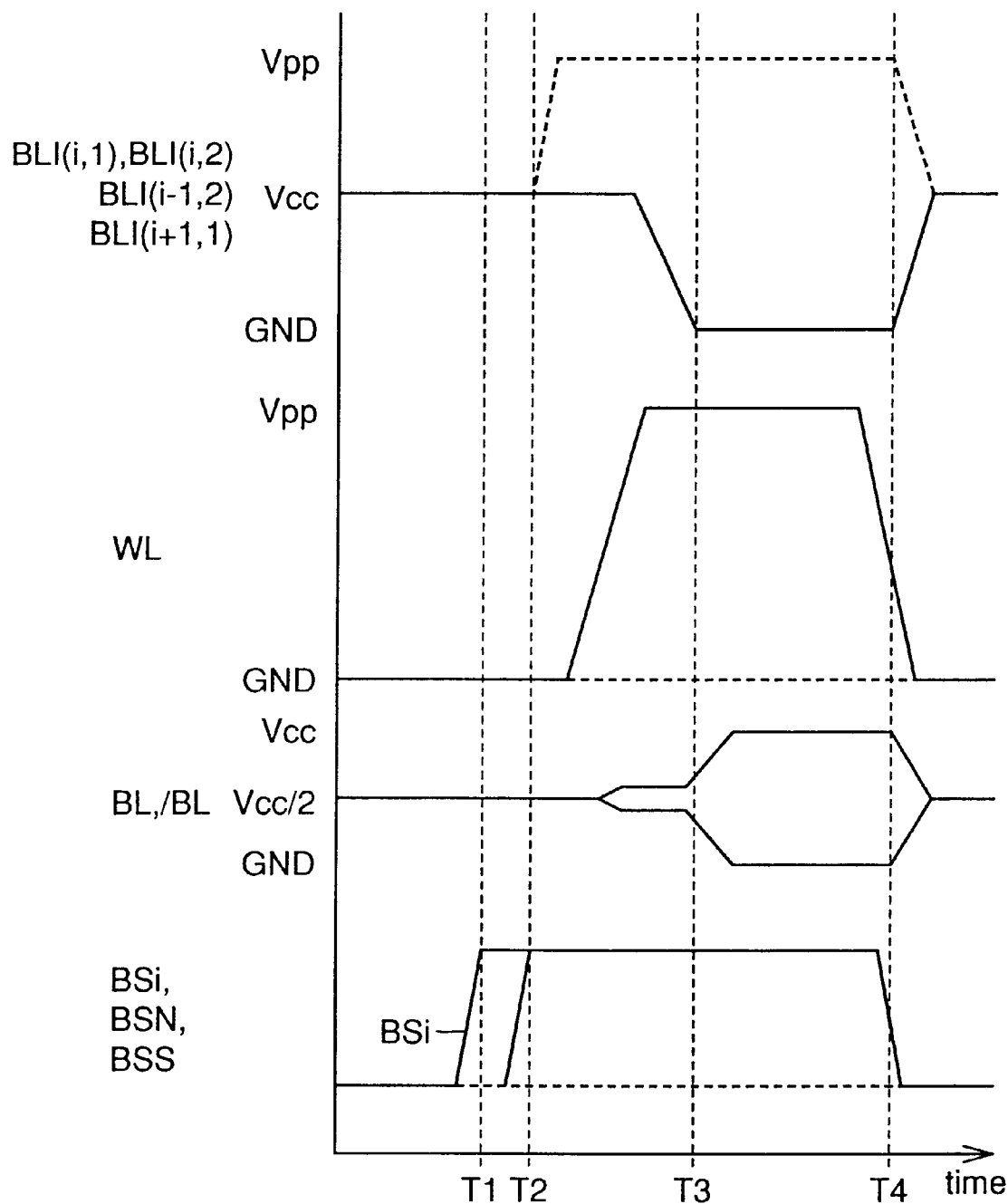
FIG. 34 is a timing chart for describing the operation of a selection gate controlling circuit in the eighth embodiment.

A selection gate controlling circuit in the eighth embodiment will be described with reference to the timing chart in FIG. 34. WL denotes a word line and BL, /BL denote bit lines. The same signals as in FIG. 4 are denoted by the same reference characters.

In the standby state, the gate control signals are set at the power supply voltage level Vcc. At time T1, block selection signal BSi rises to the H level. From time T1 to T2, spare replacement is determined, and normal block selection signal BSN or spare block selection signal BSS rises to the H level. In response, corresponding gate control signals BLI (i, 1) and BLI (i, 2) are raised to the boosted power supply voltage level Vpp. Gate control signals BLI (i+1, 1) and BLI (i−1, 2) maintain the power supply voltage level Vcc.

When word line WL is selected and the potential rises to the H level, a charge stored in memory cell MC is read to a bit line. Since gate control signals BLI (i+1, 1) and BLI (i−1, 2) for non-selected memory blocks adjacent to a selected memory block are at the power supply voltage level Vcc, corresponding selection gates are not turned on. The selected memory block is selectively coupled to corresponding sense amplifier blocks.

At time T3, a sensing operation is initiated by sense amplifier activation signal S. Slightly before that, gate control signals BLI (i+1, 1) and BLI (i−1, 2) are lowered to the ground voltage level GND. By this control, the sensing operation can be completed without turning on the selection gates for the non-selected memory blocks At time T4 when the active cycle ends, the gate control signals are set at the power supply voltage level Vcc.

As described above, the time margin becomes larger and the access time speed becomes higher even if falling of the gate control signals is delayed. Since there is no need to change the gate control signals from he ground voltage level GND to the boosted power supply voltage level Vpp or from the boosted power supply voltage level Vpp to the ground voltage level GND at the beginning of a cycle, a higher speed operation is allowed.

Figure 35:
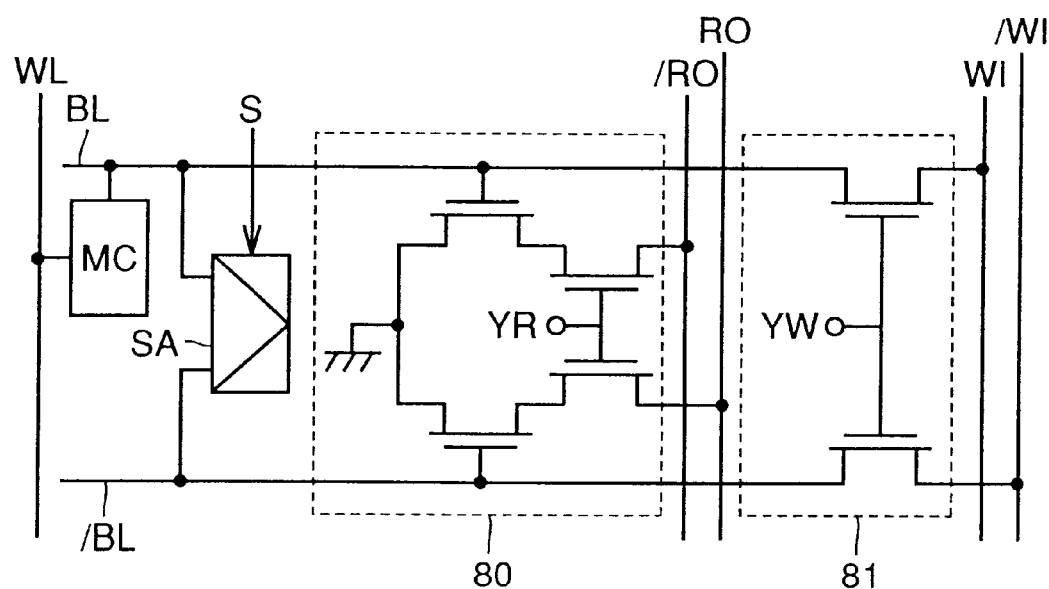
FIG. 35 is a conceptual diagram for describing the direct sensing method.

A case in which such a structure is combined with the direct sensing method will be described. FIG. 35 is a conceptual diagram for describing the direct sensing method. Referring to FIG. 35, a sense amplifier SA, a reading circuit 80 and a writing selection circuit 81 are provided for bit lines BL, /BL. Reading circuit 80 changes the potential of data reading lines RO, /RO in response to a reading control signal YR and in accordance with the potential of bit lines BL, /BL. Writing selection circuit 81 changes the potential of bit lines BL, /BL in response to a writing control signal YW and in accordance with the potential of data writing lines WI, /WI. Sense amplifier SA performs a sensing operation according to sense amplifier activation signal S.

Figure 36:
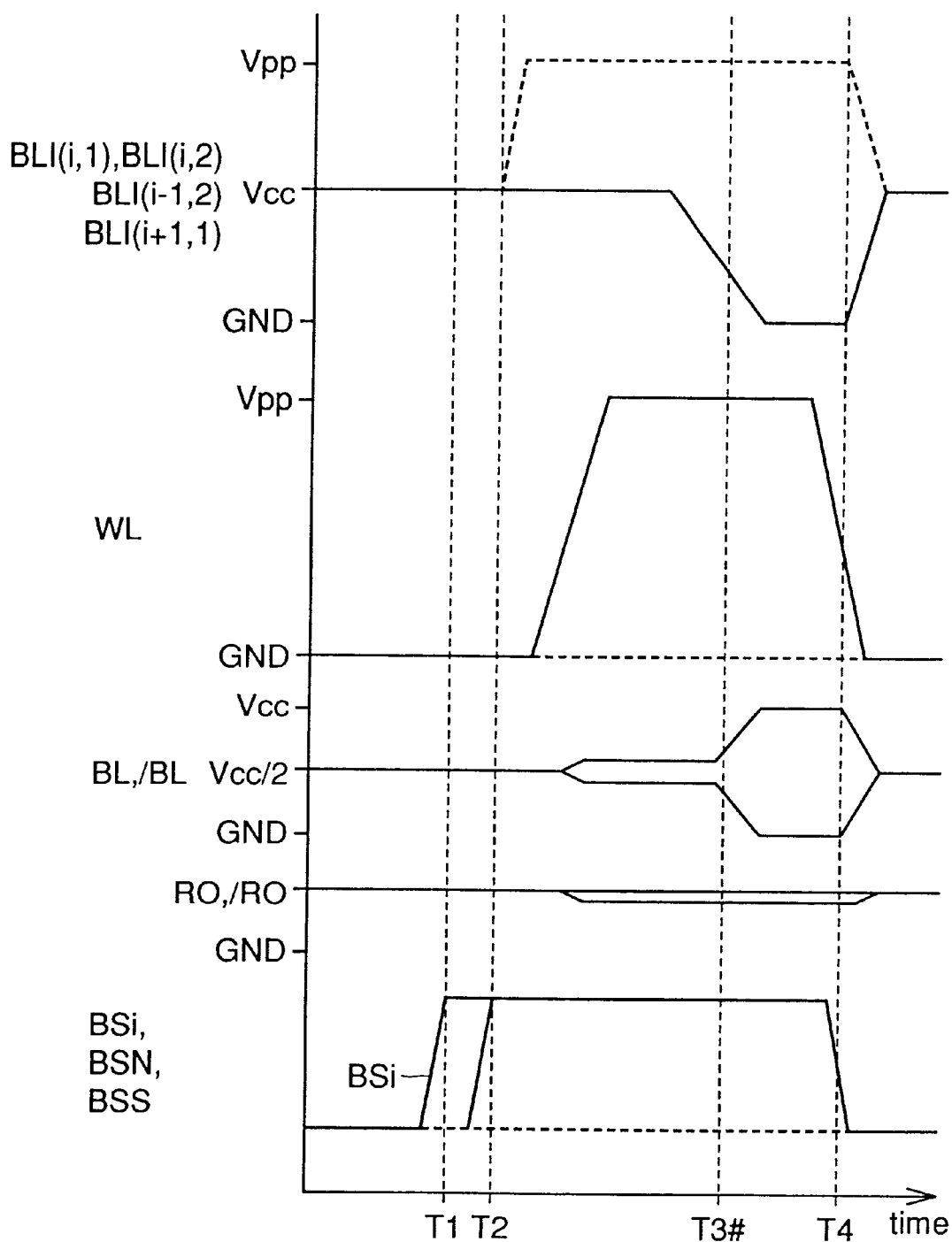
FIG. 36 is a timing chart for describing the operation of the selection gate controlling circuit, applied to FIG. 35, in the eighth embodiment.

A selection gate controlling circuit applied to the direct sensing method in FIG. 35 will be described with reference to the timing chart in FIG. 36. In FIG. 36, WL denotes a word line, BL, /BL denote bit lines, and RO, /RO denote data reading lines. The same signals as in FIGS. 4, 6, and 7 are denoted by the same reference characters.

In the standby state, the gate control signals are set at the power supply voltage level Vcc. At time T1, block selection signal BSi rises to the H level. From time T1 to T2, spare replacement is determined, and one of normal block selection signal BSN and spare block selection signal BSS rises to the H level. In response, gate control signals BLI (i, 1) and BLI (i, 2) are raised to the boosted power supply voltage level Vpp. Gate control signals BLI (i+1, 1) and BLI (i−1, 2) maintain power supply voltage Vcc.

When word line WL is selected and raised to the boosted power supply voltage level Vpp, an electrical change stored in a memory cell is read to a bit line. Sinct gate control signals BLI (i+1, 1) and BLI (i−1, 2) for a non-selected memory block are at the power supply voltage level Vcc, corresponding selection gates are not turned on and only selection gates corresponding to a selected memory block is turned on. Only the selected memory block is coupled to a sense amplifier.

At time T3#(>time T3 in FIG. 34), a sensing operation is initiated by sense amplifier activation signal S. In the direct sensing method, the signal is read to data reading lines RO, /RO slightly before that Accordingly, gate control signals BLI (i+1, 1) and BLI (i−1, 2) are lowered to the ground voltage level GND after time T3#. In other words, the sense amplifier operation and the operation of lowering the gate control signals can be performed very slowly.

Ninth Embodiment

Figure 37:
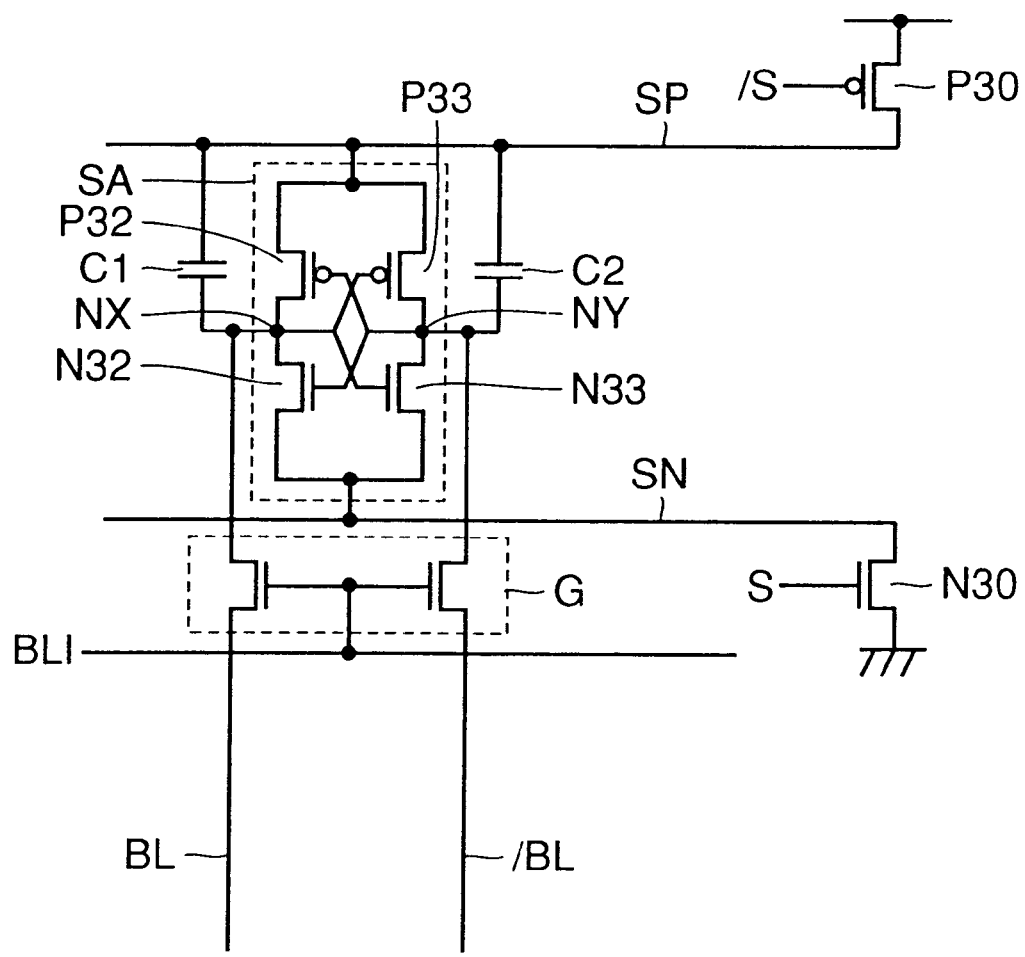
FIG. 37 is a diagram for describing one example of a bit line potential driving circuit in a ninth embodiment of the present invention.

An improved semiconductor memory device in a ninth embodiment of the present invention will be described. The semiconductor memory device in the ninth embodiment is suitable for a low power supply voltage operation and has a structure for attaining a higher speed sense amplifier operation. One example of a bit line potential driving circuit in the ninth embodiment will be described with reference to FIG. 37. In FIG. 37, SA, G, BLI, and BL, /BL denote a sense amplifier, a selection gate, a gate control signal (or a signal line for transmitting the signal), and bit lines, respectively.

Sense amplifier driving transistors P30, (a PMOS transistor) and N30 (an NMOS transistor) are arranged for sense amplifier SA. Sense amplifier driving transistor P30 has one conductive terminal connected to power supply voltage Vcc and the other conductive terminal connected to a sense amplifier driving line SP. Sense amplifier driving transistor N30 has one conductive terminal connected to ground voltage GND and the other conductive terminal connected to a sense amplifier driving line SN. The gate electrode of sense amplifier driving transistor P30 receives a sense amplifier activation signal /S, and the gate electrode of sense amplifier driving transistor N30 receives sense amplifier activation signal S which is an inversion of signal /S.

Sense amplifier SA is formed of sense amplifier transistors P32, P33 (PMOS transistors) and sense amplifier transistors N32, N33 (NMOS transistors). Sense amplifier transistors N32, N33 each have one conductive terminal connected to sense amplifier driving line SN. Sense amplifier transistors P32, P33 each have one conductive terminal connected to sense amplifier driving line SP.

Sense amplifier transistors P32, N32 each have the other conductive terminal connected to a node NX that is connected to bit line BL via selection gate G. Sense amplifier transistors P33, N33 each have the other conductive terminal connected to a node NY that is connected to bit line /BL via a selection gate G.

The bit line potential driving circuit shown in FIG. 37 includes capacitive elements C1 and C2. Capacitive element C1 is provided between sense amplifier driving line SP and node NX of sense amplifier SA. Capacitive element C2 is provided between sense amplifier driving line SP and node NY of sense amplifier SA.

Figure 38:
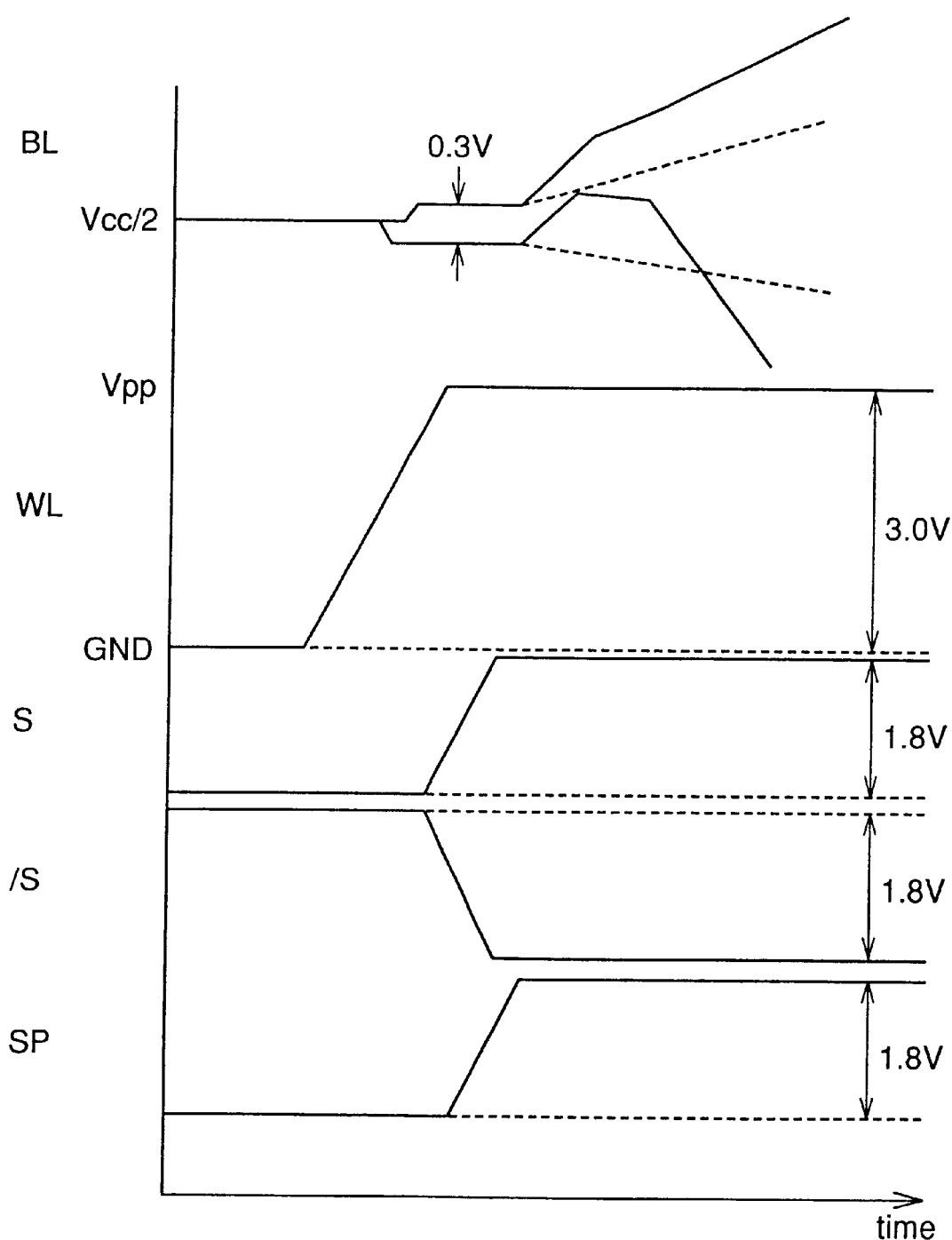
FIG. 38 is a timing chart for describing a sensing operation when the bit line potential driving circuit shown in FIG. 37 is used.

A sensing operation when the bit line potential driving circuit shown in FIG. 37 is used will be described with reference to the timing chart in FIG. 38. In FIG. 38, S, IS denote sense amplifier activation signals and SP denotes a sense amplifier driving line. Further, WL represents the waveform of a word line to which a memory cell to be read is connected, and BL represents the waveform of a bit line to which a memory cell to be read is connected. The precharge voltage of a bit line is ½Vcc. It is noted that the waveform for bit line BL is expanded in the direction of voltage on a scale different from other waveforms.

The potential of word line WL rises from the ground voltage level GND to the boosted power supply voltage level Vpp (about 3.0V between Vpp and GND). The potential of bit line BL slightly changes from ½Vcc (about 0.3V in width). Sense amplifier activation signal S and signal /S are set at the H level and the L level, respectively. The potential of sense amplifier driving line SP rises to the H level (about 1.8V between the H level and the L level for sense amplifier activation signals S, /S and sense amplifier driving line SP).

It is assumed that the threshold of sense amplifier transistors P32, P33 is Vtp and the threshold of sense amplifier transistors N32, N33 is Vtn. When power supply voltage Vcc reduces and attains ½Vcc<Vtp and ½Vcc<Vtn, the sense amplifier transistors do not turn on or do turn on very late if capacitive elements C1 and C2 are not provided (as shown by a dashed line). In short, the potential of a bit line changes late, causing an inferior or delayed sensing operation.

When the bit line potential driving circuit shown in FIG. 37 is provided, however, the potential of a bit line can be raised (as shown by a solid line) by sense amplifier driving line SP. Accordingly, sense amplifier transistors N32, N33 are easily turned on, and a high speed sensing operation is realized.

Figure 39:
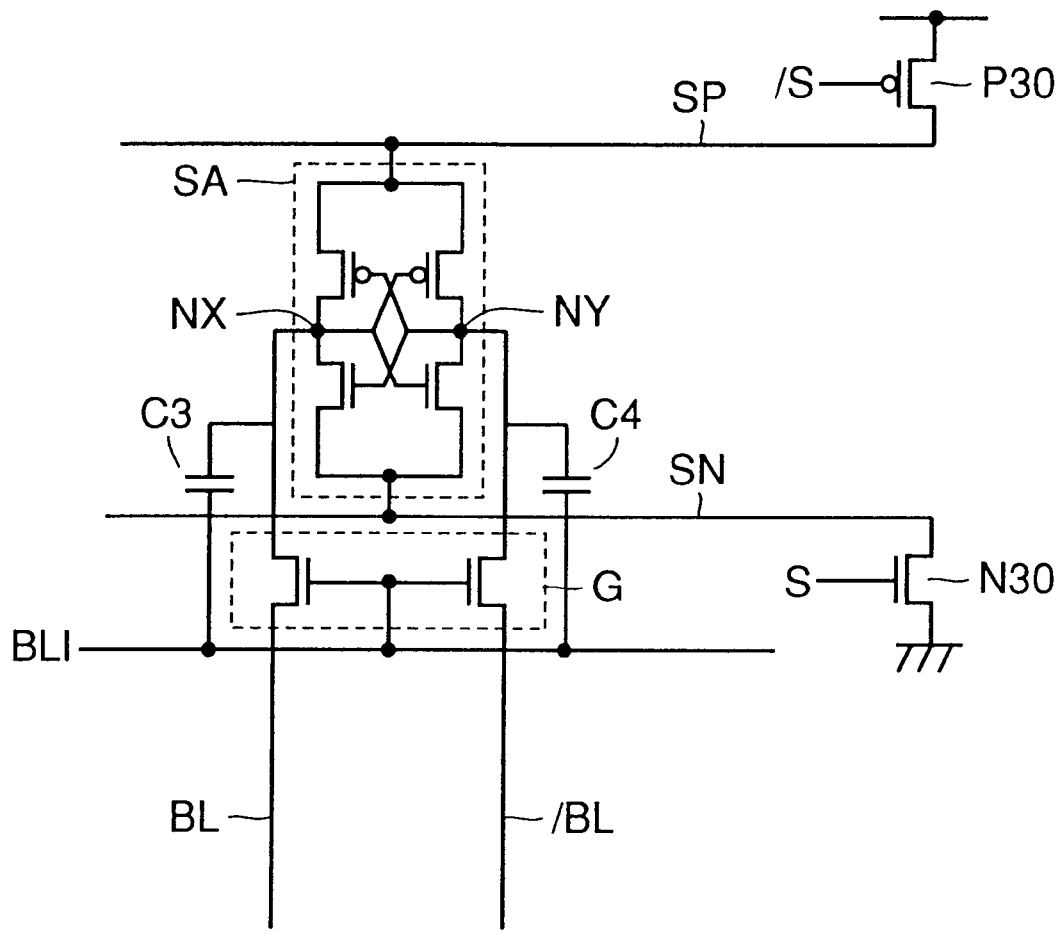
FIGS. 39 and 40 are diagrams for describing another example of the bit line potential driving circuit in the ninth embodiment.
Figure 40:
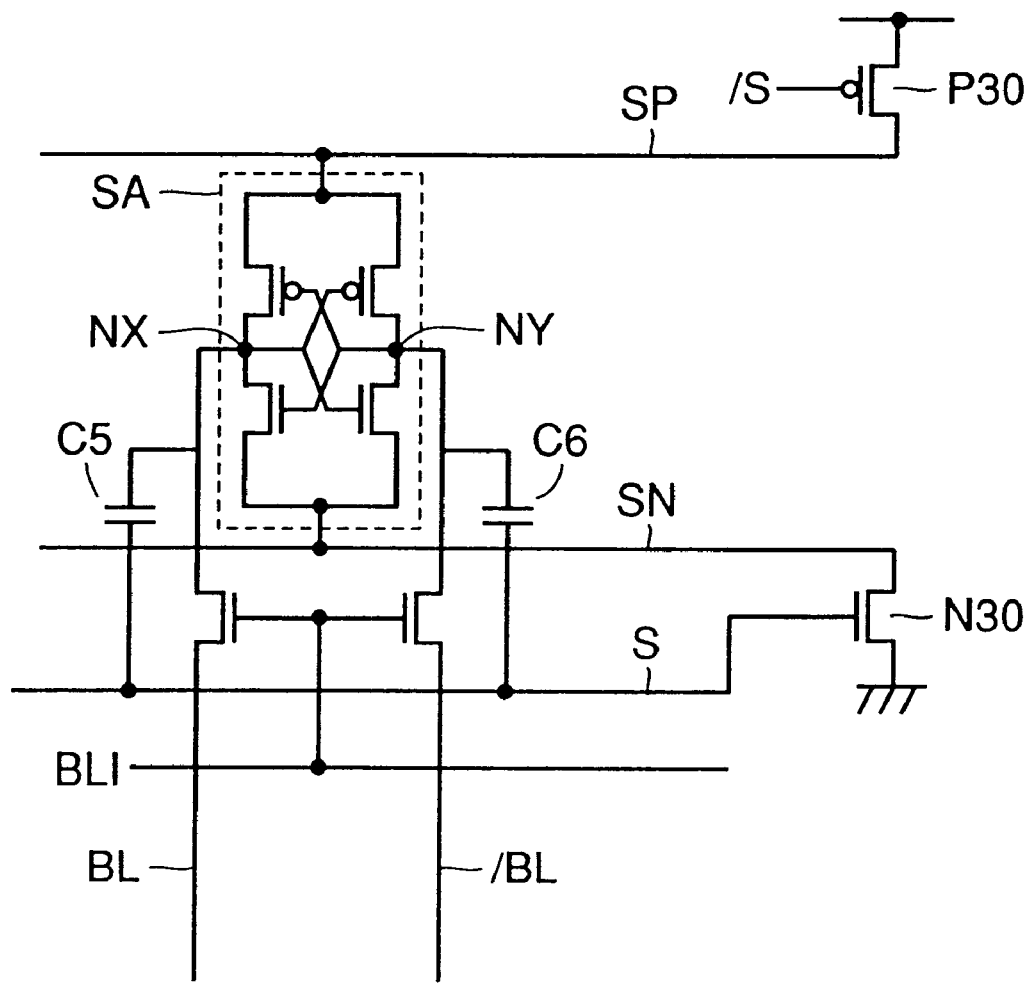

Although the higher speed of the sensing operation is attained by coupling from sense amplifier driving line SP in the structure shown in FIG. 37, the structure shown in FIG. 39 or 40 may also be employed. The same components as in FIG. 37 are denoted by the same reference characters. Here, S denotes a sense amplifier activation signal or a signal line transmitting the signal.

The bit line potential driving circuit shown in FIG. 39 includes capacitive elements C3 and C4. Capacitive element C3 is provided between signal line BLI transmitting the gate control signal and node NX of sense amplifier SA. Capacitive element C4 is provided between signal line BLI transmitting the gate control signal and node NY of sense amplifier SA.

The bit line potential driving circuit shown in FIG. 40 includes capacitive elements C5 and C6. Capacitive element C5 is provided between signal line S transmitting the sense amplifier activation signal and node NX of sense amplifier SA. Capacitive element C6 is provided between signal line S transmitting the sense amplifier activation signal and node NY of sense amplifier SA.

In the structure shown in FIG. 39, the speed of the sensing operation is made higher by rising of gate control signal BLI. In the structure shown in FIG. 40, the speed of the sensing operation is made higher by sense amplifier activation signal S.

Figure 41:
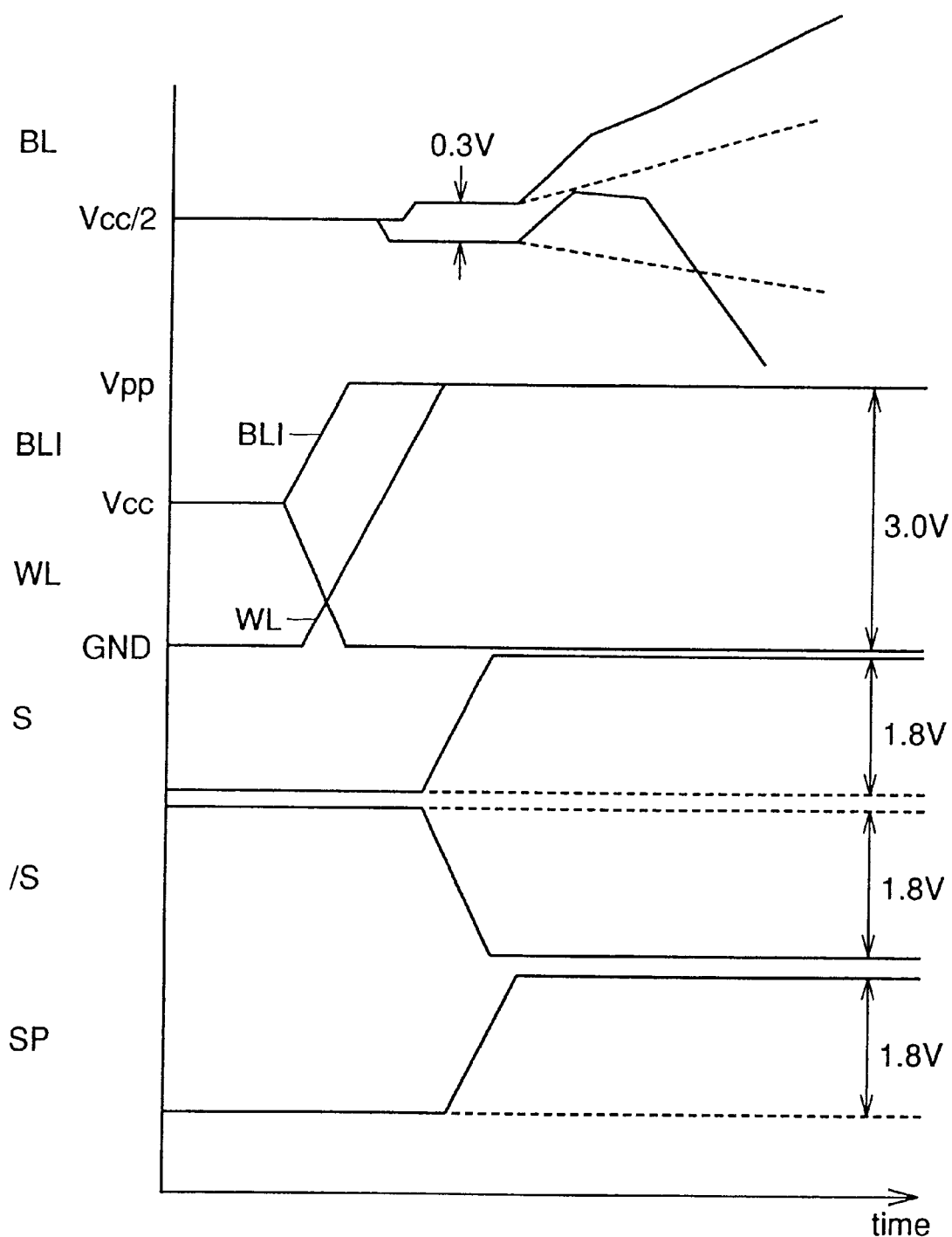
FIG. 41 is a timing chart for describing a sensing operation when the bit line potential driving circuits shown in FIGS. 39 and 40 are used.

The sensing operation when the bit line potential driving circuits shown in FIGS. 39 and 40 are used will be described with reference to the timing chart in FIG. 41. In FIG. 41, S, /S denote sense amplifier activation signals, SP denotes a sense amplifier driving line, and BLI denotes a gate control signal. WL represents the waveform of a word line to which a memory cell to be read is connected, and BL represents the waveform of a bit line to which a memory cell to be read is connected. The precharge voltage of a bit line is ½Vcc. It is noted that the waveform for bit line BL is expanded in the direction of voltage on a scale different from other waveforms.

Gate control signal BLI in the standby state (power supply voltage level Vcc) is to be changed. When gate control signal BLI is coupled to a sense amplifier, it is raised to the boosted power supply voltage level Vpp (lowered to ground voltage Vcc when it is decoupled). The potential of word line WL rises from the ground voltage level GND to the boosted power supply voltage level Vpp (about 3.0V between Vpp and GND). The potential of bit line BL slightly changes from ½Vcc (about 0.3V in width).

Thereafter, sense amplifier activation signals S and lS are set at the H level and the L level, respectively. The potential of sense amplifier driving line SP increases (about 1.8V is found between the H level and the L level for sense amplifier activation signals S, /S and sense amplifier driving line SP).

When capacitive elements C3 and C4 are not provided in FIG. 39 (as shown by a dashed line), the sense amplifier transistors do not turn on or do turn on very late. In short, the potential of a bit line changes late, causing an inferior or delayed sensing operation. However, when the bit line potential driving circuit shown in FIG. 39 is provided, the potential of a bit line can be raised (as shown by a solid line) by a rise of gate control signal BLI. Accordingly, sense amplifier transistors N32, N33 are easily turned on, and a higher speed sensing operation is realized. It is noted that the rise of gate control signal BLI only has to be before the sensing operation.

When capacitive elements C5 and C6 are not provided in FIG. 40 (as shown by a dashed line), the sense amplifier transistors do not turn on or do turn on very late. In short, the potential of a bit line changes late, causing an inferior or delayed sensing operation. However, when the bit line potential driving circuit shown in FIG. 40 is provided, the potential of a bit line can be raised (as shown by a solid line) by a rise of sense amplifier activation signal S. Accordingly, sense amplifier transistors N32, N33 are easily turned on, and a higher speed sensing operation is realized. It is noted that the structure shown in FIG. 40 is highly effective especially when the sense amplifier driving transistors are scattered in the array.

By the structures as shown in FIGS. 37, 39 and 40, a high speed sensing operation is made possible. Since there is no need to provide another driving interconnection for driving the capacitive elements, the numbers of circuits and interconnections as well as the chip area can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a plurality of normal blocks including a plurality of normal memory cells and a plurality of bit lines;

a spare memory block including a plurality of spare memory cells and a plurality of bit lines for replacing and repairing a defective normal memory cell in a corresponding normal block;

select means responsive to an external address signal for selecting a corresponding normal block and a corresponding spare block;

spare determining means responsive to an external address signal for determining whether or not to carry out said replacing and repairing using said spare block;

a plurality of sense amplifier blocks arranged to correspond to said plurality of normal blocks and said spare block and including a plurality of sense amplifiers each operative in response to a sense amplifier activation signal to read/write data from/to a corresponding bit; and a plurality of bit line potential drive means arranged to correspond to said plurality of sense amplifiers, each of said plurality of bit line potential drive means including a capacitive element for use in an active cycle to pull up a potential of said corresponding bit line.

2. The semiconductor memory device according to claim 1, wherein said capacitive element is arranged between a signal line provided to feed an operating voltage to said corresponding sense amplifier and said corresponding bit line.

3. The semiconductor memory device according to claim 1, further comprising a plurality of selection gates arranged to correspond to said plurality of normal blocks and said spare block, operative in response to a gate control signal to couple a corresponding normal block or a corresponding spare block to a corresponding sense amplifier block, wherein said capacitive element is arranged between said corresponding bit line and a signal line transmitting said gate control signal.

4. The semiconductor memory device according to claim 1, wherein said capacitive element is arranged between said corresponding bit line and a signal line transmitting said sense amplifier activation signal.

5. A semiconductor memory device, comprising:

a plurality of blocks including a plurality of memory cells and a plurality of bit lines;

a plurality of sense amplifier blocks arranged to correspond to said plurality of blocks and including a plurality of sense amplifiers each operative in response to a sense amplifier activation signal to read/write data from/to a corresponding bit; and a plurality of bit line potential drive means arranged to correspond to said plurality of sense amplifiers, each of said plurality of bit line potential drive means including a capacitive element for use in an active cycle to pull up a potential of said corresponding bit line.

6. The semiconductor memory device according to claim 5, wherein said capacitive element is arranged between a signal line provided to feed an operating voltage to said corresponding sense amplifier and said corresponding bit line.

7. The semiconductor memory device according to claim 5, wherein said capacitive element is arranged between said corresponding bit line and a signal line transmitting said sense amplifier activation signal.

* * * * *